(12) United States Patent (10) Patent No.: US 7,285,985 B2
Sasagawa et al. (45) Date of Patent: Oct. 23, 2007

(54) EVENT-DRIVEN LOGIC CIRCUIT

(75) Inventors: Yukihiro Sasagawa, Kyoto (JP); Atsushi Takahata, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 181 days.

(21) Appl. No.: 11/195,614

(22) Filed: Aug. 3, 2005

(65) Prior Publication Data
US 2006/0041418 A1 Feb. 23, 2006

(30) Foreign Application Priority Data
Aug. 5, 2004 (JP) ............... 2004-229842
Jul. 8, 2005 (JP) ............... 2005-200003

(51) Int. Cl.
*H03K 19/00* (2006.01)
(52) U.S. Cl. ............... 326/93; 326/95; 326/96
(58) Field of Classification Search ............ 326/93–98
See application file for complete search history.

(56) References Cited

U.S. PATENT DOCUMENTS 5,532,625 A 7/1996 Rajivan

| | | | | |
|---|---|---|---|---|
| 5,565,798 A | * | 10/1996 | Durham et al. ............... | 326/93 |
| 5,986,475 A | * | 11/1999 | Kim et al. ..................... | 326/95 |
| 6,373,290 B1 | * | 4/2002 | Forbes ........................ | 326/98 |

FOREIGN PATENT DOCUMENTS

JP 5-206791 A 8/1993

OTHER PUBLICATIONS

Hauck, "Asynchronous Design Methodologies: An Overview," Proceedings of the IEEE, Jan. 1995, pp. 69-93, vol. 83, No. 1.

* cited by examiner

*Primary Examiner*—Anh Q. Tran
(74) *Attorney, Agent, or Firm*—McDermott Will & Emery LLP

(57) ABSTRACT

A logic circuit comprises: an event generator for detecting a variation in data output from a signal source to generate an event which indicates the variation of the data; a plurality of propagation elements for propagating the event in a chained fashion; and a plurality of evaluation elements for evaluating data received at a first stage from the signal source to propagate a result of the evaluation in a chained fashion. When receiving the event, each of the plurality of evaluation elements evaluates the data input to the evaluation element.

36 Claims, 54 Drawing Sheets

EVENT-DRIVEN LOGIC CIRCUIT

CROSS-REFERENCE TO RELATED APPLICATIONS

This application claims priority under 35 U.S.C. §119(a) on Japanese Patent Application No. 2004-229842 filed on Aug. 5, 2004 and Japanese Patent Application No. 2005-200003 filed on Jul. 8, 2005, the entire contents of which are hereby incorporated by reference.

BACKGROUND OF THE INVENTION

The present invention relates to a logic circuit and specifically to a circuit construction technique for reducing delay and power consumption of a sequential circuit.

Among the presently-existing semiconductor integrated circuits, static circuits, typified by CMOS (Complementary Metal Oxide Semiconductor) circuits, have been widely used. The CMOS circuits have an advantage such that the output does not change so long as the input does not change, and the current consumption includes only a small leak component and an active component which occurs at a value transition, resulting in a relatively small current consumption. On the other hand, a disadvantage of the CMOS circuits is a relatively-large energy delay product in a high speed operation.

FIG. 62 conceptually shows a CMOS circuit. In general, the CMOS circuit includes a circuit for realizing a logical operation of a function to be realized, i.e., evaluation function f, and a circuit for realizing a logical operation of a complementary function of evaluation function f, i.e., function f*. Function f and function f* are generally realized by an N-type transistor and a P-type transistor, respectively. Signals generated by the functions are propagated to the functions at subsequent steps, whereby a circuit operation is realized. In the CMOS circuit, two circuits are constructed for one function, and therefore, the circuit scale and the input load of signals are relatively large. Especially, the P-type transistor needs to have a transistor size about twice as large as that of the N-type transistor in view of the difference in carrier mobility, and therefore, the increase in input load is remarkable. This problem is common among the static circuits, including DCVSL (Differential Cascode Voltage Switch Logic), as well as the CMOS circuits.

A known circuit structure which compensates for the disadvantages of the static circuit is a dynamic circuit (see, for example, the specification of U.S. Pat. No. 5,532,625 (FIG. 3A)). FIG. 63 conceptually shows a dynamic circuit. In general, the dynamic circuit performs a time-sharing operation of an initialization phase for output with initialization function g and an evaluation phase for input with a function to be realized, i.e., evaluation function f. The operation with evaluation function f and the operation with initialization function g are referred to as "evaluation operation" and "precharge operation", respectively. Through the evaluation operation, a signal is generated and propagated, and the function at the subsequent stage performs a precharge operation and an evaluation operation, whereby a circuit operation is realized. Thus, in the dynamic circuit, it is only necessary to add an initialization function to one function, and therefore, the circuit scale and the input load of signal are relatively small. Especially, the initialization operation is performed using a clock, and therefore, the input load depends only on evaluation function f and is about a ⅓ of that of the CMOS circuit.

However, there is a problem that, since the initialization phase and the evaluation phase alternately occur all the time in the dynamic circuit, the activation yield is higher than in the static circuit. Thus, it is necessary to reduce the activation yield by, for example, introducing clock gating control. In the dynamic circuit, a clock is used for an operation of a combinational circuit, and therefore, design restrictions as to the clock tree structure, clock waveform adjustment, etc., become complicated, and the design difficulty increases. Known techniques for reducing the activation yield of the dynamic circuit include a technique which uses an asynchronous circuit (see, for example, Scott Hauck, "Asynchronous Design Methodologies: An Overview", Proceedings of IEEE, Vol. 83, No. 1, January, 1995, pp. 69-93 (FIGS. 7 and 8)) and a technique which performs clock control according to a variation of the input signal (see, for example, Japanese Laid-Open Patent Publication No. 5-206791 (FIG. 1)).

However, in the asynchronous circuit, in general, the operation is completed by a handshake of a request signal and a response signal, and therefore, a circuit for the handshake is necessary. Since an operation of the combinational circuit is accompanied by a handshake, the design difficulty is extremely high. On the other hand, applications of clock control performed according to a variation of the input signal are limited to sequential elements, such as flip flops, memories, and the like, in view of the principle of detecting a variation of the input signal.

Thus, it is difficult to achieve both higher speed operation and lower power consumption in a logic circuit because of the increase of the input load in the static circuit, the increase of the activation yield and extremely-high design difficulty in the dynamic circuit, generation of an overhead of a handshake circuit and extremely-high design difficulty in the asynchronous circuit, and application restrictions in the clock control performed according to a variation of the input signal. It is difficult to solve the problems about the signal load, activation yield, circuit scale, etc., at the same time so long as the circuit operation is based on any one of a rule that a result of sequential function evaluation of a signal input is propagated as in the static circuit and a rule that a result of periodic function evaluation of a signal input is propagated as in the dynamic circuit.

SUMMARY OF THE INVENTION

In view of the above problems, an objective of the present invention is to provide a logic circuit wherein both the input load and the activation yield are reduced, and a high-speed operation is realized with low power consumption.

A measure taken by the present invention for achieving the above objective is a logic circuit which comprises: an event generator for detecting a variation in data output from a signal source to generate an event which indicates the variation of the data; a plurality of propagation elements for propagating the event in a chained fashion; and a plurality of evaluation elements for evaluating data received at a first stage from the signal source to propagate a result of the evaluation in a chained fashion. When receiving the event, each of the plurality of evaluation elements evaluates the data input to the evaluation element.

FIG. 1 conceptually shows a logic circuit according to the present invention. Data output from a signal source 100 is transferred to an event generator 10 and an evaluation element 30 at the first stage. The event generator 10 detects a variation in the output of the signal source 100 to generate an event. The event is propagated by propagation elements 20. Along with the propagation of the event, the event is issued from each propagation element 20 to a corresponding evaluation element 30. The evaluation element 30 evaluates input data based on the event issued by the corresponding propagation element 20. In the logic circuit according to the present invention, data and an event are propagated through different paths, and only an evaluation element which has received an event is activated to evaluate the input data, whereas in a conventional logic circuit, propagation of data through evaluation elements allows the circuit to operate.

FIG. 2 is a conceptual diagram of a dynamic circuit extended from a logic circuit according to the present invention. Data output from each signal source 100 is transferred to a corresponding event generator 10 and a corresponding evaluation element 30 at the first stage. An event generated by each event generator 10 propagates through a group of propagation elements 200. Along with the propagation of the event, events are issued by the group of propagation element 200 to corresponding evaluation controllers 40. Receiving the event, each evaluation controller 40 outputs a control signal to a corresponding evaluation element (evaluation section) 30.

BEST MODE FOR CARRYING OUT THE INVENTION

Hereinafter, best modes for carrying out the present invention will be described with reference to the drawings.

Embodiment 1

Figure 1:
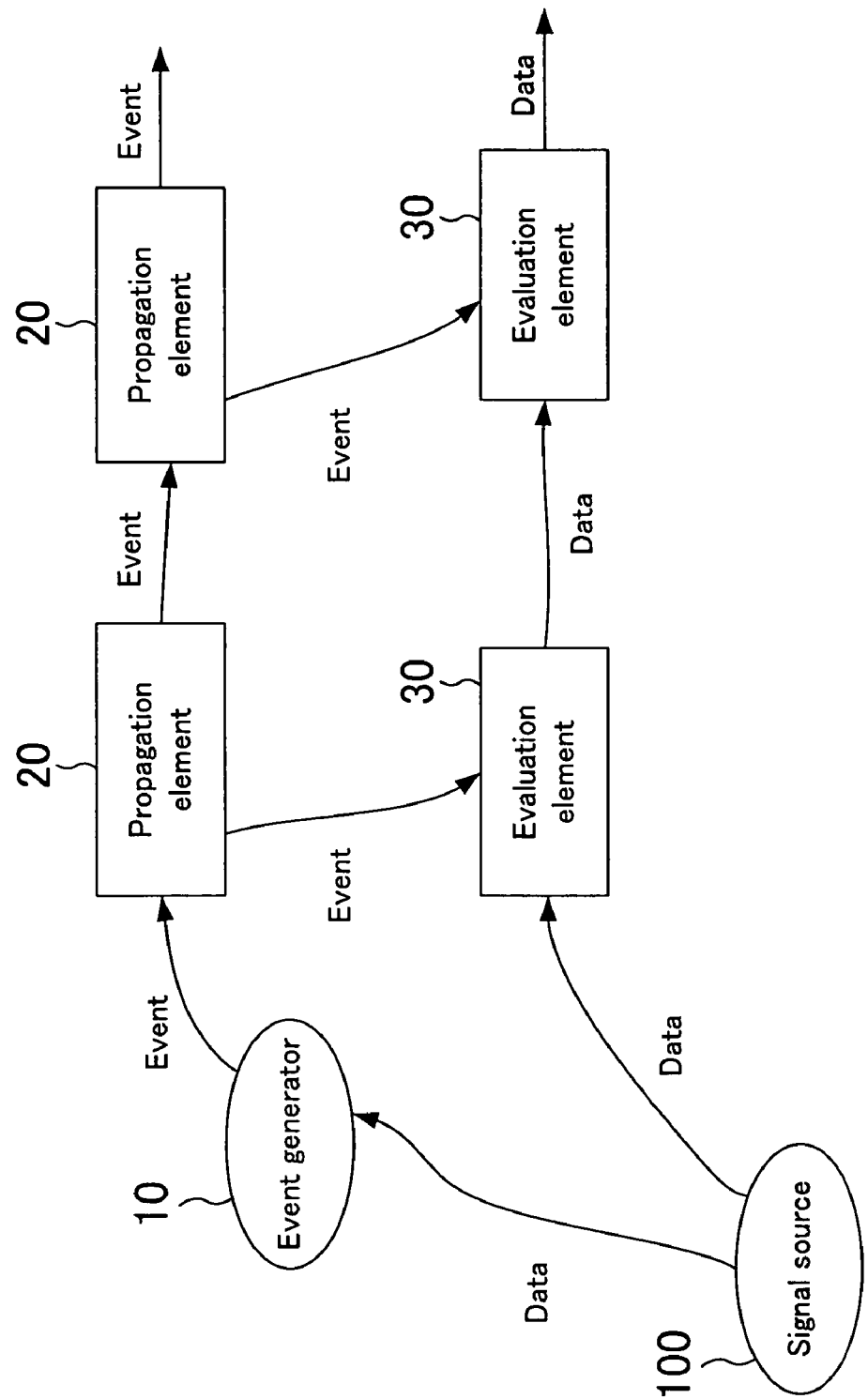
FIG. 1 is a concept diagram of a logic circuit according to the present invention.
Figure 2:
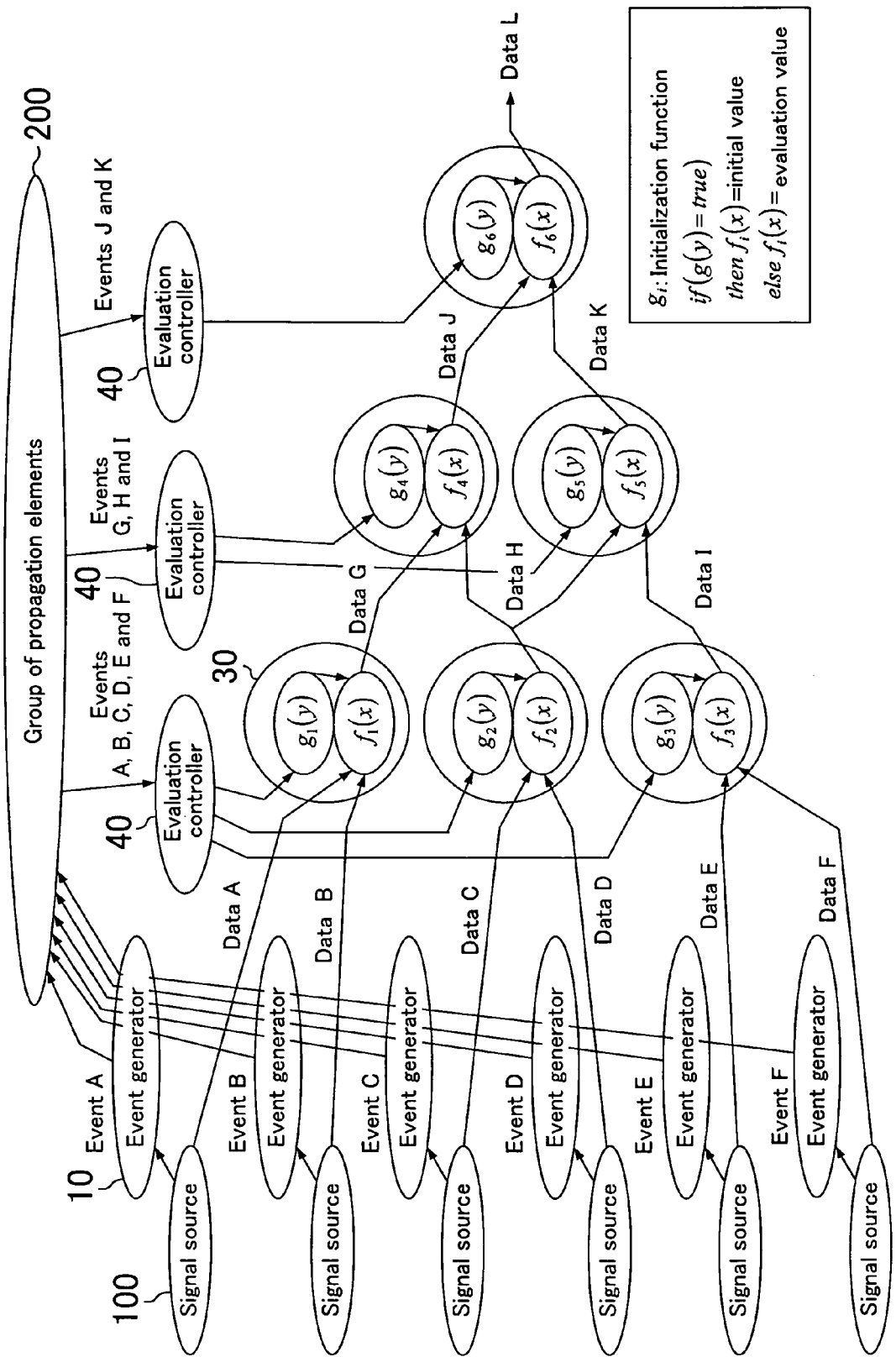
FIG. 2 is a concept diagram of a dynamic circuit extended from a logic circuit according to the present invention.
Figure 3:
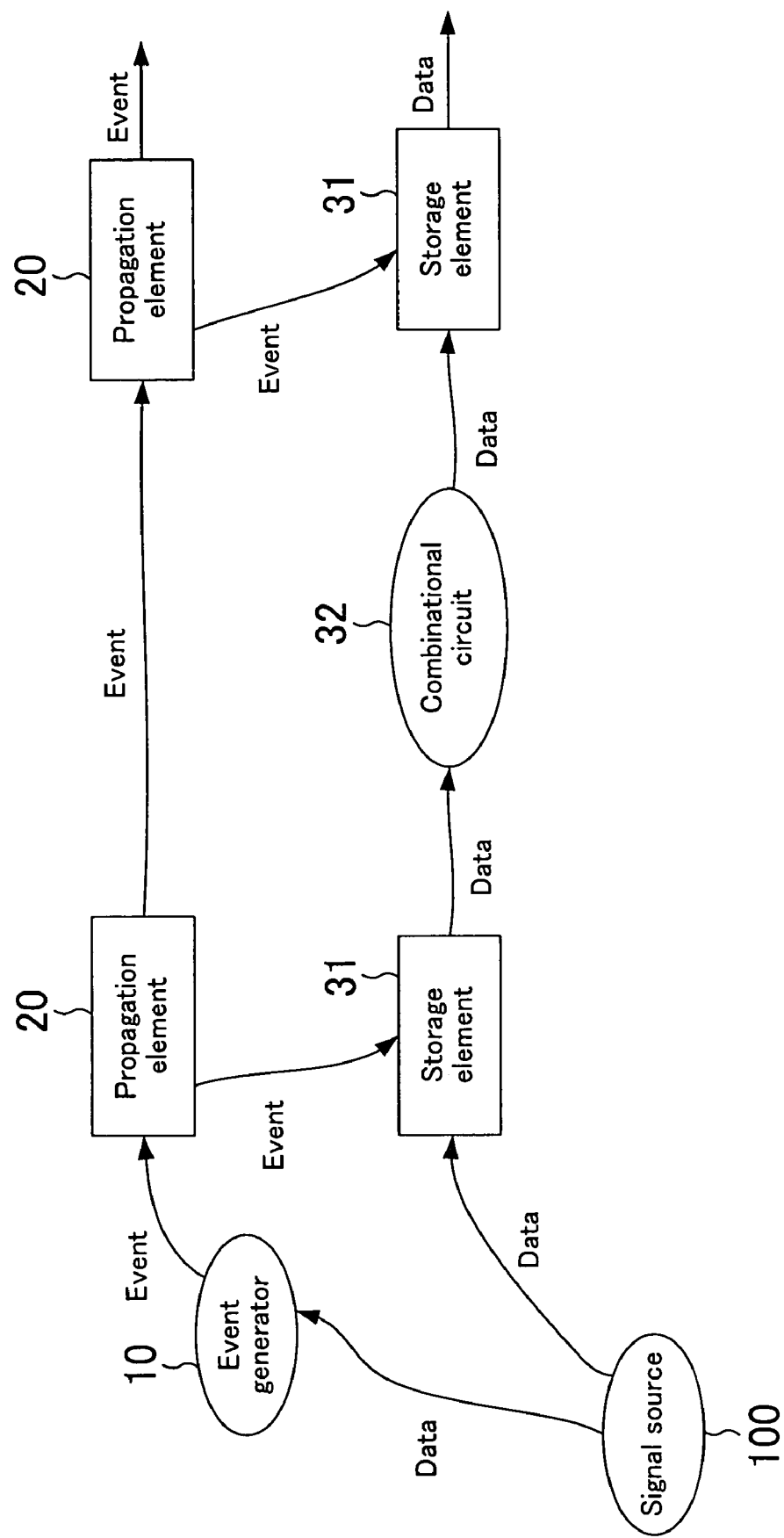
FIG. 3 shows a general structure of a logic circuit according to embodiment 1.

FIG. 3 shows a general structure of a logic circuit according to embodiment 1 of the present invention. The logic circuit of embodiment 1 includes, as an evaluation element, a storage element 31 for storing input data. The logic circuit of embodiment 1 operates as follows. As the output of a signal source 100 varies, an event is generated by an event generator 10 and propagated through propagation elements 20. A storage element 31 at the first stage stores data output from the signal source 100 based on the event issued by a propagation element 20 at the first stage. The data stored in the storage element 31 at the first stage is subjected to a logical operation of a combinational circuit 32, and a result of the operation is supplied to a storage element 31 at the next stage. The storage element 31 at the next stage stores the data received from the combinational circuit 32 based on the event issued by a corresponding propagation element 20.

Thus, according to embodiment 1, only a storage element which is affected when the output of a signal source is varied operates. Therefore, the activation yield of the entire logic circuit is decreased.

Embodiment 2

Figure 4:
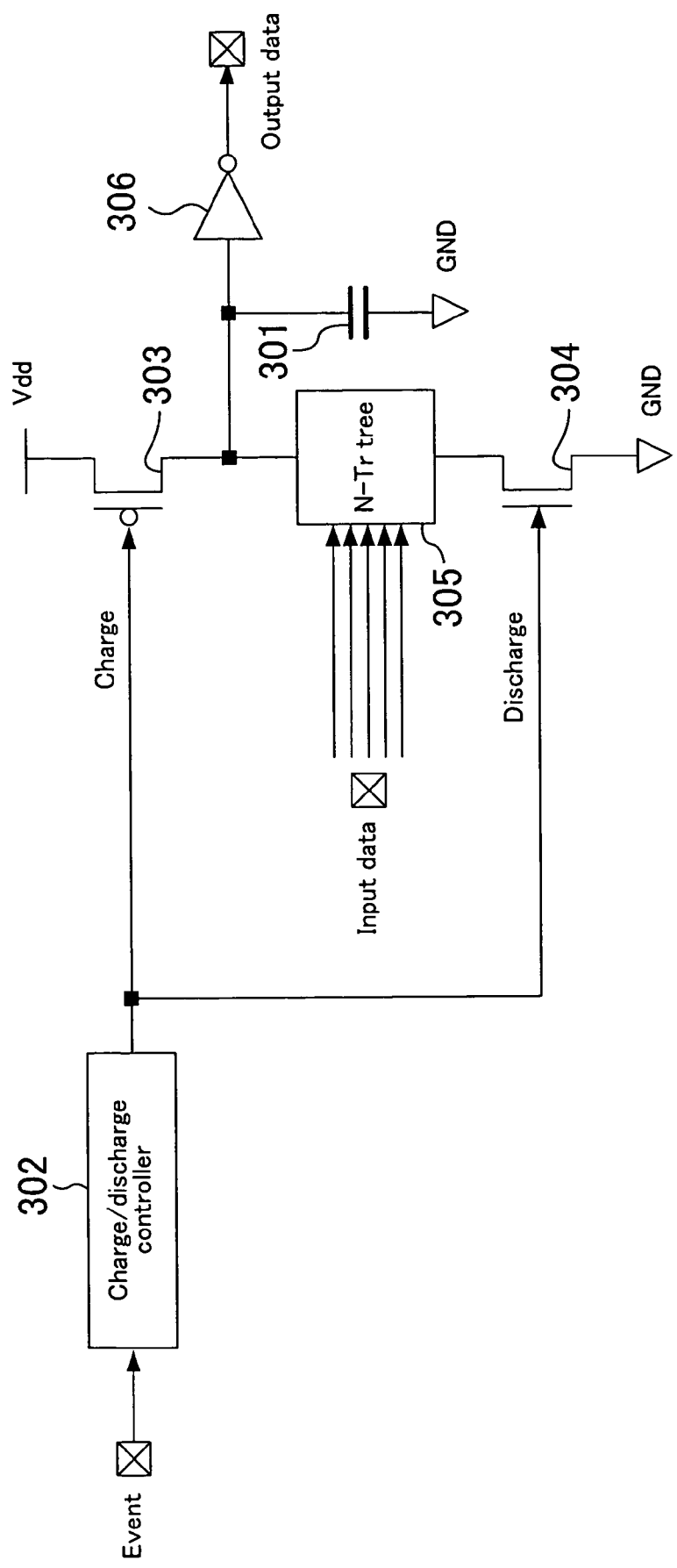
FIG. 4 shows a circuit structure of an evaluation element according to embodiment 2.

FIG. 4 shows a circuit structure of an evaluation element according to embodiment 2 of the present invention. The evaluation element of embodiment 2 includes a capacitor 301, a charge/discharge controller 302 for controlling the charging/discharging of the capacitor 301 with electric charges based on an event, a charging device 303 and a discharging device 304 for charging/discharging the capacitor 301 under the control of the charge/discharge controller 302, an evaluation logic circuit 305 for determining a discharge path by a function, and a static gate 306 (e.g., an inverter). It should be noted that the capacitor 301 is preferably a ferroelectric capacitor.

Figure 5:
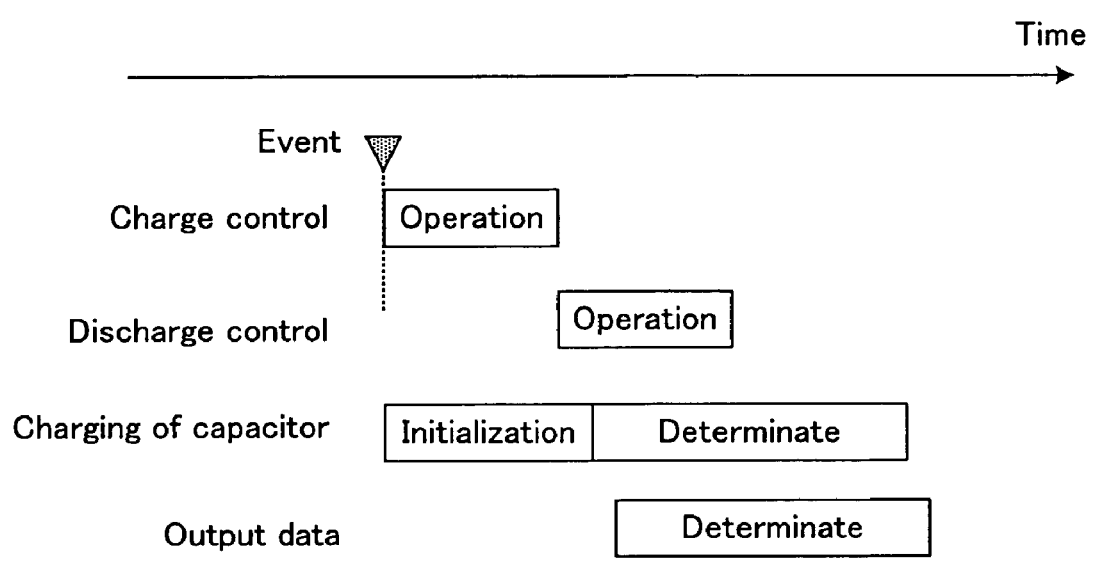
FIG. 5 is a timing chart of the evaluation element shown in FIG. 4.

Next, an operation of the evaluation element according to embodiment 2 is described with reference to the timing chart of FIG. 5. The charging device 303 operates in response to generation of an event, such that the charge-held state of the capacitor 301 is initialized. Then, the discharging device 304 is activated so that the capacitor 301 is discharged according to the evaluation state of the input data by the evaluation logic circuit 305, whereby the output data is determined. The determined data is output via the static gate 306 (e.g., an inverter) to an evaluation element at the next stage.

According to embodiment 2, the logic circuit is downsized because a capacitor is used as means for holding an evaluation result.

Embodiment 3

Figure 6:
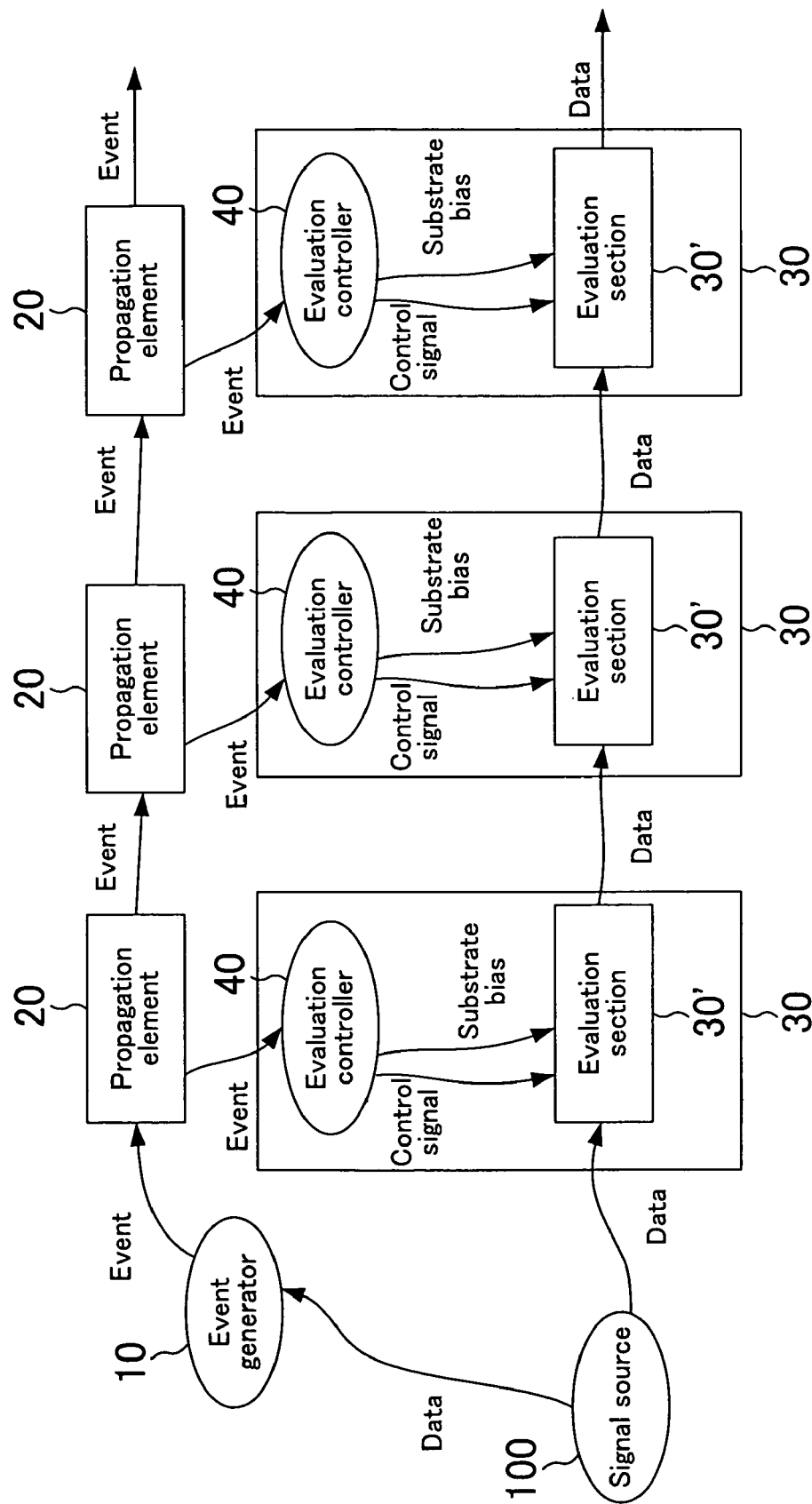
FIG. 6 shows a general structure of a logic circuit according to embodiment 3.

FIG. 6 shows a general structure of a logic circuit according to embodiment 3 of the present invention. In the logic circuit of embodiment 3, an evaluation element 30 includes an evaluation controller 40 which receives an event from a propagation element 20 to output various control signals and a substrate bias, and an evaluation section 30' for evaluating input data under the control of the evaluation controller 40.

Figure 7:
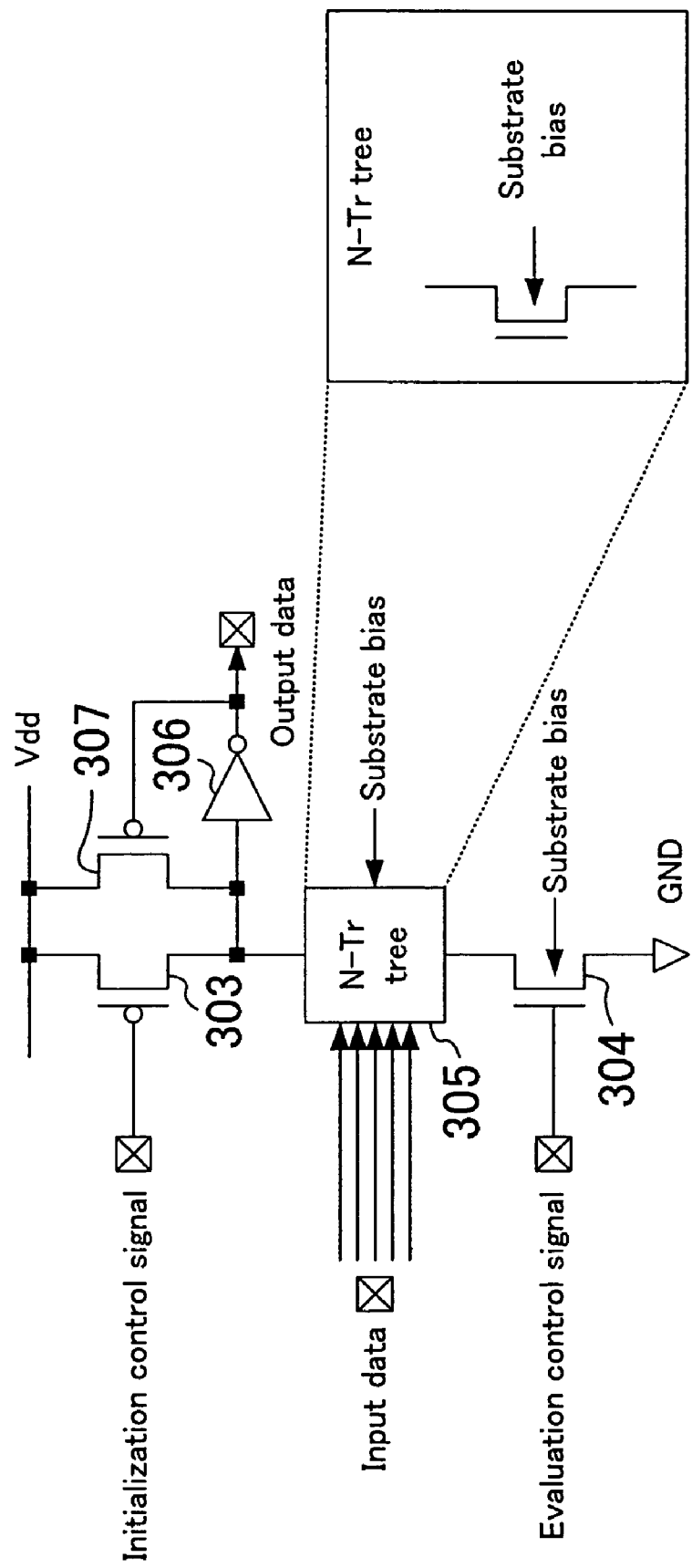
FIG. 7 shows a circuit structure of an evaluation element according to embodiment 3.

FIG. 7 shows a circuit structure of an evaluation element according to embodiment 3. It should be noted that the evaluation controller is not shown. The evaluation element of embodiment 3 includes a device 303 for controlling a precharge operation based on a given initialization control signal, a device 304 for controlling an evaluation operation based on a given evaluation control signal, an evaluation logic circuit 305 for determining a discharge path by a function, a static gate 306 (e.g., an inverter), and a level keeper 307 for holding a charged/discharged potential. A substrate bias which is controlled by the evaluation controller is applied to the device 304. The same substrate bias is applied to N-type transistors of the evaluation logic circuit 305.

Figure 8:
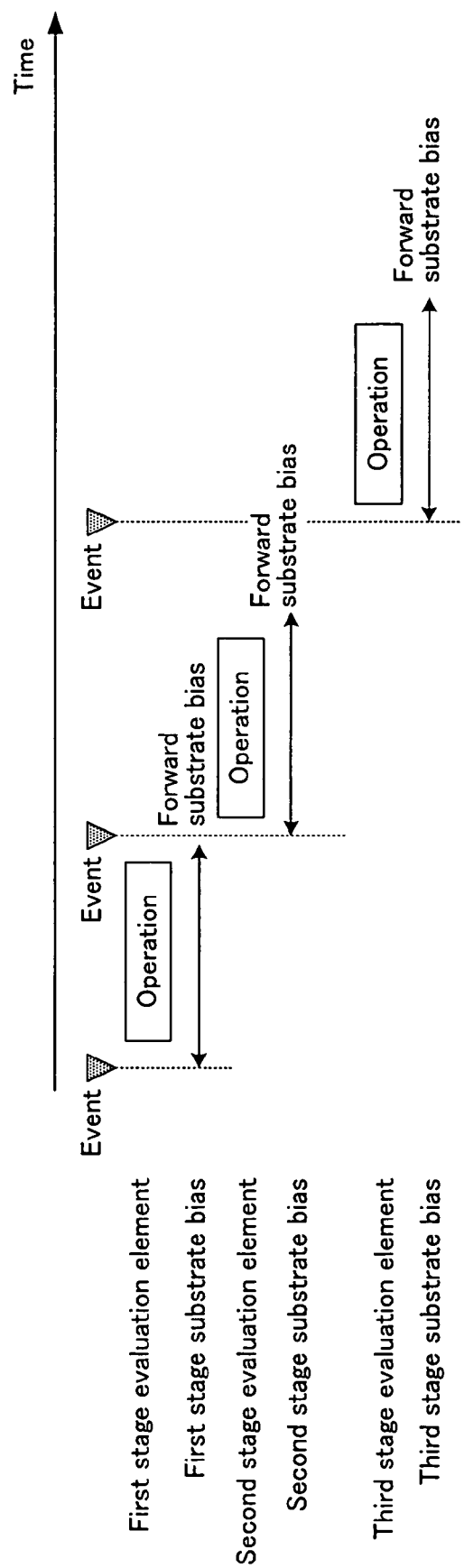
FIG. 8 is a timing chart of the evaluation element shown in FIG. 7.

Next, an operation of the evaluation element of embodiment 3 is described with reference to the timing chart of FIG. 8. As an event is generated, a forward substrate bias is applied to each evaluation section 30' during the operation of each evaluation element 30. The event is sequentially issued to the evaluation elements 30, and accordingly, a forward substrate bias is sequentially applied to the evaluation sections 30'.

Thus, according to embodiment 3, when an event is issued, a forward substrate bias is applied to an evaluation section of an evaluation element which is a subject of control, whereby the performance of a transistor of the evaluation section is improved. Alternatively, it is possible that a reverse substrate bias is normally applied to the evaluation section, but application of this reverse substrate bias is stopped based on an event.

In a dynamic circuit in which initialization (precharge) control and evaluation control are performed, in general, a sufficient pulse width for completion of a precharge and a setup between input data of an evaluation element and evaluation timings of respective stages have to be secured.

Figure 9:
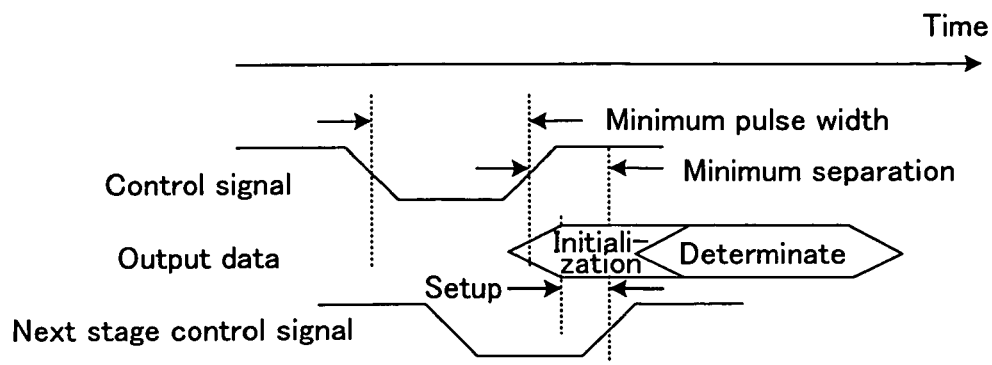
FIG. 9 is a timing chart of the evaluation element shown in FIG. 4.

FIG. 9 is a timing chart of the evaluation element shown in FIG. 4. This evaluation element always performs an evaluation operation except for a precharge period. As the precharge of a certain evaluation element is completely done, data which is to be output to an evaluation element of the next stage is determined. Thus, at the time of reproduction of a control signal, both the minimum pulse width of the control signal and the minimum separation from a control signal of the next stage need to be controlled. Therefore, the timing adjustment between the precharge control and the evaluation control is relatively difficult.

Figure 10:
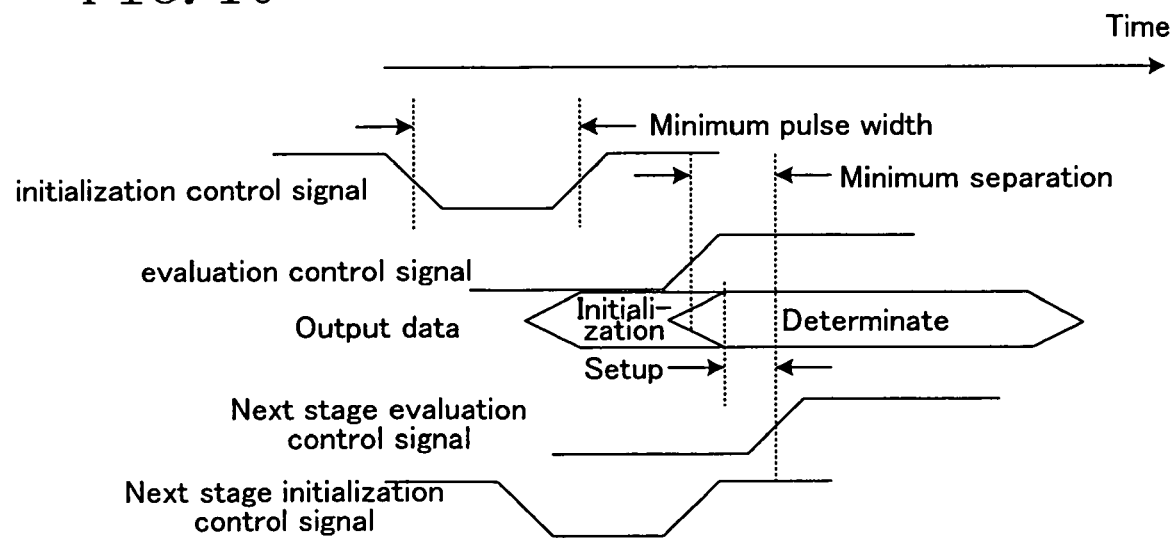
FIG. 10 is a timing chart of the evaluation element shown in FIG. 7.

FIG. 10 is a timing chart of the evaluation element shown in FIG. 7. In this evaluation element, the precharge control and the evaluation control are performed independently of each other. That is, where the evaluation control signal is in an inactive state (logic level "Lo" in FIG. 10), if the initialization control signal is activated (logic level "Lo" in FIG. 10), the precharge control is performed. Thus, only the pulse width of the initialization control signal is controlled at the time of its generation, and the evaluation control signal can be controlled separately. Therefore, the timing adjustment is relatively easy.

It should be noted that these two methods for controlling evaluation elements may be appropriately selected in view of the overheads of circuits and wires, the design productivity, etc.

Embodiment 4

Figure 11:
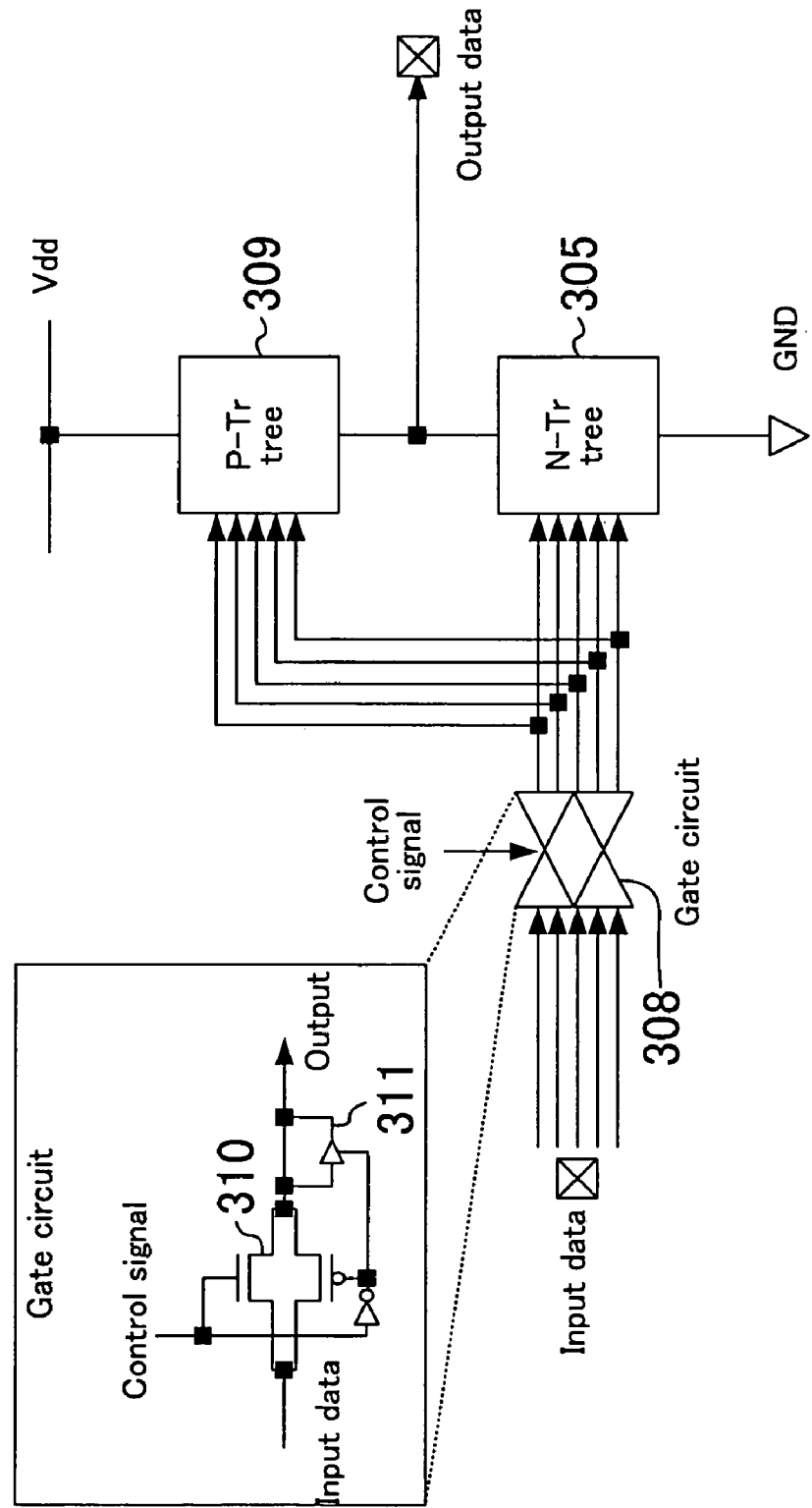
FIG. 11 shows a circuit structure of an evaluation element according to embodiment 4.

FIG. 11 shows a circuit structure of an evaluation element according to embodiment 4 of the present invention. The evaluation element of embodiment 4 includes an evaluation controller and an evaluation section as do the evaluation elements 30 of FIG. 6. It should be noted that the evaluation controller is not shown herein. The evaluation element of embodiment 4 is a static circuit which includes a gate circuit 308 for switching passage and holding of input data based on a supplied control signal and evaluation logic circuits 305 and 309 for determining a discharge path by a function. The evaluation logic circuits 305 and 309 are formed by a plurality of N-type transistors and a plurality of P-type transistors, respectively. The gate circuit 308 includes a transmission device 310 for allowing passage of input data and a level keeper 311 for holding a potential when the transmission device 310 is off. When the control signal is active, the gate circuit 308 allows the input data to pass therethrough. When otherwise, the gate circuit 308 holds the current potential. The control signal supplied to the gate circuit 308 is, for example, a signal output from the evaluation controller 40 shown in FIG. 6.

Figure 12:
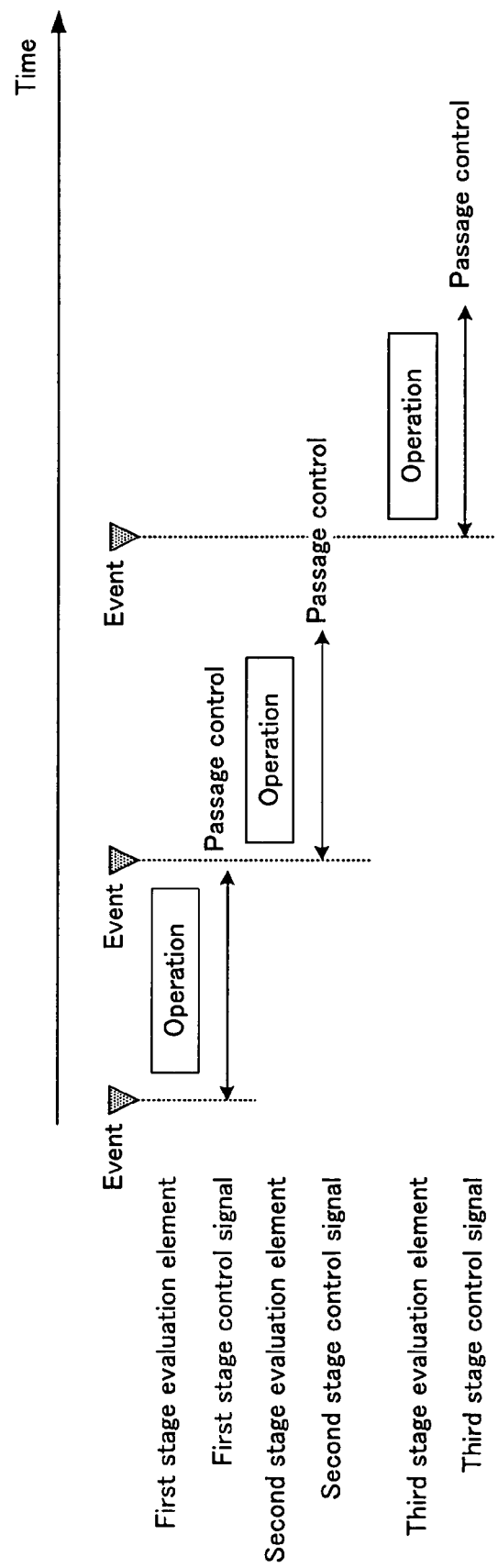
FIG. 12 is a timing chart of the evaluation element shown in FIG. 11.

Next, an operation of the evaluation element of embodiment 4 is described with reference to the timing chart of FIG. 12. As an event is generated, a control signal is active while each evaluation element 30 operates, and input data passes through the gate circuit 308. The control signals of the evaluation elements 30 are sequentially activated, and accordingly, input data of the evaluation elements 30 sequentially pass through the gate circuits 308.

According to embodiment 4, as an event is generated, input data passes through a gate circuit in an evaluation element, and each evaluation logic circuit evaluates the input data. With this structure, a glitch of an input to each evaluation logic circuit is suppressed, and the power consumption is decreased.

It should be noted that the above-described gate circuit may be provided to an evaluation element of a dynamic circuit type. Especially, providing the above-described gate circuit to suppress a glitch is particularly effective because the dynamic circuit is susceptible to a glitch.

One of the features of the present invention is to separate a circuit operation into propagation of an event which triggers a function evaluation and propagation of data which constitutes an input in a function evaluation to independently optimize the circuit components and connection configuration separately for an operation relating to evaluation control by event propagation and an operation relating to a function evaluation by data propagation. Hereinafter, this feature of the present invention will be described in detail with presentation of some embodiments.

Embodiment 5

Figure 13:
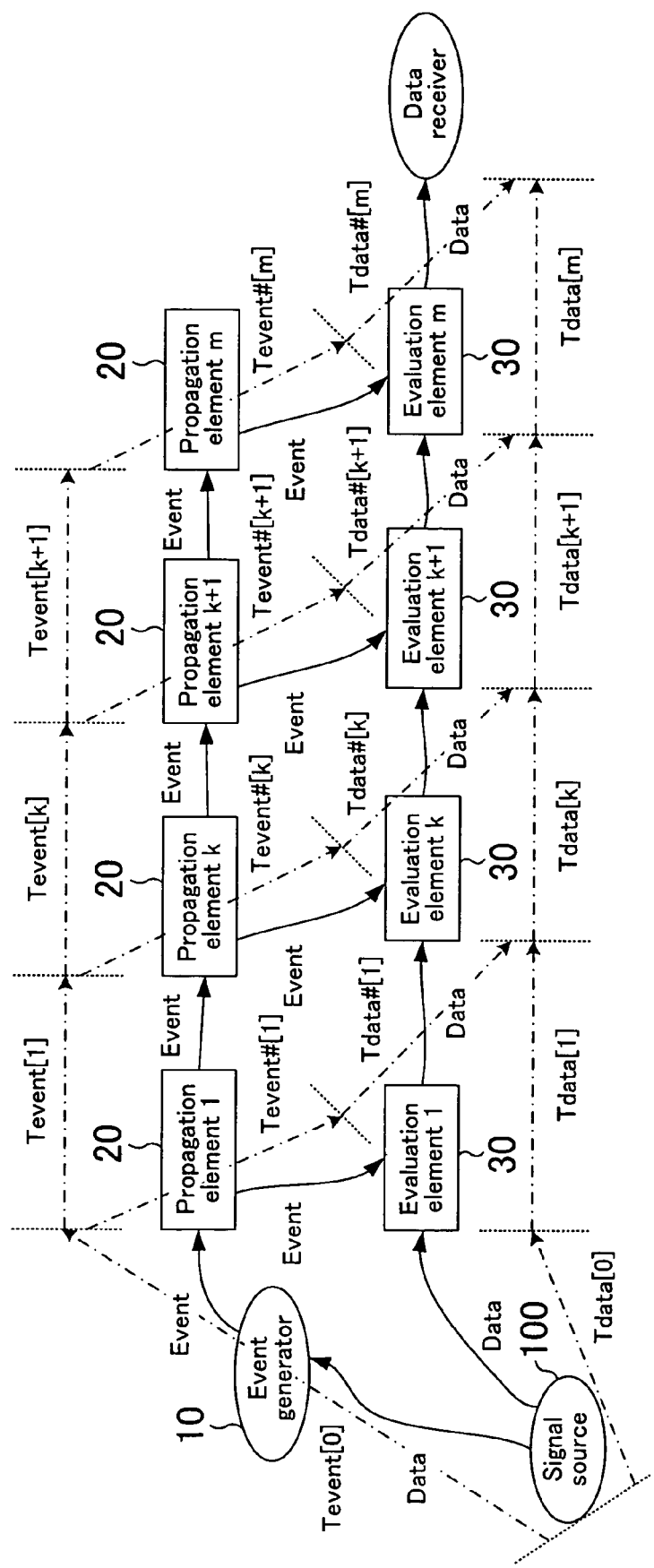
FIG. 13 shows a general structure of a logic circuit according to embodiment 5.

FIG. 13 shows a general structure of a logic circuit according to embodiment 5 of the present invention. The logic circuit of embodiment 5 includes an event generator 10, and propagation elements 20 and evaluation elements 30 which are cascaded over m stages (m is a natural number). Hereinafter, the characteristics of a delay path of the present invention are described with an example of the logic circuit of embodiment 5.

In general, the maximum delay of a circuit is determined by a combination of delays of components, i.e., a delay path. A logic circuit of the present invention has a delay path which extends through the propagation elements 20 and a delay path which extends through the evaluation elements 30 because propagation of an event and propagation of data are separated. Herein, to express delays of respective components, variations Tdata[k], Tevent[k], Tdata#[k], and Tevent#[k] are given (k is the number of stages of the evaluation elements 30 which is calculated from the evaluation element 30 of the first stage or the number of stages of the propagation elements 20 which is calculated from the propagation element 20 of the first stage). Tdata[k] represents a delay lasting from the input of data to the evaluation element 30 at the kth stage to a time immediately before the input of data to the evaluation element 30 at the next ((k+1)th) stage. Tdata[0] represents a delay lasting from the signal source 100 to the evaluation element 30 at the first stage. Tevent[k] represents a delay lasting from the input of an event to the propagation element 20 at the kth stage to a time immediately before the input of an event to the propagation element 20 at the next ((k+1)th) stage. Tevent[0] represents a delay lasting from the signal source 100 to the propagation element 20 at the first stage via the event generator 10. Tdata#[k] represents a delay lasting from the input of an event to the evaluation element 30 at the kth stage to a time immediately before the input of data to the evaluation element 30 at the next ((k+1)th) stage. Tevent#[k] represents a delay lasting from the input of an event to the propagation element 20 at the kth stage to a time immediately before the input of an event to the evaluation element 30 connected to the propagation element 20 of the kth stage.

Firstly, when an event is generated by the event generator 10, a delay occurs. Therefore, the following relationship holds:

$$Tevent[0] > Tdata[0]$$

Although there is a possibility that the delay is ameliorated with a certain circuit structure of the event generator 10 so that Tevent[0]>Tdata[0] does not hold, the above relationship is given herein on an assumption that the delay in the event generator 10 is the worst.

Since the propagation element 20 does not perform a logical operation, the delay of the propagation element 20 is expected to be sufficiently smaller than that of the evaluation element 30. Therefore, the following relationship holds:

$$Tevent[k] << Tdata[k]$$

Although there are some variations according to the structures of the propagation element 20 and the evaluation element 30, the following relationships as to propagation delays of event and data generally hold:

$$Tevent[k] \approx Tevent\#[k], \text{ and}$$

$$Tdata[k] \approx Tdata\#[k].$$

As seen from the above, the propagation delay of the path extending through the propagation elements 20 is smaller than that of the path extending through the evaluation elements 30. Although the propagation delay of the path extending through the evaluation elements 30 is smaller than that of the path extending through the propagation elements 20 until a certain point ($k_0$th stage) because of the delay caused by the event generator 10, the propagation delay of the path extending through the propagation elements 20 is smaller at the subsequent stages. Therefore, the following relationships hold:

$$\Sigma T\text{data}[0 \ldots k_0] \leq \Sigma T\text{event}[0 \ldots k_0-1] + T\text{event}\#[k_0] + T\text{data}\#[k_0], \text{ and}$$

$$\Sigma T\text{data}[0 \ldots k_0+1] > \Sigma T\text{event}[0 \ldots k_0] + T\text{event}\#[k_0+1] + T\text{data}\#[k_0+1].$$

Herein, since the maximum value of the number of stages of the evaluation elements 30 is m, the maximum delay of the logic circuit of embodiment 5 (Max-Delay) is expressed by the following expression:

$$\text{Max-Daley}[0 \ldots m] = \Sigma T\text{event}[0 \ldots k_0-1] + T\text{event}\#[k_0] + T\text{data}\#[k_0] + \Sigma T\text{data}[k_0+1 \ldots m]$$

In the logic circuit according to the present invention, the data delay in the evaluation elements 30 is small as compared with a conventional CMOS circuit because an event propagates independently, whereas in the conventional CMOS circuit the input load of a signal becomes large according to the structure of functions used in a logical operation. Therefore, the following relationship holds:

$$\text{Tdata} \ll \text{Tdata0}$$

where Tdata0 is the delay of conventional data propagation. Thus, the following relationship holds:

$$\text{Max-Delay}[0 \ldots m] \ll \text{Max-Delay0}$$

where Max-Delay0 is the maximum delay of the conventional CMOS circuit.

Figure 14:
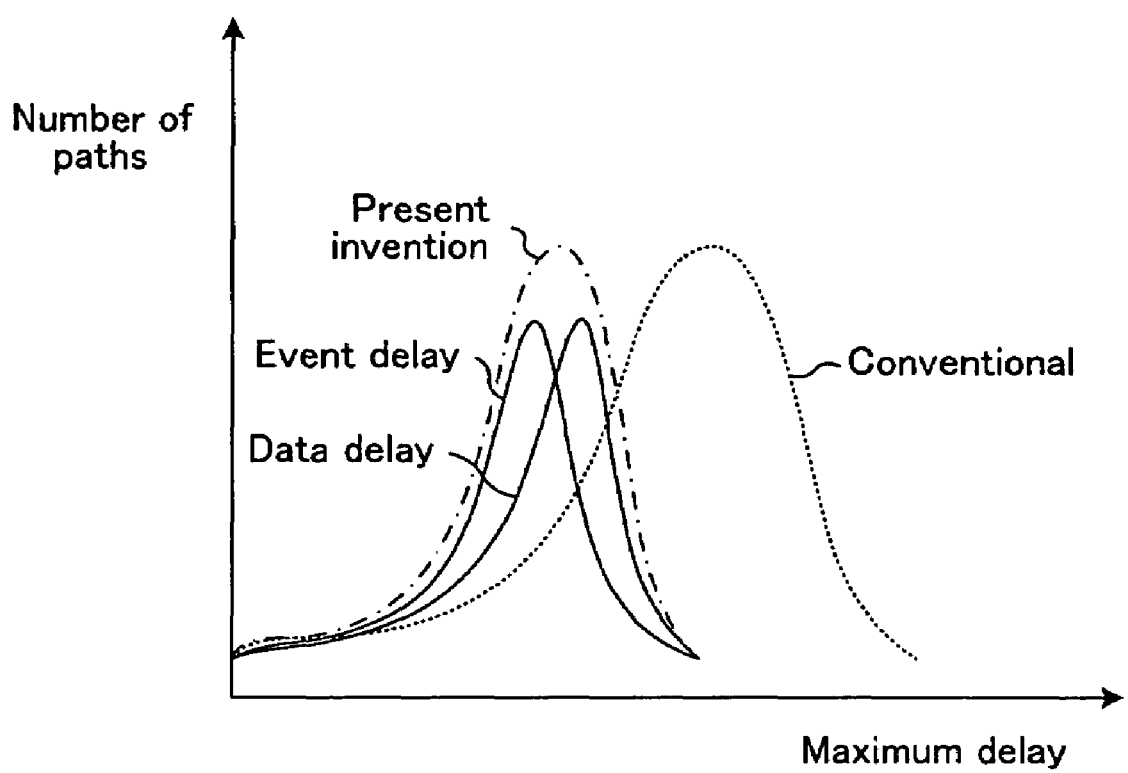
FIG. 14 shows a maximum delay distribution of a logic circuit according to the present invention.

FIG. 14 shows a maximum delay distribution of a logic circuit of the present invention. The vertical axis represents the number of paths, and the horizontal axis represents the maximum delay. The logic circuit of the present invention includes two types of delays, i.e., the event delay and the data delay. The sum of these delays constitutes the maximum delay distribution. As described above, the maximum delay of the logic circuit of the present invention is sufficiently smaller than the conventional maximum delay, and therefore, the distribution of the maximum delay is also shifted in a direction such that the delay is decreased as compared with the conventional delay.

Embodiment 6

In general, the logic circuit has a variation in the circuit delay, which is attributed to the inhomogeneousness of the circuit structure. In consideration of an overhead resulting from a clock skew or hold time violation, it is preferable that the difference between the minimum delay and the maximum delay is small. As for the logic circuit of the present invention, the delay characteristics obtained in the case of an inhomogeneous circuit structure are now described.

Figure 15:
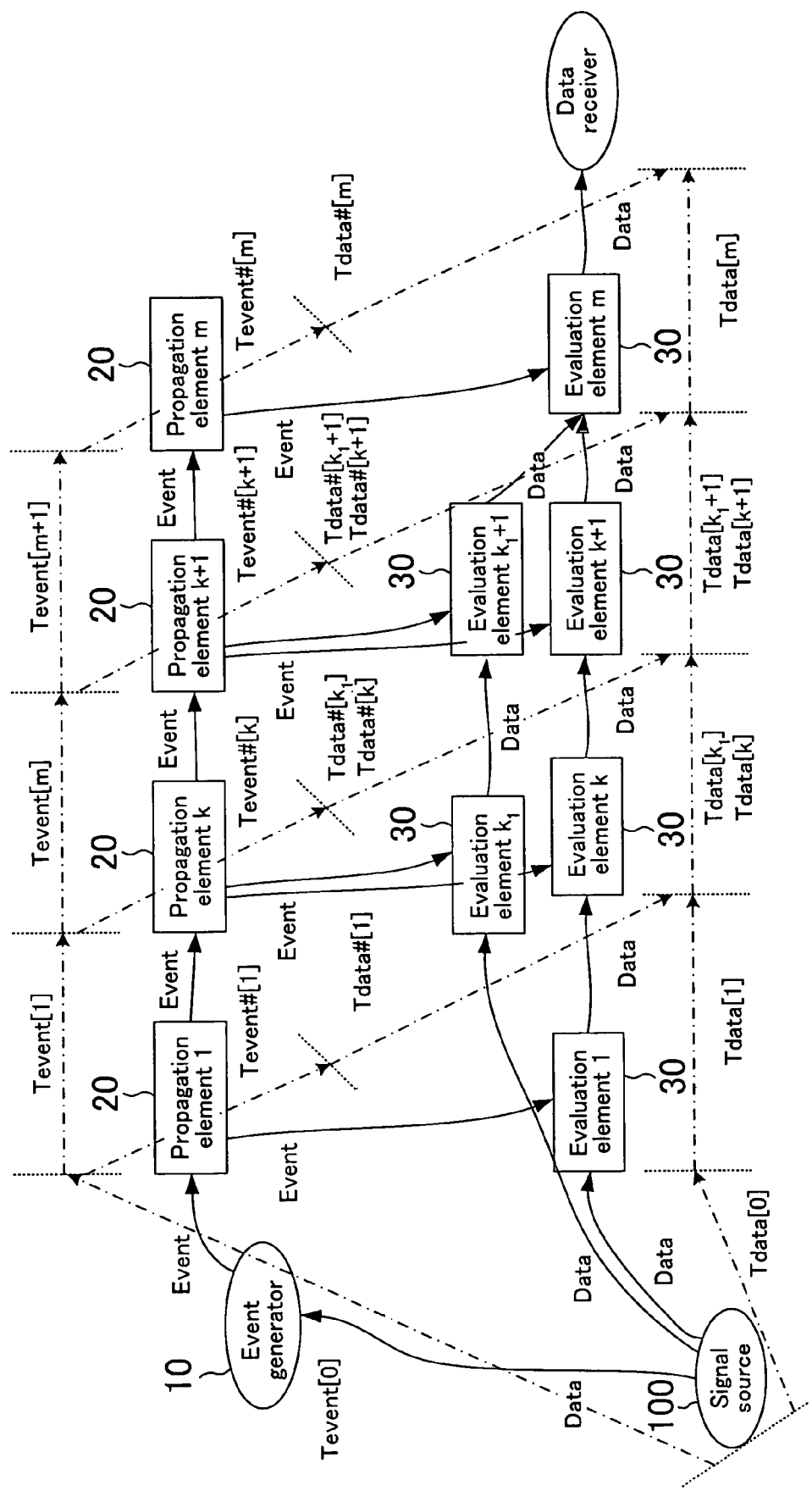
FIG. 15 shows a general structure of a logic circuit according to embodiment 6.

FIG. 15 shows a general structure of a logic circuit according to embodiment 6 of the present invention. In the logic circuit according to embodiment 6, the circuit structure of evaluation elements 30 is inhomogeneous, and the cascaded evaluation elements 30 have a maximum delay path of m stages (m is a natural number) and a minimum delay path of n stages (n is a natural number smaller than m). Propagation elements 20 are cascaded with correspondence to the maximum delay path of the evaluation elements 30. Irrespective of whether they are in the maximum delay path or the minimum delay path, the evaluation elements 30 distant from the last stage by an equal number of stages receive an event from the same propagation element 20. That is, an event issued by a propagation element 20 of the kth stage counted from the first stage propagation element 20 is supplied to an evaluation element 30 of the (k−m+n)th stage counted from the first stage evaluation element 30 in an interested data propagation path.

Herein, it is assumed that $(k_1-m+n)=1$ at $k_1$th stage. In this case, the minimum delay path is formed only by the propagation elements 20 between the first stage and the $(k_1-1)$th stage but formed by the propagation elements 20 and the evaluation elements 30 at and after the $k_1$th stage. Thus, the minimum delay (Min-Delay) is as expressed by the following expression. It should be noted that the variables are the same as those described in embodiment 5.

$$\text{Min-Delay}[0 \ldots m] = \Sigma T\text{event}[0 \ldots k_1-1] + T\text{event}\#[k_1] + T\text{data}\#[k_1] + \Sigma T\text{data}[k_1+1 \ldots m]$$

As seen from this expression, the minimum delay has no relation to the number of minimum delay paths (n). Thus, in the conventional CMOS circuit, the delay is determined according to the number of stages of evaluation elements 30. Therefore, if the circuit structure is inhomogeneous, the delay distribution would be dispersed, and the difference between the maximum delay path and the minimum delay path would be relatively large. However, in the logic circuit according to the present invention, the number of stages in the minimum delay path is equal to the number of stages in the maximum delay path, and an event is supplied through the same propagation path to the minimum delay path and the maximum delay path. Therefore, the minimum delay is sufficiently larger than the conventional one. Thus, the following relationship holds:

$$\text{Min-Delay}[0 \ldots m] \gg \text{Min-Delay0}$$

where Min-Delay0 is the conventional minimum delay.

Figure 16:
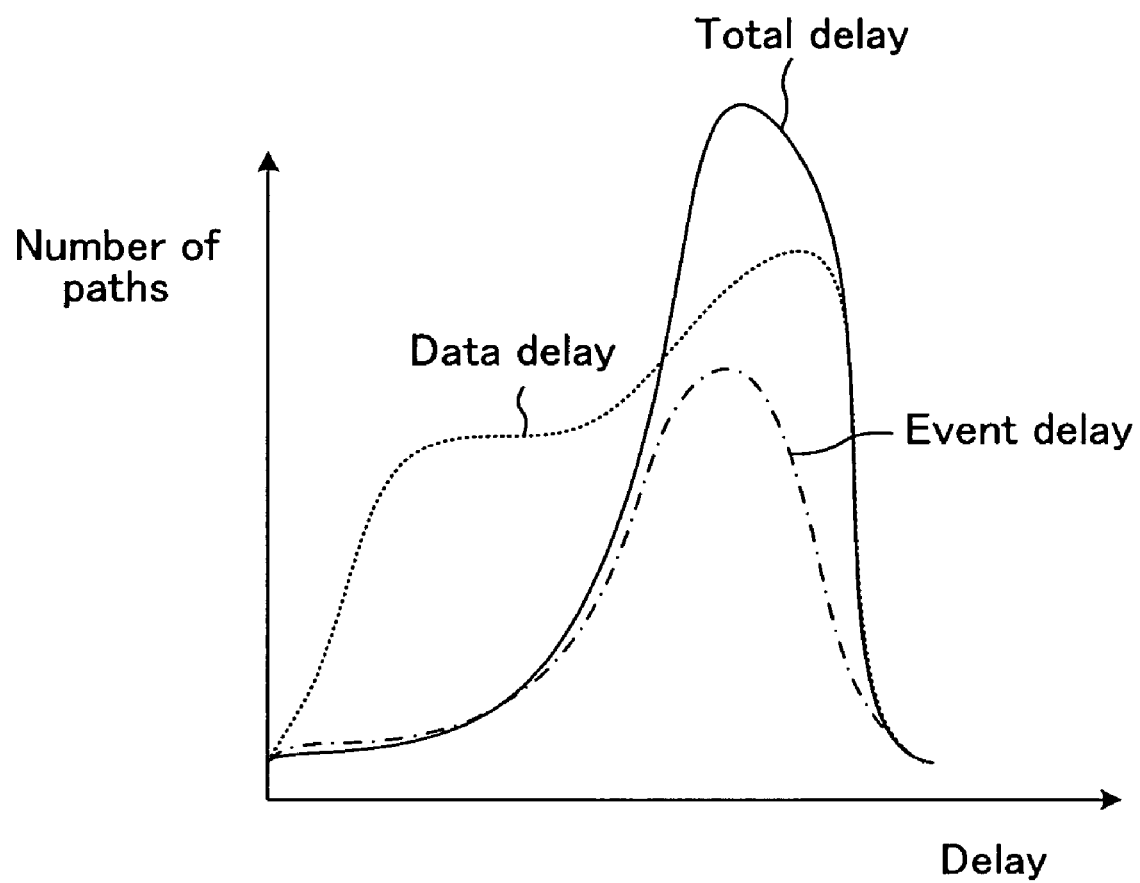
FIG. 16 shows a delay distribution of a logic circuit according to the present invention.

FIG. 16 shows a delay distribution for a case where a logic circuit of the present invention has an inhomogeneous circuit structure. The vertical axis represents the number of paths, and the horizontal axis represents the delay. The delay distribution of the data propagation path is dispersed due to the inhomogeneousness of the circuit structure. The same applies to the delay distribution of the conventional logic circuit. On the other hand, the delay distribution of the event propagation path is localized irrespective of the inhomogeneous circuit structure. The total delay distribution is largely affected by the delay characteristics of the event propagation path and is therefore localized. That is, in the logic circuit according to embodiment 6, the difference between the maximum delay and the minimum delay is relatively small even when the circuit structure is inhomogeneous.

Embodiment 7

Figure 17A:
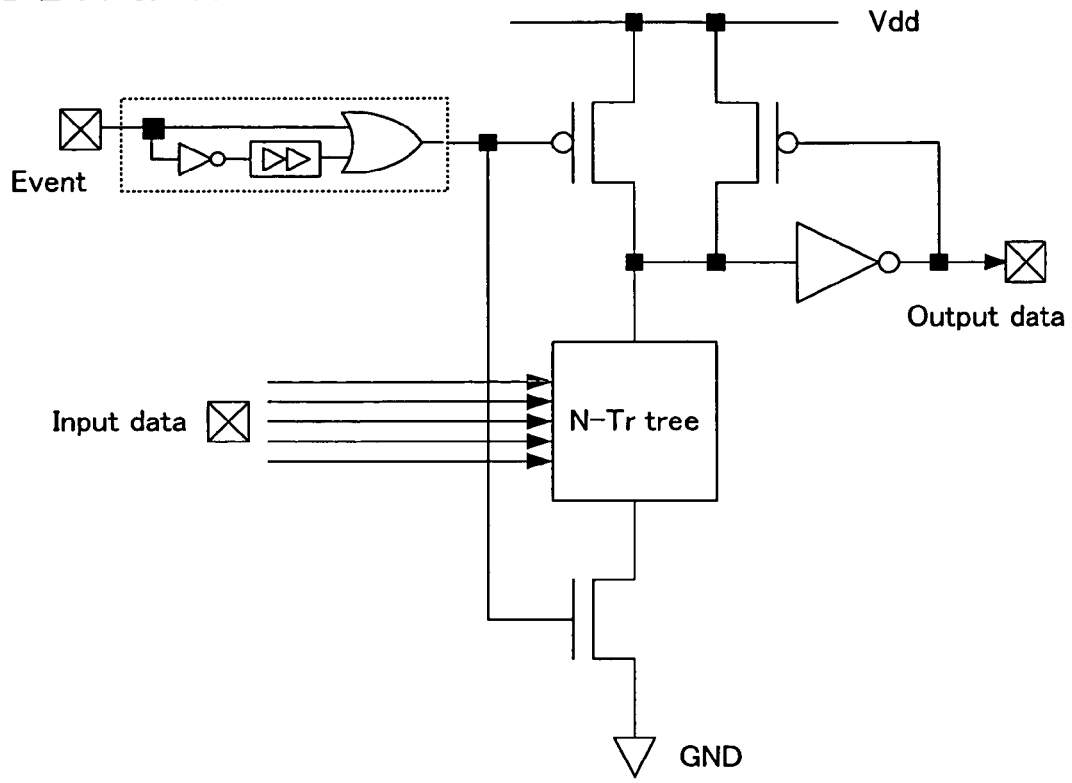
FIG. 17A and FIG. 17B show a circuit structure of an evaluation element and a propagation element according to embodiment 7.
Figure 17B:
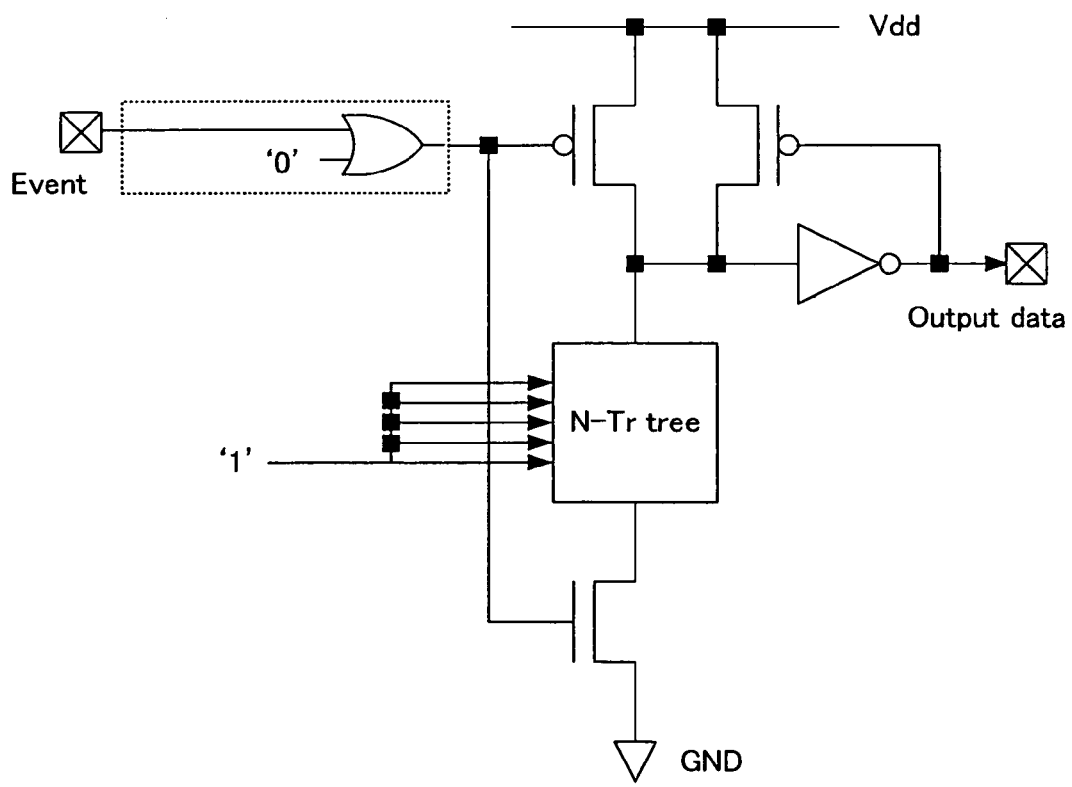

Next, we consider making the characteristics of the delay path of the present invention described in embodiment 5 more effective. To this end, it is preferable that an evaluation element and a propagation element have substantially the same internal circuit structure such that the propagation element has delay characteristics approximate to those of the evaluation element. FIG. 17A and FIG. 17B show a circuit structure of an evaluation element and a propagation element according to embodiment 7 of the present invention. Specifically, the propagation element shown in FIG. 17B is formed by replacing some of inputs to the evaluation element shown in FIG. 17A with fixed signals. With this structure, the evaluation element and the propagation element have approximate characteristics as to various variations in processes, temperature, etc.

Figure 18:
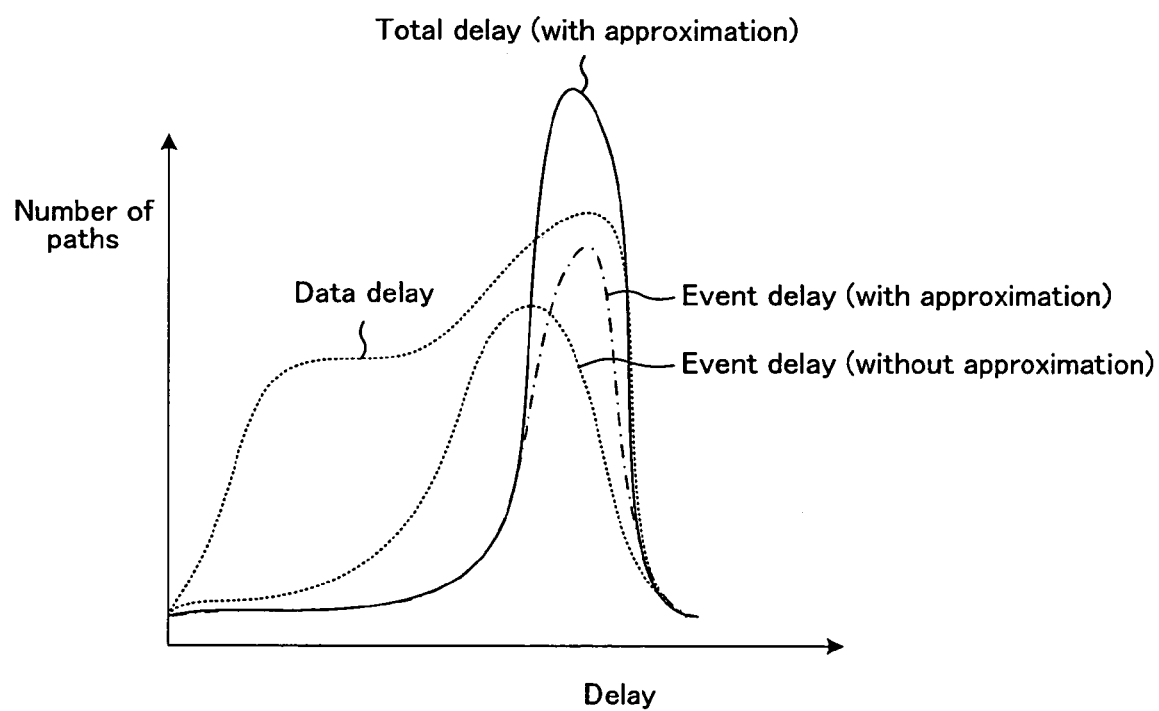
FIG. 18 shows a delay distribution of a logic circuit according to the present invention.

FIG. 18 shows delay distributions for a case where the evaluation element and the propagation element have the same internal circuit structure in a logic circuit of the present invention. The vertical axis represents the number of paths, and the horizontal axis represents the delay. The delay distribution of the event propagation path with the above approximation is more localized as compared with the delay distribution of the event propagation path without the above approximation. Therefore, the total delay distribution of the logic circuit of the present invention is also more localized. Thus, the difference between the maximum delay and the minimum delay becomes smaller.

In a logic circuit of the present invention, other advantages are further produced by adding some contrivance to the circuit components of the propagation elements and the connection configuration. Hereinafter, this feature is described with some examples.

Embodiment 8

Figure 19:
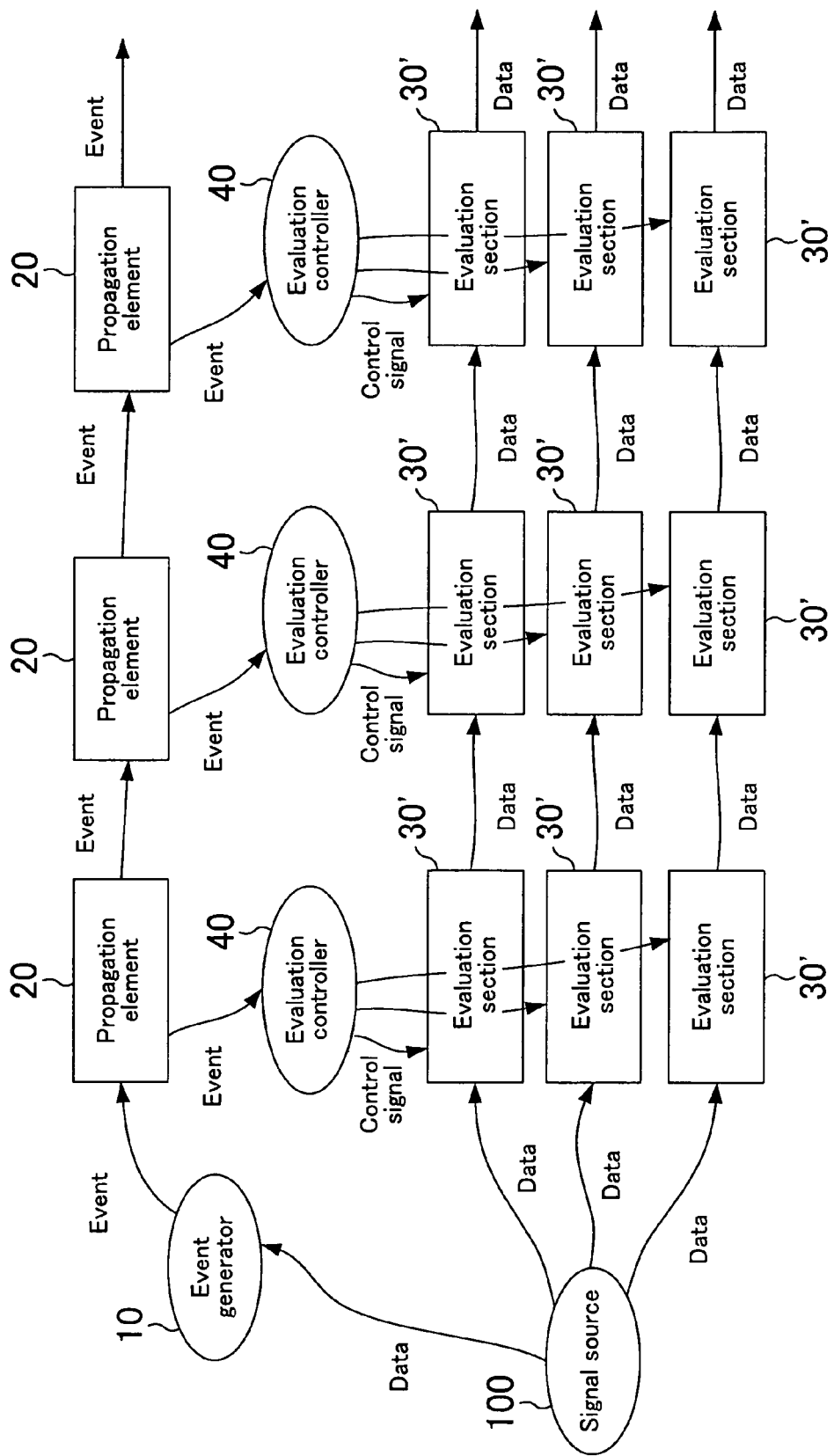
FIG. 19 shows a general structure of a logic circuit according to embodiment 8.

In the case where the circuit operation is separated into the propagation of an event which triggers a function evaluation and the propagation of data which constitutes an input in a function evaluation, the propagation element and evaluation controller need some contrivance for suppressing an overhead of a circuit and wires as much as possible. FIG. 19 shows a general structure of a logic circuit according to embodiment 8 of the present invention. In the logic circuit according to embodiment 8, a plurality of evaluation sections 30' are associated with one evaluation controller 40. In embodiment 8, one evaluation element is formed by any one of the evaluation sections 30' and an evaluation controller 40 shared by the plurality of evaluation sections 30'. Preferably, the correspondence between the propagation elements 20 and the evaluation sections 30' is based on the concept described in embodiment 6.

According to embodiment 8, the number of evaluation controllers is decreased, and the circuit area and the power consumption are decreased. It should be noted that the number of evaluation sections connected to one evaluation controller is preferably determined in consideration of an increase in delay due to the wire load, the layout efficiency, etc.

Embodiment 9

Figure 20:
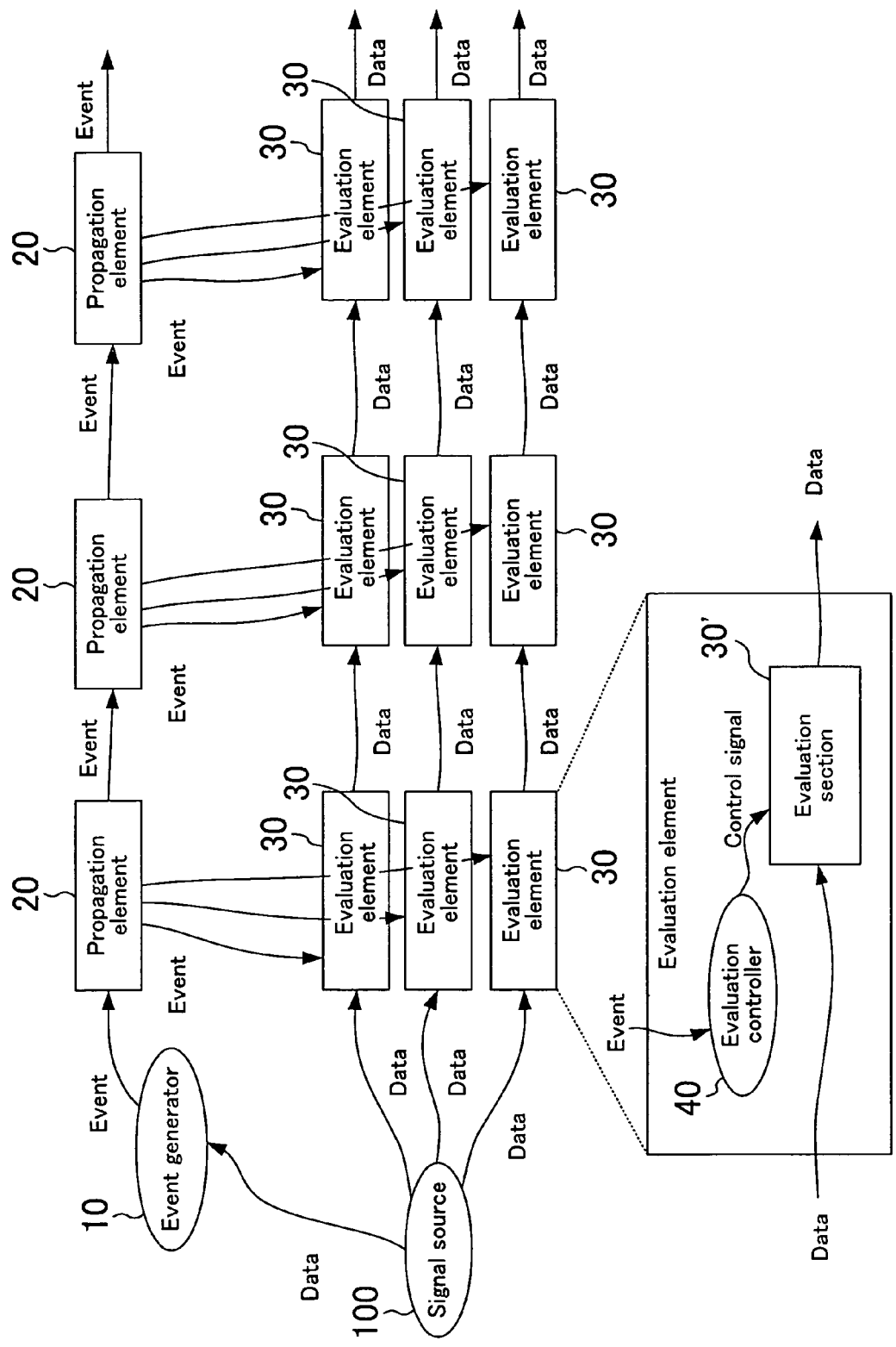
FIG. 20 shows a general structure of a logic circuit according to embodiment 9.

In the case where the circuit operation is separated into the event propagation and the data propagation, evaluation control by an event needs to be performed after arrival of valid data at an evaluation element. Thus, a timing constraint occurs between the event and the data. When a cell base design is performed for the purpose of high design efficiency, a contrivance for verifying this timing constraint by automatic designing is necessary. In view of such, evaluation controllers are associated with evaluation sections on a one-to-one basis in circuit designing in place of associating a plurality of evaluation sections with one evaluation controller (see, for example, FIG. 19). FIG. 20 shows a general structure of a logic circuit according to embodiment 9 of the present invention. Each evaluation element 30 includes an evaluation controller 40 and the evaluation section 30' shown in FIG. 19. Preferably, the correspondence between the propagation elements 20 and the evaluation elements 30 is based on the concept described in embodiment 6.

Figure 21:
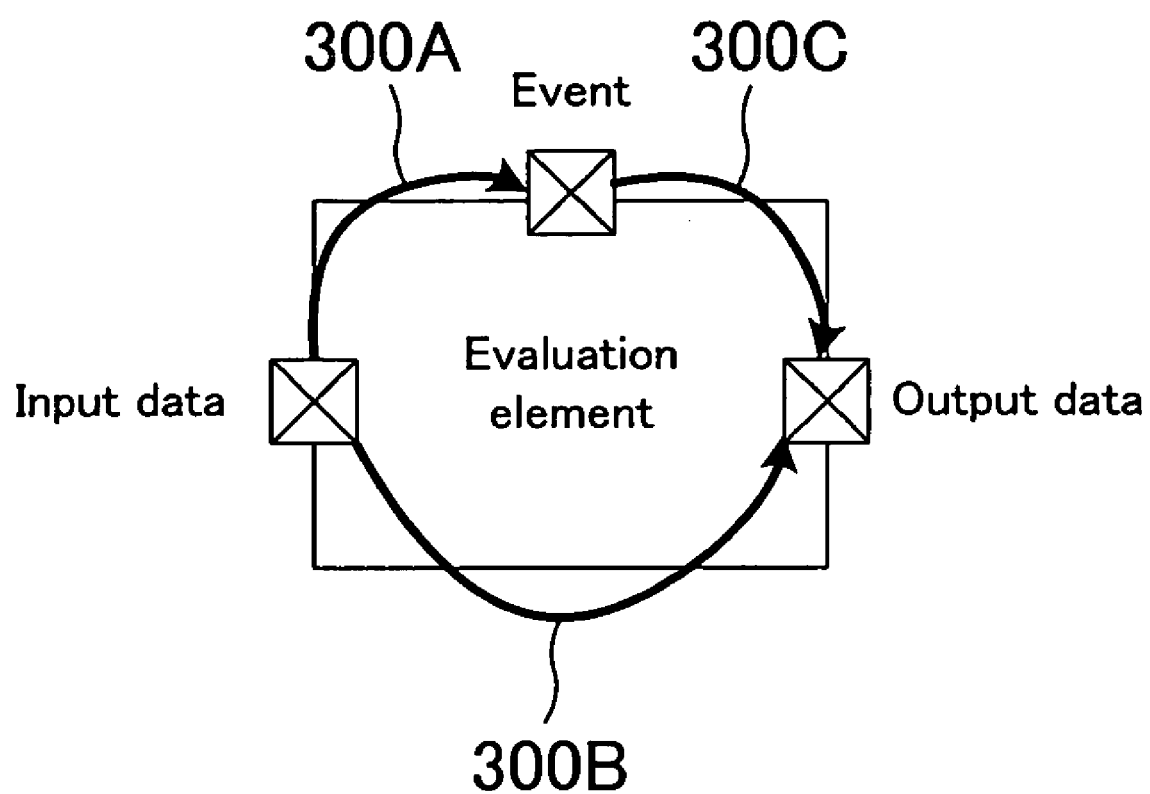
FIG. 21 illustrates a concept of a library mode of the evaluation element shown in FIG. 20.

FIG. 21 conceptually shows a library model of an evaluation element 30 according to embodiment 9. A setup/hold constraint 300A relating to data and an event, a delay 300B which starts from the input of data, and a delay 300C which starts from the input of an event are defined such that a library model of the evaluation element 30 is approximate to a sequential element, such as a flip flop, a latch, or the like. With this definition, verification with an automatic design tool is readily carried out. The design concept of a logic circuit according to embodiment 9 and the design concept of a logic circuit according to embodiment 8 are mutually contradictory.

Thus, these design concepts may be selectively used or combined in consideration of the design subject.

Embodiment 10

Figure 22:
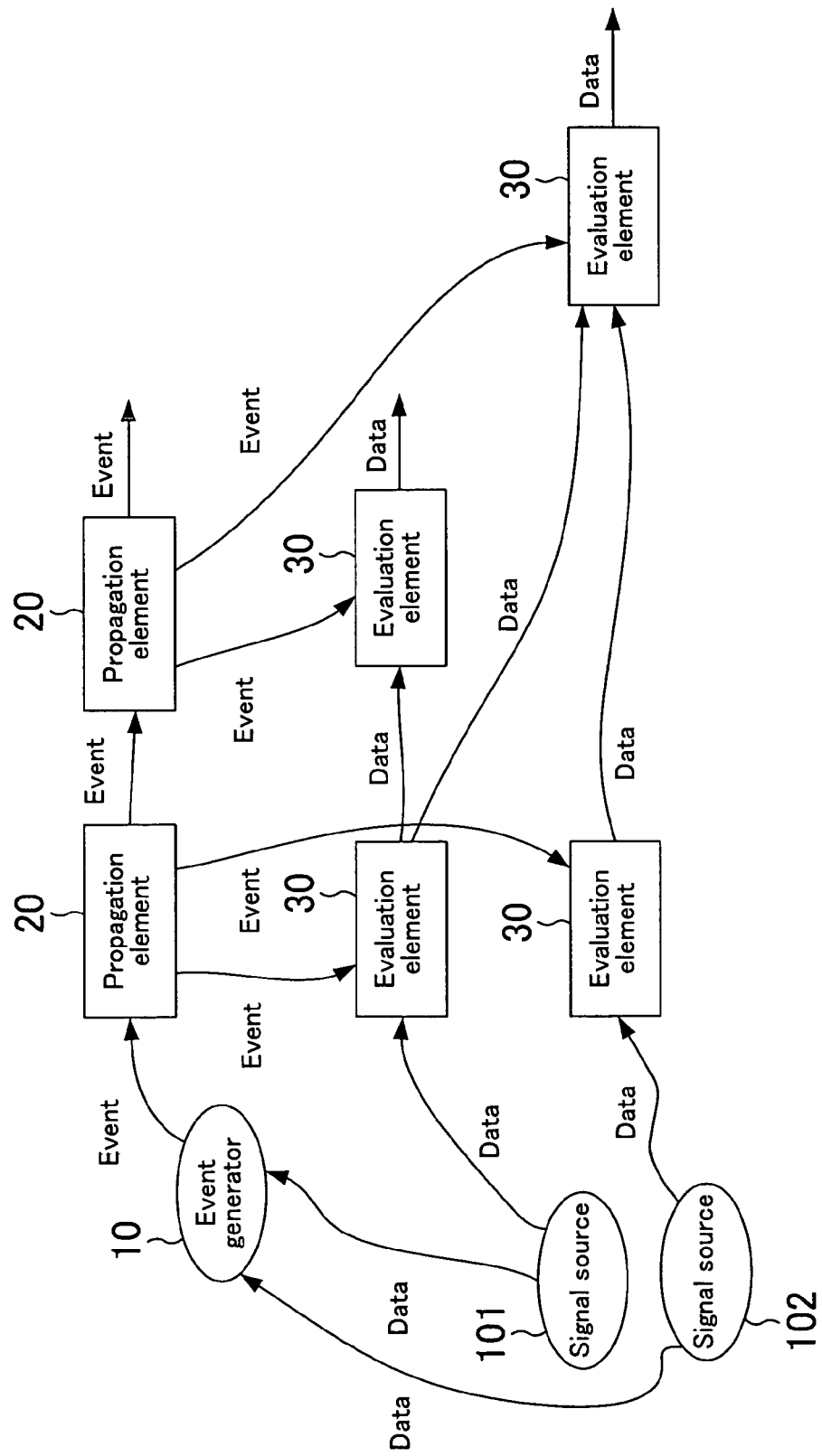
FIG. 22 shows a general structure of a logic circuit which has a possibility that an evaluation element causes an unnecessary operation.

In the case where data propagates from one evaluation element to a plurality of evaluation elements, there is a possibility that the activation yield of a circuit is increased. FIG. 22 shows a general structure of a logic circuit in which there is a possibility that an evaluation element performs an unnecessary operation. In this logic circuit, when the output of a signal source 101 is changed, an event is issued to an evaluation element 30 connected to a signal source 102. As a result, this evaluation element 30 unnecessarily operates even through the output of the signal source 102 is not changed. Accordingly, the power is wastefully consumed.

Figure 23:
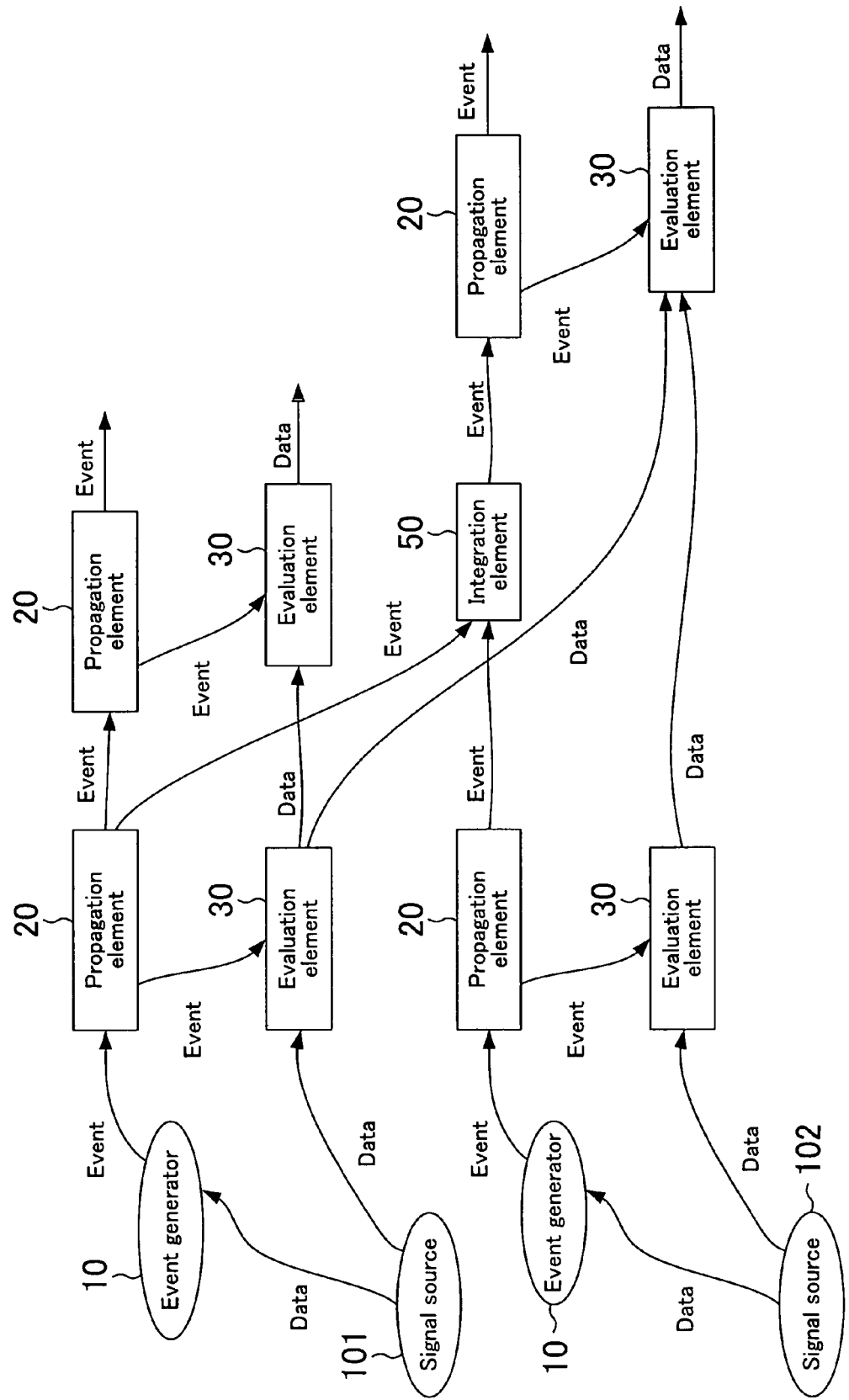
FIG. 23 shows a general structure of a logic circuit according to embodiment 10.

FIG. 23 shows a general structure of a logic circuit according to embodiment 10 of the present invention. The logic circuit of embodiment 10 includes an integration element 50 which integrates two or more events. Events generated by output variations of the signal sources 101 and 102 are input to the integration element 50 and output as a new event. The event generated by the output variation of the signal source 101 is not supplied to the evaluation element 30 connected to the signal source 102. Thus, this evaluation element 30 does not operate unnecessarily.

In the logic circuit according to embodiment 10, there is a possibility that, as the number of propagation elements 20 and integration elements 50 increases, the number of circuit components and wires is increased, or the layout efficiency deteriorates. The design concept of a logic circuit according to embodiment 10 and the design concept of the logic circuit of FIG. 22 are mutually contradictory. Thus, these design concepts may be selectively used or combined in consideration of the design subject.

Embodiment 11

Where an event signal, which is the substantial part of an event, is defined such that the initial state of an event is logic level "Hi (high)" and transition of the logic level from "Hi" to "Lo (low)" means generation of an event, the event signal has to be returned to the initial state, i.e., logic level "Hi", at any timing after generation of an event. A clock can be used for such an initialization of an event but is undesirable because the power consumption increases due to clock load. In view of such, initialization of an event which does not depend on the clock is considered.

Figure 24:
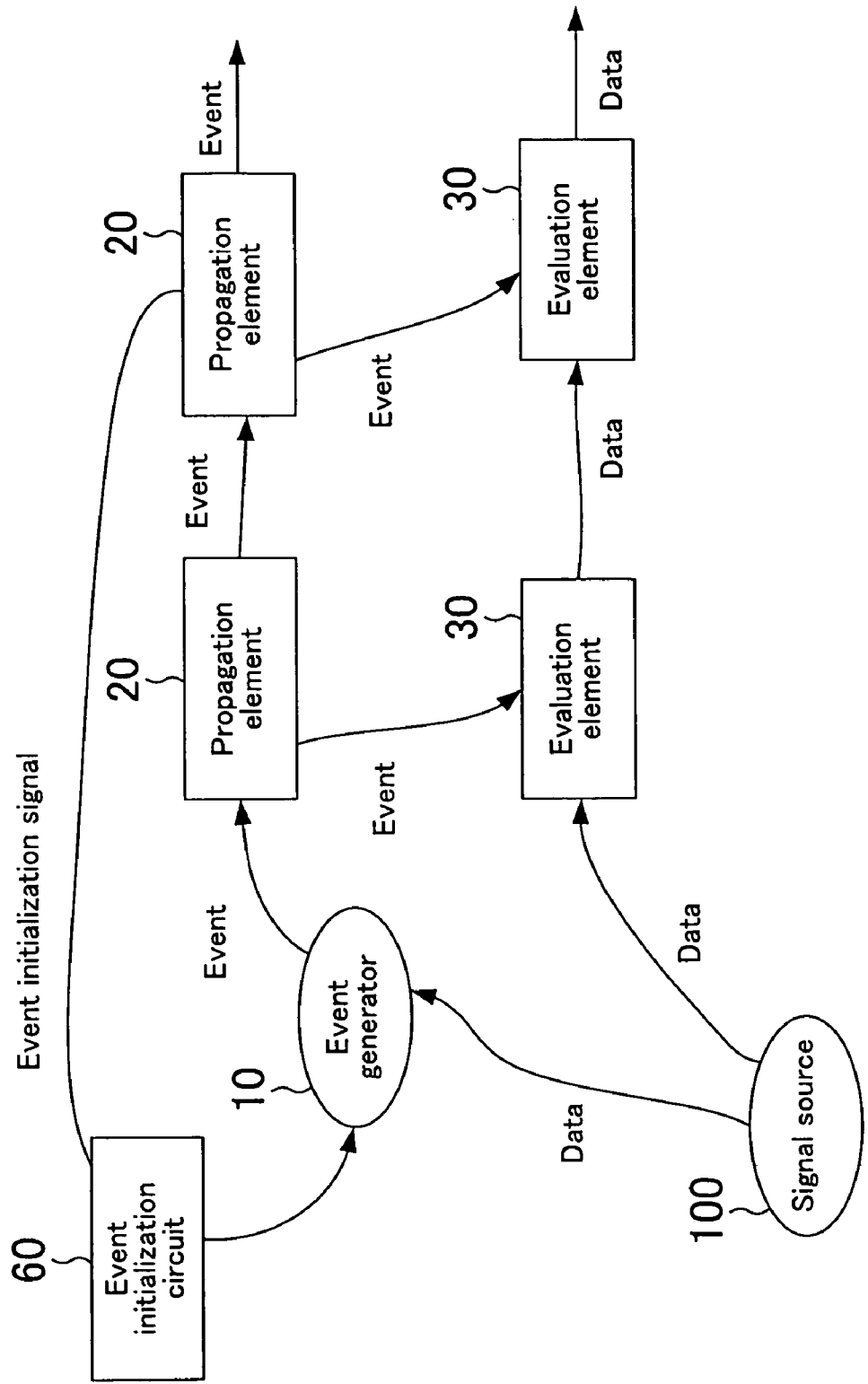
FIG. 24 shows a general structure of a logic circuit according to embodiment 11.

FIG. 24 shows a general structure of a logic circuit according to embodiment 11 of the present invention. The logic circuit of embodiment 11 includes an event initialization circuit 60. The event initialization circuit 60 receives an event initialization signal from any of propagation elements 20 to initialize an event generated by an event generator 10.

Figure 25:
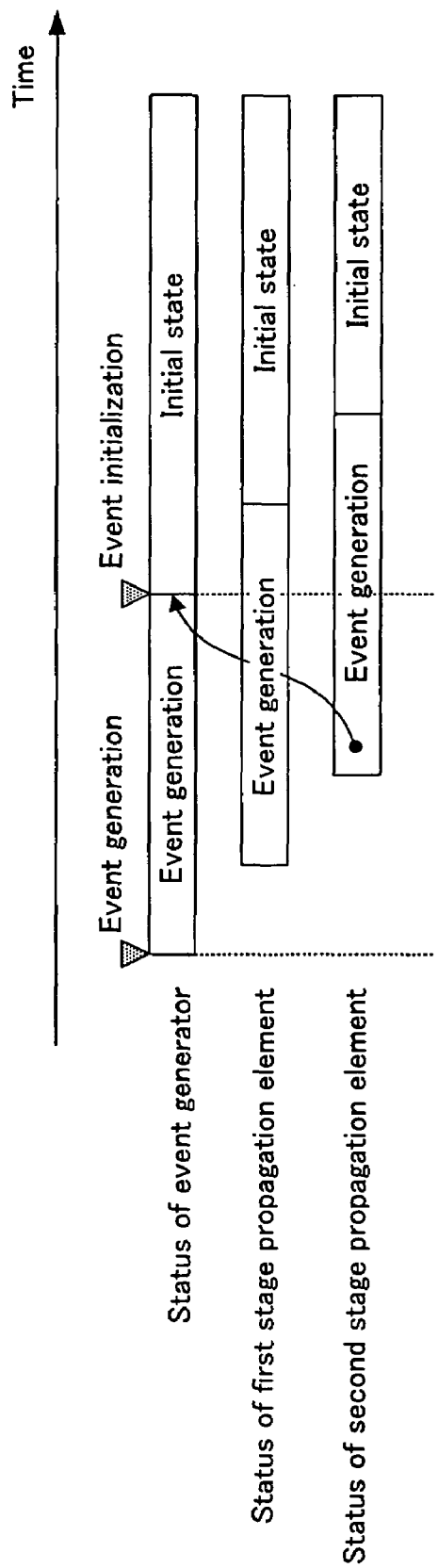
FIG. 25 is a timing chart of the logic circuit shown in FIG. 24.

FIG. 25 is a timing chart of the logic circuit according to embodiment 11. Receiving an event initialization signal from a propagation element 20 at the second stage, the event initialization circuit 60 initializes the event generated by the event generator 10. Thus, a handshake operation of the propagation element 20 and the event generator 10 enables the asynchronous operation of initializing an event after completion of propagation of the event. As a result, the power consumption of the circuit decreases.

The event initialization circuit 60 may receive an event initialization signal from the propagation element 20 of the first stage. An event output from a propagation element 20 may be used as an event initialization signal.

Embodiment 12

Figure 26:
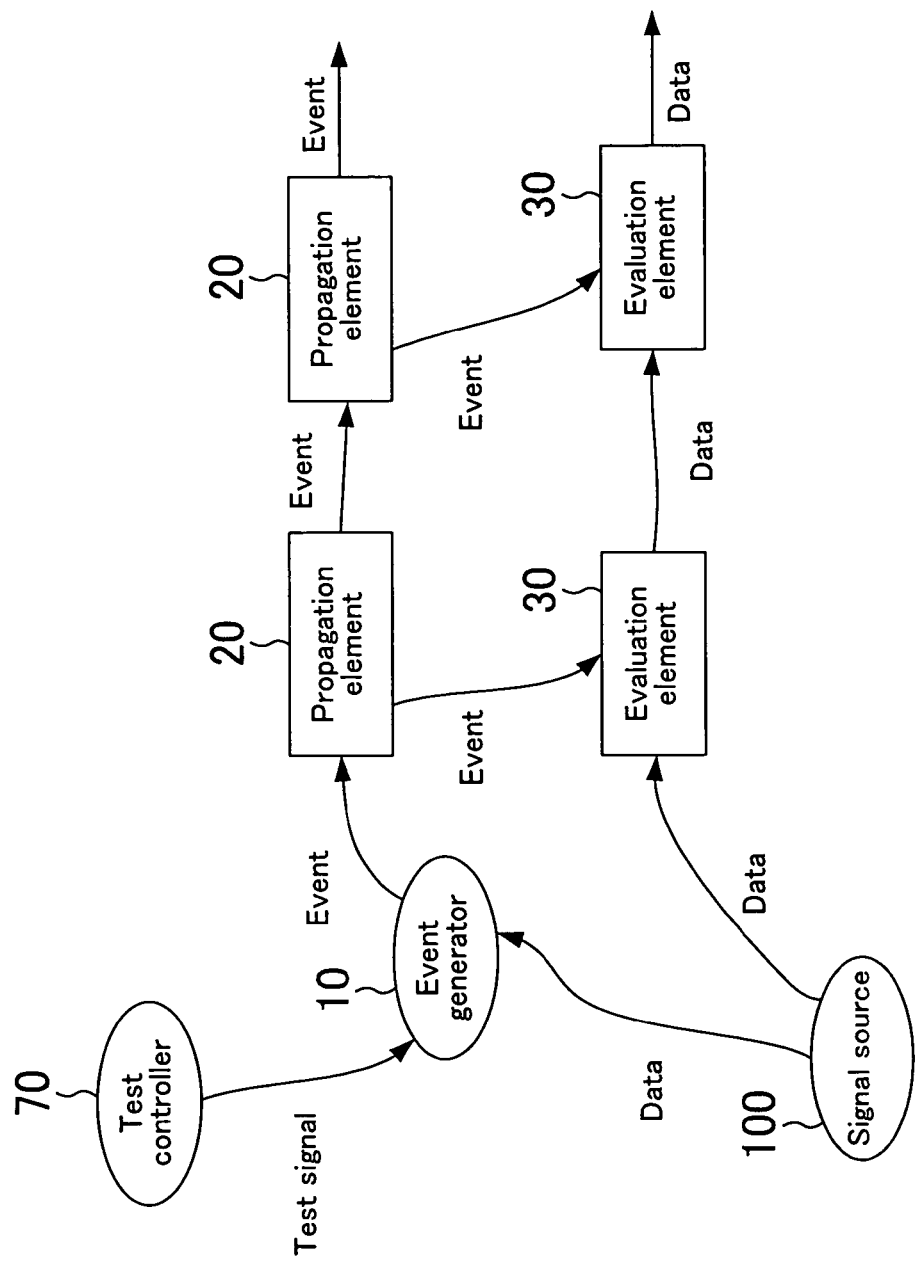
FIG. 26 shows a general structure of a logic circuit according to embodiment 12.

When a malfunction occurs in an event generator, there is a possibility that an event is not generated even when the output of a signal source is changed, and a logic circuit does not operate. In view of such, determinability as to whether or not the event generator normally operates is considered. FIG. 26 shows a general structure of a logic circuit according to embodiment 12 of the present invention. The logic circuit of embodiment 12 includes a test controller 70. The test controller 70 outputs a test signal to the event generator 10. Receiving the test signal, the event generator 10 generates an event irrespective of whether or not the output of the signal source 100 is changed. With this structure, it can be determined whether or not the event generator 10 can normally generates an event.

Embodiment 13

In general, in a dynamic circuit typified by a domino circuit, evaluation control has to be performed for preventing a through current during a precharge period. Specifically, a device for evaluation control is connected in series to an evaluation logic circuit which performs evaluation of input data, whereby a through current flow is prevented. However, it is desirable to omit the evaluation control device so long as evaluation control is unnecessary because the delay is increased by performing evaluation control.

Figure 27:
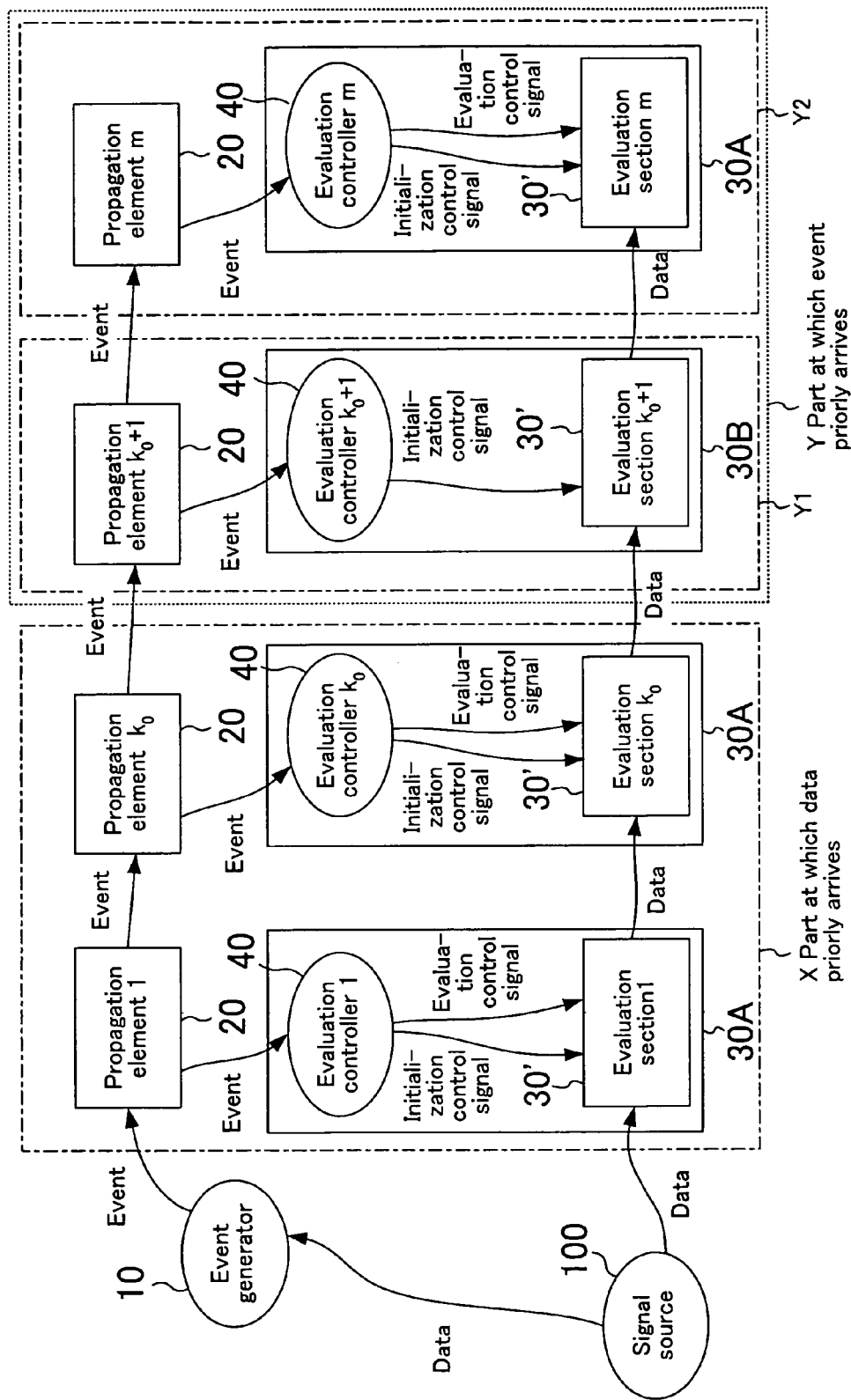
FIG. 27 shows a general structure of a logic circuit according to embodiment 13.

FIG. 27 shows a general structure of a logic circuit according to embodiment 13 of the present invention. As previously described, in a logic circuit of the present invention, data arrives at each evaluation element 30 prior to an event until a certain point ($k_0$th stage) because of the delay caused by the event generator 10. However, the event arrives prior to the data after the $k_0$th stage. At the ($k_0$+1)th and subsequent stages, an event arrives after input data enters the initial state in some cases, but an event arrives before input data enters the initial state in other cases. Therefore, as illustrated in FIG. 27, a logic circuit of the present invention can be separated into part X where data priority arrives and part Y where an event priority arrives. Part Y, where an event priority arrives, can be further separated into part Y1 where input data initialization is prior to event arrival and part Y2 where event arrival is prior to input data initialization.

Figure 28:
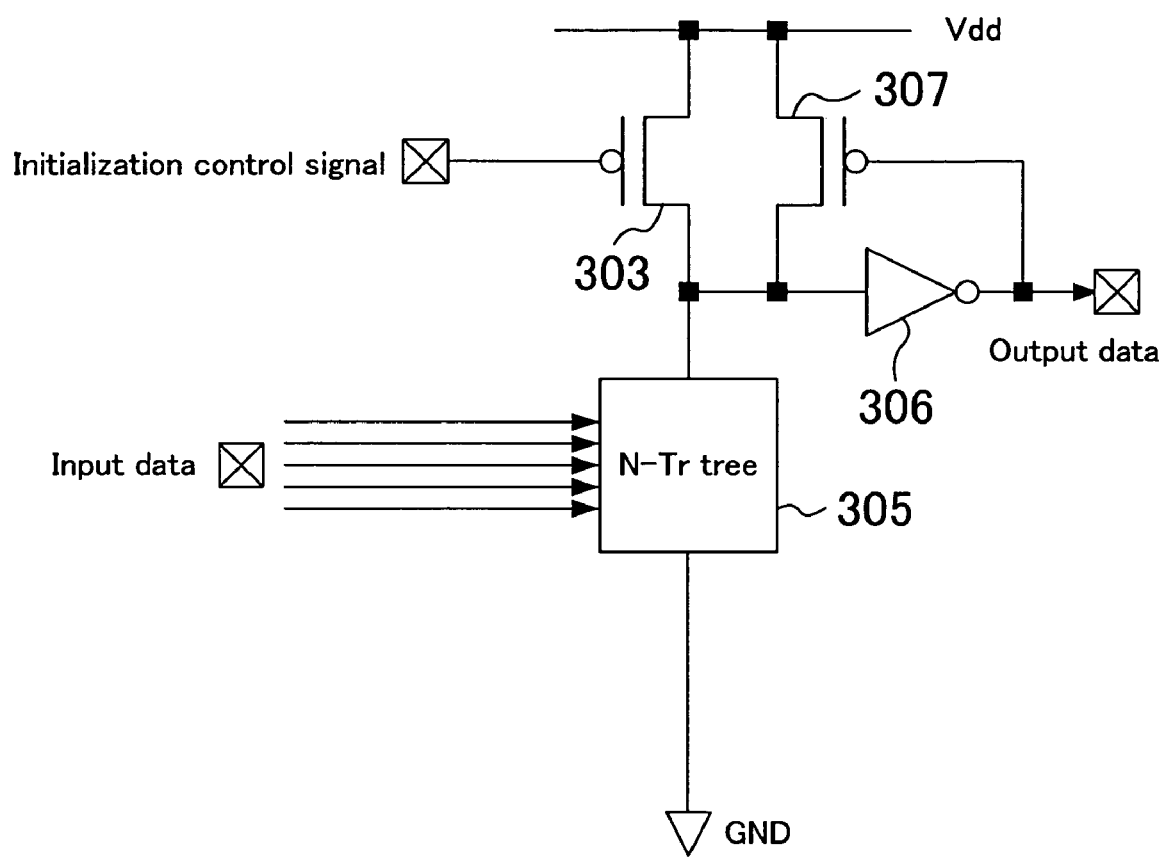
FIG. 28 shows a circuit structure of an evaluation element belonging to a portion at which an event priority arrives in the structure shown in FIG. 27.

To prevent a through current flow, evaluation elements 30A belonging to part X and part Y2 (hereinafter, referred to as "type-I evaluation elements") receive an evaluation control signal at an evaluation section 30' from an evaluation controller 40 to perform evaluation control, for example, as does the evaluation element illustrated in FIG. 7. On the other hand, in evaluation elements 30B belonging to part Y1 (hereinafter, referred to as "type-II evaluation elements"), input data is initialized before arrival of an event, and a precharge is completed before arrival of data. Therefore, no through current flows even when evaluation control is not performed. FIG. 28 shows a circuit structure of the evaluation element 30B. It should be noted that the evaluation controller is not shown. In the evaluation element 30B, a device for performing evaluation control is omitted.

The type of evaluation elements may be determined according to a method described below. As for an evaluation element at the pth stage (p is a natural number) counted from the first stage evaluation element, the following relationship holds when p=1:

$$Tdt[p]<Tev[p]$$

where Tdt[p] is the determination time of output data, and Tev[p] is the start time of evaluation control. It should be noted that, in some cases, the delay is ameliorated due to the circuit structure of the event generator 10 so that the relationship of Tdt[p]<Tev[p] (p=1) does not hold. However, the above relationship is given herein on an assumption that the delay in the event generator 10 is the worst. When p≧2, the following relationships hold:

$$Tdtp[p]<Tev[p], \text{ and}$$

$$Tdtp[p]<Tdt[p]$$

where Tdtp[p] is the input data arrival time after precharge. Where p≧2, if the relationship of Tev[p], Tdt[p] and Tdtp[p] is Tdt[p]≦Tev[p] or Tev[p]≦Tdtp[p], a type-I evaluation element is selected. If the relationship of Tev[p], Tdt[p] and Tdtp[p] is Tdtp[p]<Tev[p]<Tdt[p], a type-II evaluation element is selected.

Figure 29:
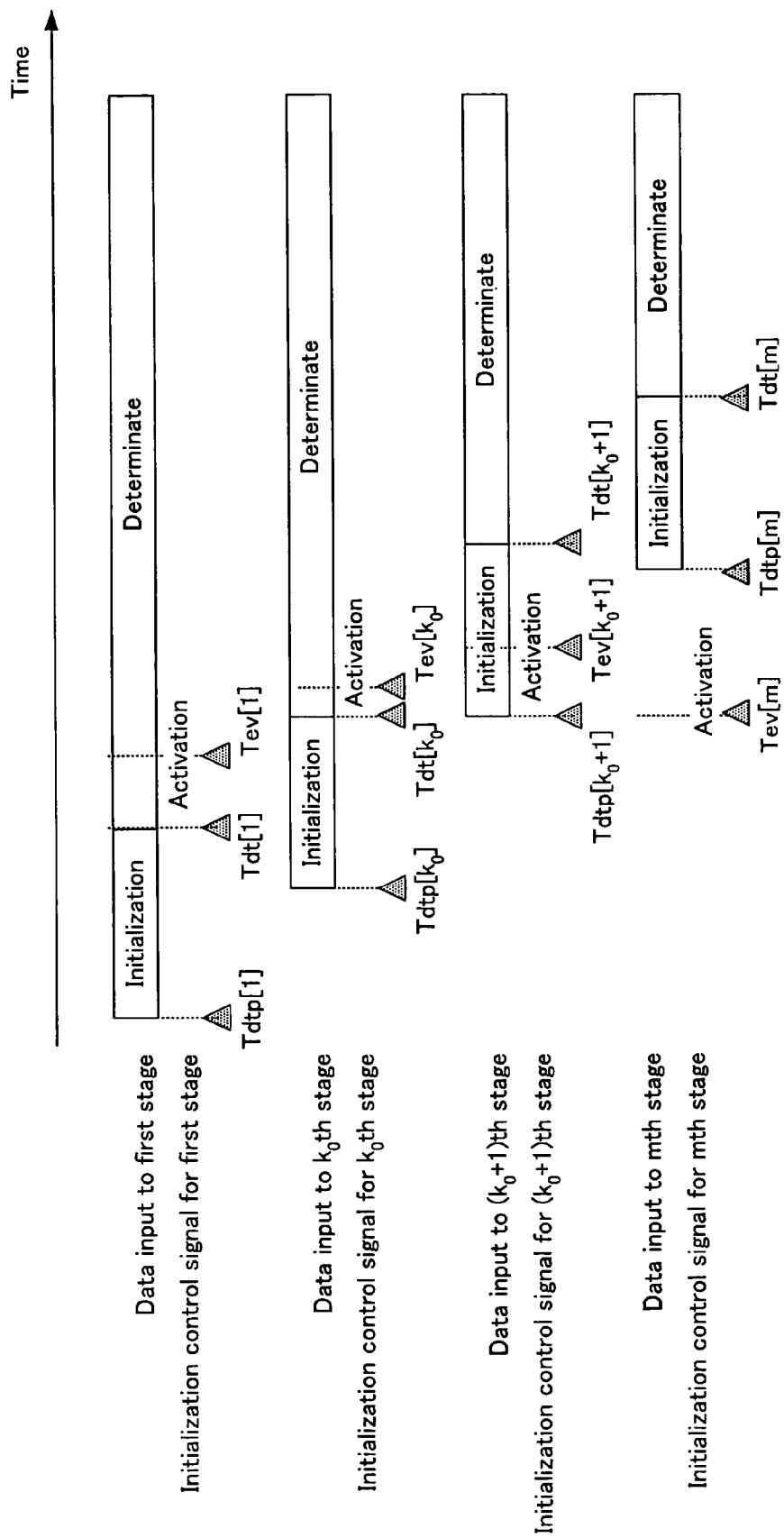
FIG. 29 is a timing chart of a logic circuit shown in FIG. 27.

FIG. 29 is a timing chart of a logic circuit according to embodiment 13. Until the $k_0$th stage, data arrives at an evaluation element prior to an event. As for an evaluation element belonging to part Y2 where event arrival is prior to input data initialization at the ($k_0$+1)th and subsequent stages (in this example, the evaluation element of the mth stage), initialization of input data is not yet performed when an event arrives. However, since evaluation control is effective, no through current flows even when a path for a through current is formed by input data and precharge is performed.

On the other hand, as for an evaluation element belonging to part Y1 where input data initialization is prior to event arrival at the ($k_0$+1)th and subsequent stages (in this example, the evaluation element of the ($k_0$+1)th stage), an event arrived prior to data, and the input data has been initialized before the event arrives. Thus, a precharge is performed between data initialization and data arrival, and data which arrives after the precharge is evaluated. Therefore, no through current flows even in this case.

Thus, according to embodiment 13, an evaluation control device is omitted from part of evaluation elements which constitute a logic circuit, and accordingly, an increase in delay is suppressed. In addition, the circuit scale of the logic circuit is further reduced.

Embodiment 14

Figure 30:
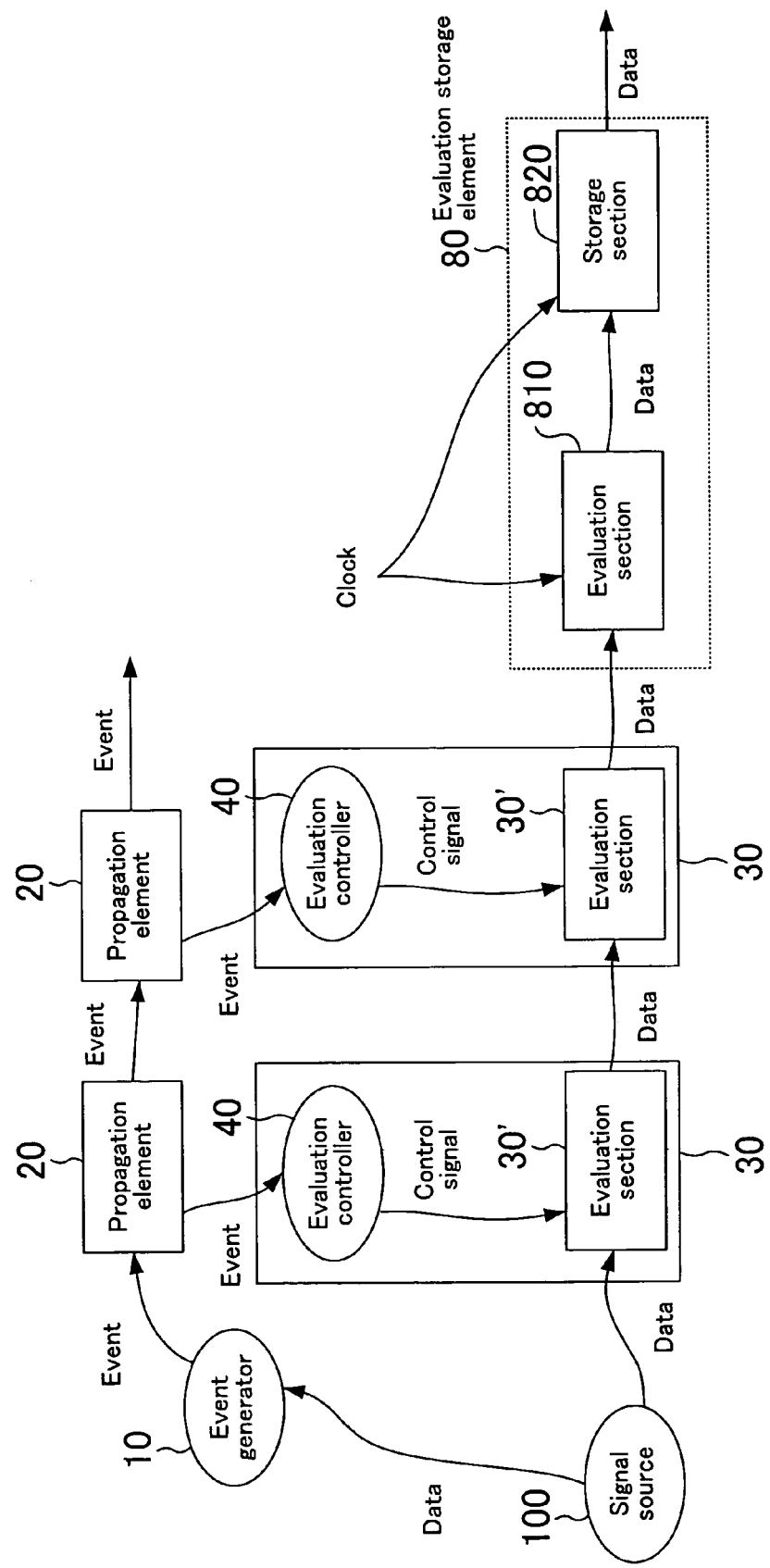
FIG. 30 shows a general structure of a logic circuit according to embodiment 14.

In general, in an adder, or the like, an inversion logic, typified by an exclusive logical sum (XOR), is necessary at the final stage. In view of such, realizing an inversion logic by a logic circuit of the present invention is considered. FIG. 30 shows a general structure of a logic circuit according to embodiment 14 of the present invention. The logic circuit of embodiment 14 includes an evaluation storage element 80 at the final stage of data propagation. The evaluation storage element 80 includes an evaluation section 810 and a storage section 820.

Figure 31:
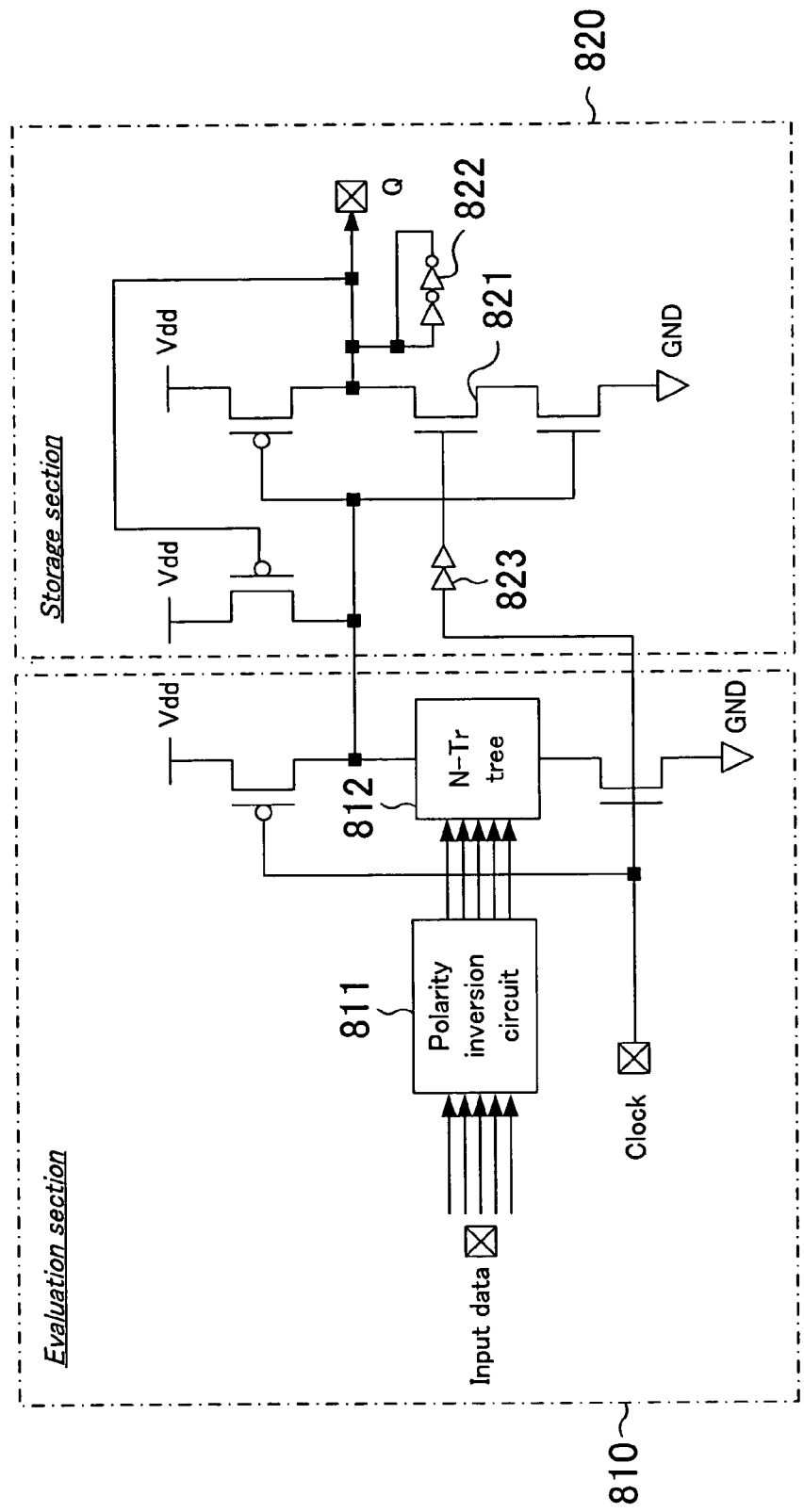
FIG. 31 shows a circuit structure of an evaluation storage element shown in FIG. 30.

FIG. 31 shows a circuit structure of the evaluation storage element 80. The evaluation section 810 is a dynamic circuit which includes a polarity inversion circuit 811 for outputting a polarity inverse or polarity non-inverse of an input and an evaluation logic circuit 812 for performing a logical operation on the output of the polarity inversion circuit 811. The polarity inversion circuit 811 and the evaluation logic circuit 812 calculate an exclusive logical sum of an input data. The storage section 820 includes a pull-down control device 821 provided in a pull-down path of a static gate (e.g., an inverter) of the dynamic circuit and a storage circuit 822 for storing output data.

Both the evaluation section 810 and the storage section 820 are controlled based on a clock which is different from an event. When the logic level of the clock is "Lo", the evaluation section 810 is precharged. When the logic level of the clock is "Hi", evaluation control is performed. During a precharge period, the pull-down control device 821 of the storage section 820 is off, and therefore, the output data is maintained at the state held before precharge. During an evaluation period, the pull-down control device 821 is on, so that the output data is updated. It is preferable that the pull-down control device 821 is turned on slightly after an evaluation result is determined by the evaluation section 810. Thus, the storage section 820 has a buffer 823.

Figure 32:
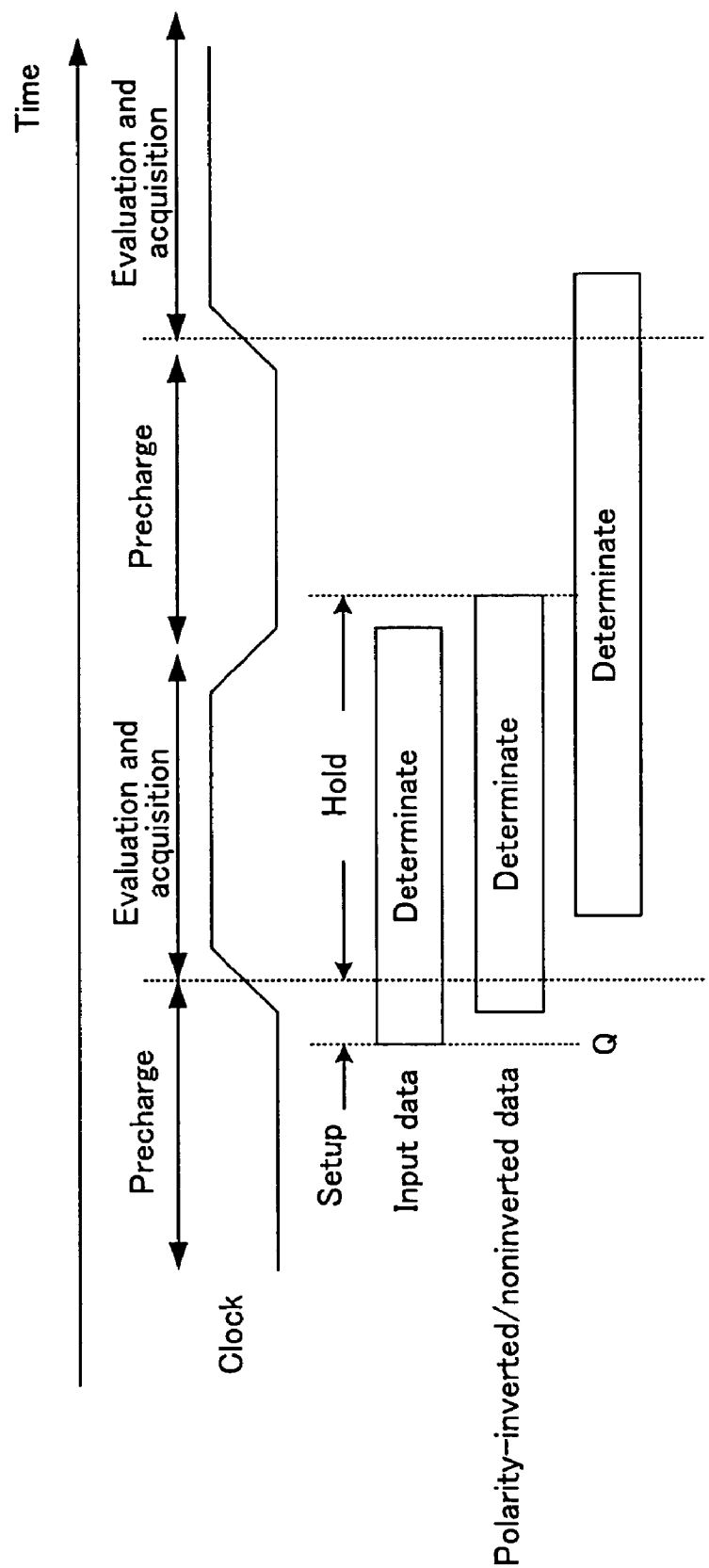
FIG. 32 is a timing chart of the evaluation storage element shown in FIG. 30.

FIG. 32 is a timing chart of an evaluation storage element according to embodiment 14. The evaluation storage element 80 substantially functions as a register which has a logical evaluation function. Thus, the operation of the evaluation storage element 80 includes a setup constraint with respect to a rising edge of the clock. In the structure of the evaluation storage element 80 shown in FIG. 31, the evaluation section 810 performs an evaluation operation all the time during the period when the clock is at logic level "Hi". Thus, the operation of the evaluation storage element 80 includes a data hold constraint with respect to a falling edge of the clock.

Thus, according to embodiment 14, a logic for realizing an exclusive logical sum is constructed, and therefore, a logic circuit, such as an adder, or the like, is realized.

Embodiment 15

Since the evaluation storage element 80 of embodiment 14 has a data hold constraint as illustrated in FIG. 32, the input data has to be determinate for a half of one clock period. When the minimum delay of input data is not equal to or longer than a half clock period, the hold constraint cannot be satisfied. However, in general, the clock period is changed according to the use, and therefore, in the case of the evaluation storage element 80 of embodiment 14, the operation frequency is restricted. In view of such, relaxation of the timing constraint of the evaluation storage element is considered.

Figure 33:
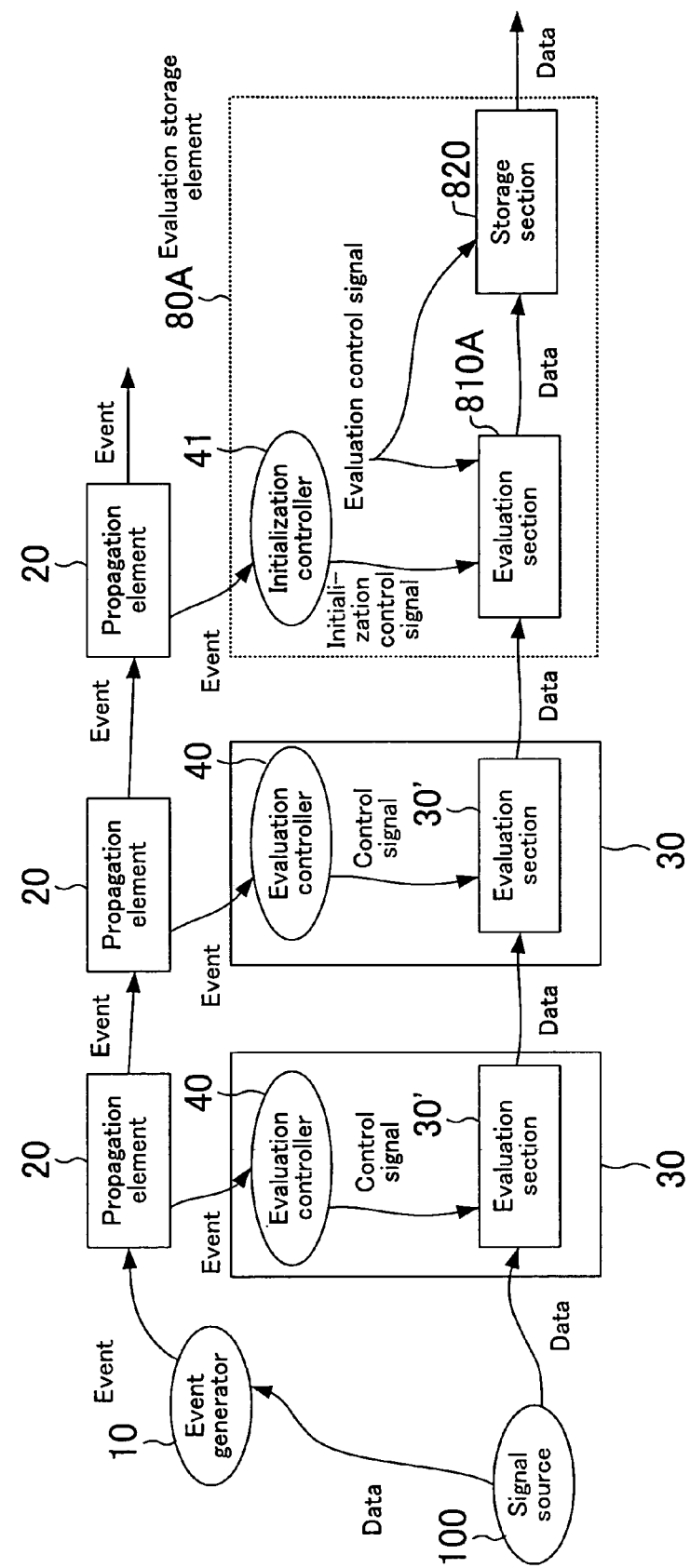
FIG. 33 shows a general structure of a logic circuit according to embodiment 15.

FIG. 33 shows a general structure of a logic circuit according to embodiment 15 of the present invention. In the logic circuit of embodiment 15, an evaluation storage element 80A includes an initialization controller 41, an evaluation section 810A, and a storage section 820. The initialization controller 41 has the same structure as that of the evaluation controller 40. When receiving an event from a corresponding propagation element 20, the initialization controller 41 outputs an initialization control signal.

Figure 34:
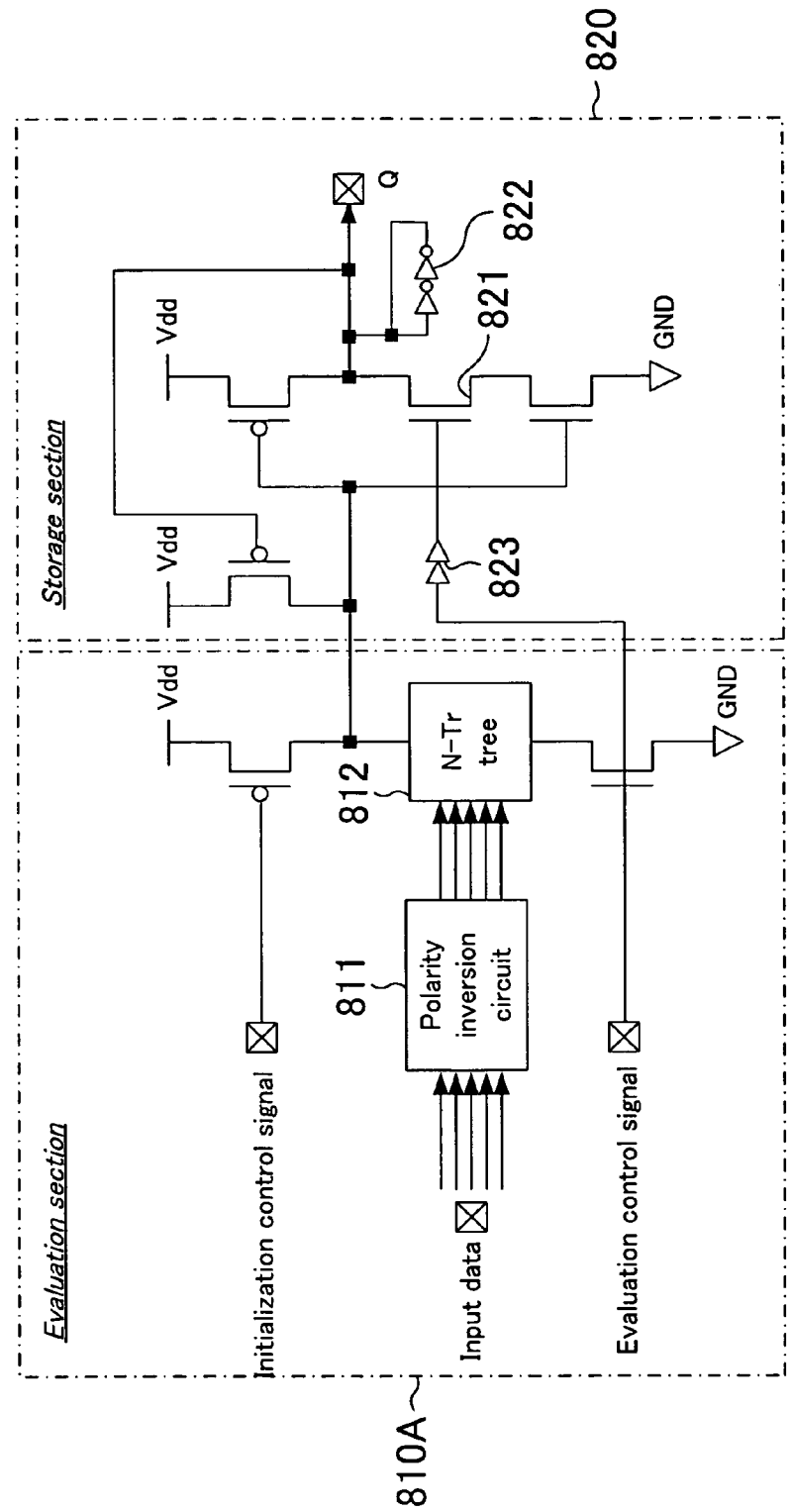
FIG. 34 shows a circuit structure of an evaluation storage element shown in FIG. 33.

FIG. 34 shows a circuit structure of the evaluation storage element 80A. An evaluation section 810A performs a precharge operation according to the initialization control signal output from the initialization controller 41 and, in the meantime, performs an evaluation operation according to a given evaluation control signal. A pull-down control device 821 of the storage section 820 operates according to a signal generated by slightly delaying the evaluation control signal by a buffer 823.

Figure 35:
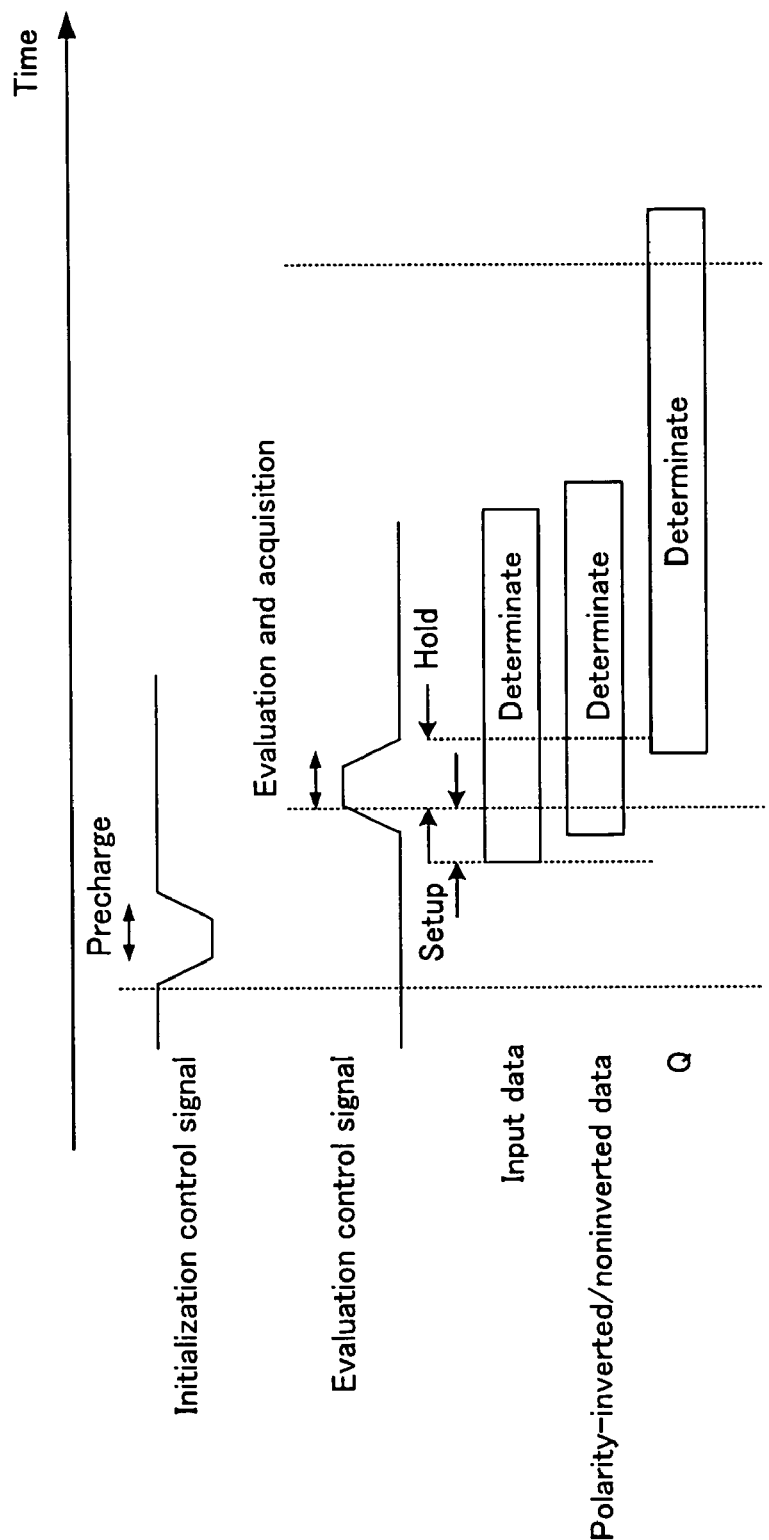
FIG. 35 is a timing chart of the evaluation storage element shown in FIG. 33.

FIG. 35 is a timing chart of an evaluation storage element according to embodiment 15. The evaluation control signal is independent of the initialization control signal and has an arbitrary active period (in this example, logic level "Hi"). In the case where the active period of the evaluation control signal is set short, the evaluation section 810A, which performs an evaluation operation in response to activation of the evaluation control signal, does not have a hold constraint with respect to a falling edge of the evaluation control signal.

Thus, according to embodiment 15, the timing constraint between the precharge control and the evaluation control associated with an evaluation storage element is relaxed.

Embodiment 16

In general, in a static circuit typified by a CMOS circuit, the logical value of data corresponds to the logic level on a single data line. For example, when the logic level is "Hi", the logical value is "1", and when the logic level is "Lo", the logical value is "0". Thus, the logic level on the data line transitions non-monotonically from "Lo" to "Hi" and from "Hi" to "Lo". On the other hand, in a dynamic circuit typified by a domino circuit, a data line exists with correspondence to the logical value of data. The logic level of each data line always starts with the initial state (for example, logic level "Lo") and transitions monotonically from "Lo" to "Hi". Therefore, in order to construct all the logics including inversion logics by dynamic circuits, positive and negative signals and circuits corresponding to these signals are necessary as in a dual-rail structure. Thus, part of the advantages achieved by the dynamic circuit is lost. In view of such, application of a single-rail structure to a logic circuit of the present invention is considered.

Figure 36:
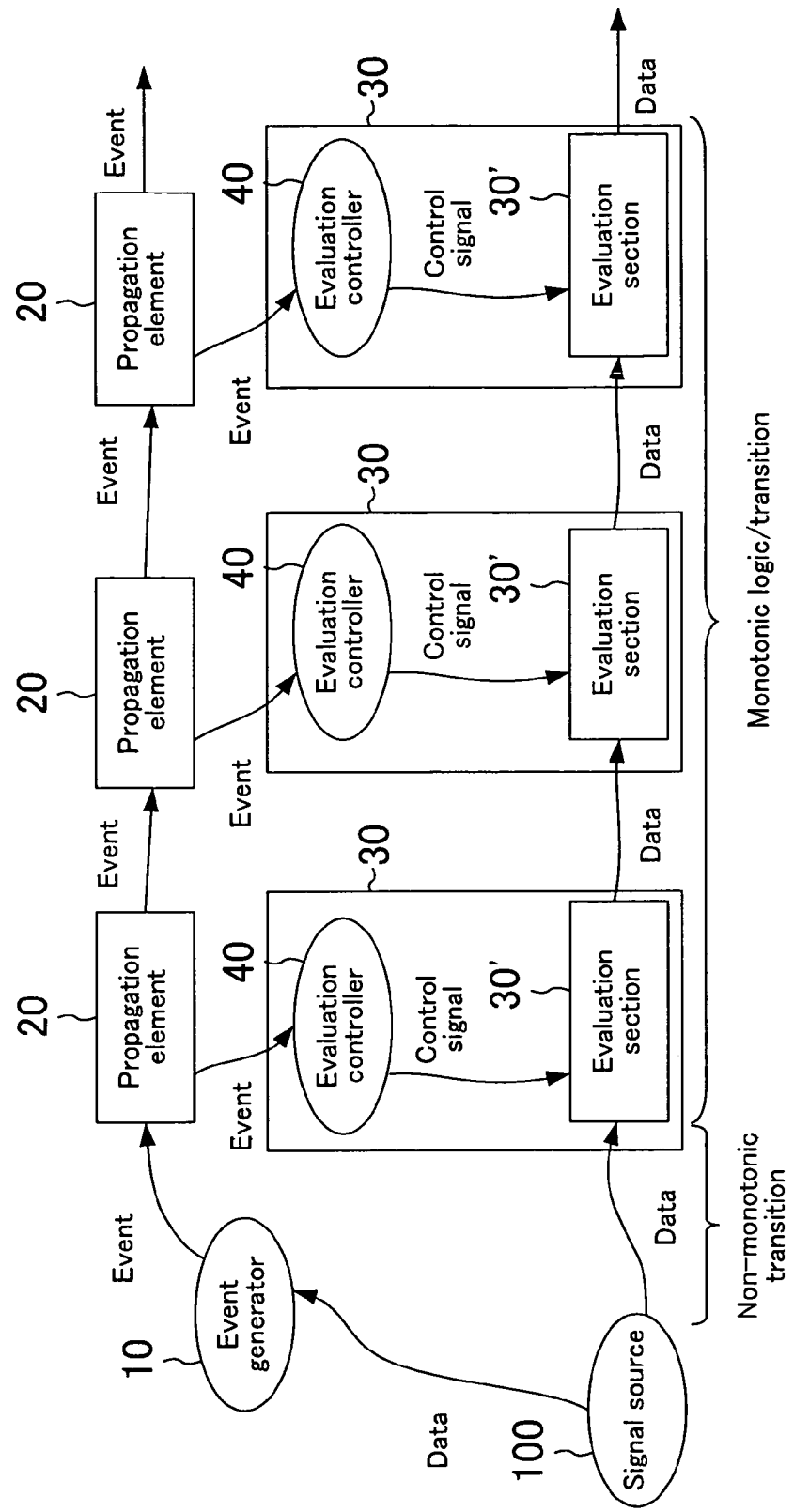
FIG. 36 shows a general structure of a logic circuit according to embodiment 16.

FIG. 36 shows a general structure of a logic circuit according to embodiment 16 of the present invention. In the logic circuit of embodiment 16, data output from a signal source 100 to the first stage evaluation element 30 is based on the non-monotonic transition logic, while data residing in and data propagating through the evaluation elements 30 at the second and subsequent stages are based on the monotonic transition logic. With this structure, the inversion logic is realized in the first stage evaluation element 30, and a logic of a disjunctive canonical form can be constructed.

Figure 37:
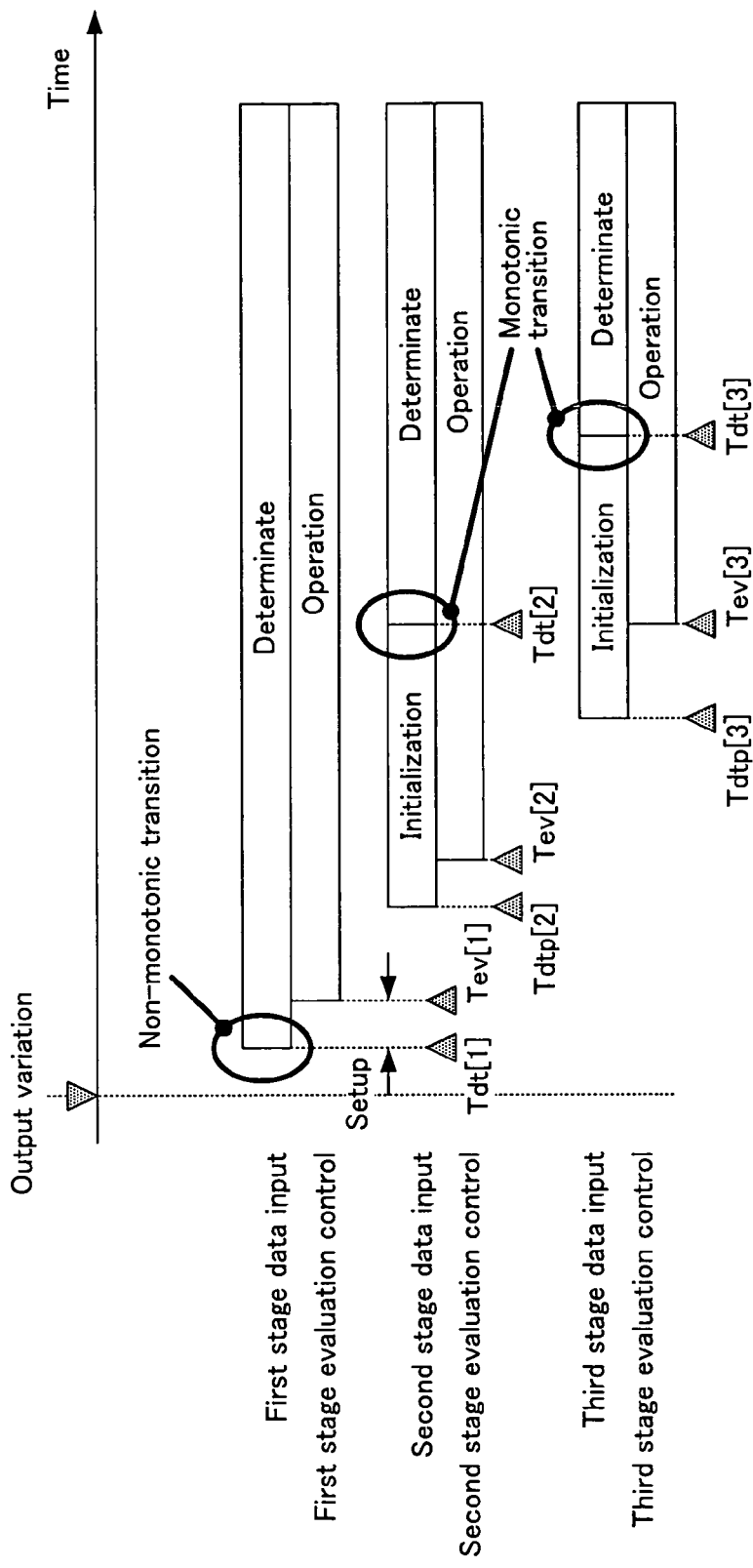
FIG. 37 is a timing chart of the logic circuit shown in FIG. 36.

FIG. 37 is a timing chart of the logic circuit of embodiment 16. At the first stage evaluation element 30, after input data is determined, a sufficient setup is secured, and then, evaluation control is performed. Since input data are based on the monotonic transition logic in the evaluation elements 30 at the second and subsequent stages, evaluation control is performed after a sufficient setup is secured with respect to the initial value of the input data. Variables shown in FIG. 37 are the same as those described in embodiment 13.

Thus, according to embodiment 16, all the logics including inversion logics can be expressed while maintaining the single-rail structure. Therefore, the increase in the number of data lines and circuits is suppressed, and the advantages achieved by the dynamic circuit are fully utilized.

Embodiment 17

In the logic circuit shown in FIG. 36, when the positive output and negative output of the flip flop are used as the signal source 100, the first stage evaluation element 30 needs to secure a sufficient setup for input data before evaluation. In general, in the case where such a setup is secured, a margin has to be set in consideration of clock skew, waveform blunting, etc. However, this is undesirable in view of the speed specification. Therefore, for the purpose of reducing such a margin, it is desirable to use, as a circuit for outputting data to the first stage evaluation element 30, a circuit of a monotonic transition which is based on a dual-rail logic having both positive and negative outputs. However, in such a circuit, detection of a variation in the output is difficult because the initial state is restored every time the output is updated, which is a difference from a flip flop. In view of such, we put a focus on the evaluation element of the final stage, which will be a new signal source, in the logic circuit of the present invention and consider constructing a circuit with a combination of the final stage evaluation element and an event generator which uses the final stage evaluation element as a signal source.

Figure 38:
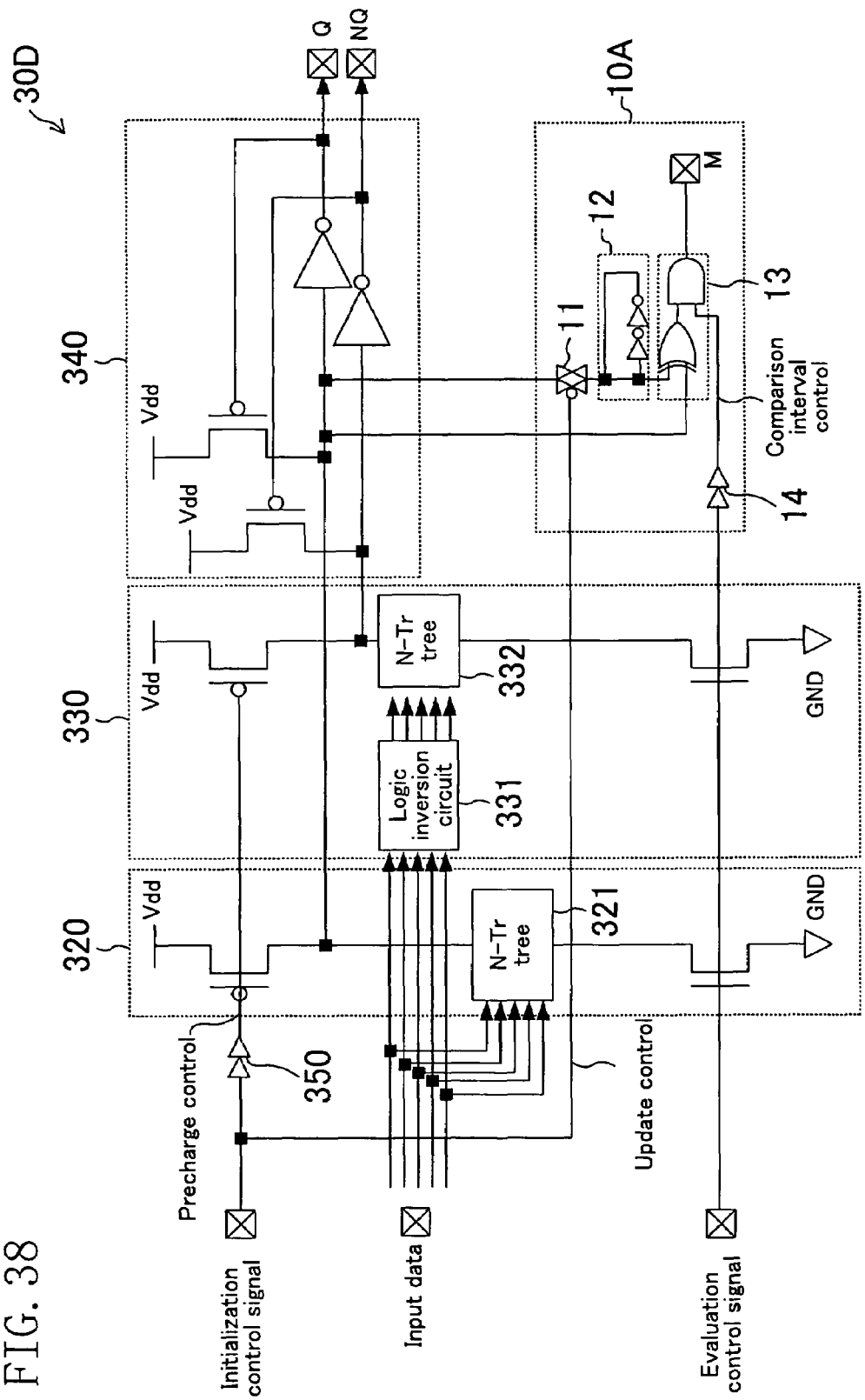
FIG. 38 shows a circuit structure of an evaluation element according to embodiment 17.

FIG. 38 shows a circuit structure of an evaluation element according to embodiment 17 of the present invention. It should be noted that the evaluation controller is not shown. An evaluation element 30D includes a positive logic evaluation section 320, a negative logic evaluation section 330, a static gate 340 (e.g., an inverter), and an event generator 10A. The positive logic evaluation section 320 has an evaluation logic circuit 321 which performs a logical evaluation of input data. The negative logic evaluation section 330 includes a logic inversion circuit 331 which performs logical inversion of input data and an evaluation logic circuit 332 which performs a logical evaluation of the data inverted by the logic inversion circuit 331. The event generator 10A includes a gate circuit 11, a storage circuit 12, and an interval comparison circuit 13. The storage circuit 12 stores the output of the evaluation element 30D immediately before a precharge. The interval comparison circuit 13 compares the output of the evaluation element 30D which is stored in the storage circuit 12 and the output of the evaluation element 30D which is obtained after evaluation control to detect whether or not a variation has been caused in the output.

The positive logic evaluation section 320 and the negative logic evaluation section 330 are precharge-controlled according to an initialization control signal supplied from an unshown evaluation controller. When receiving the initialization control signal, the gate circuit 11 allows the output of the evaluation element 30D to pass therethrough and supplies it to the storage circuit 12. Preferably, the timing of state update control, at which the output of the evaluation element 30D is stored in the storage circuit 12, is slightly earlier than the timing of precharge control of the positive logic evaluation section 320 and the negative logic evaluation section 330. Thus, a buffer 350 is provided for delaying the precharge control.

On the other hand, the positive logic evaluation section 320 and the negative logic evaluation section 330 are controlled according to an evaluation control signal which is supplied from an unshown evaluation controller. When receiving the evaluation control signal, the interval comparison circuit 13 outputs a detection result of an output variation of the evaluation element 30D. Preferably, the timing of comparison interval control of the interval comparison circuit 13 is slightly later than the timing of evaluation control of the positive logic evaluation section 320 and the negative logic evaluation section 330. Thus, a buffer 14 is provided for delaying the comparison interval control.

Figure 39:
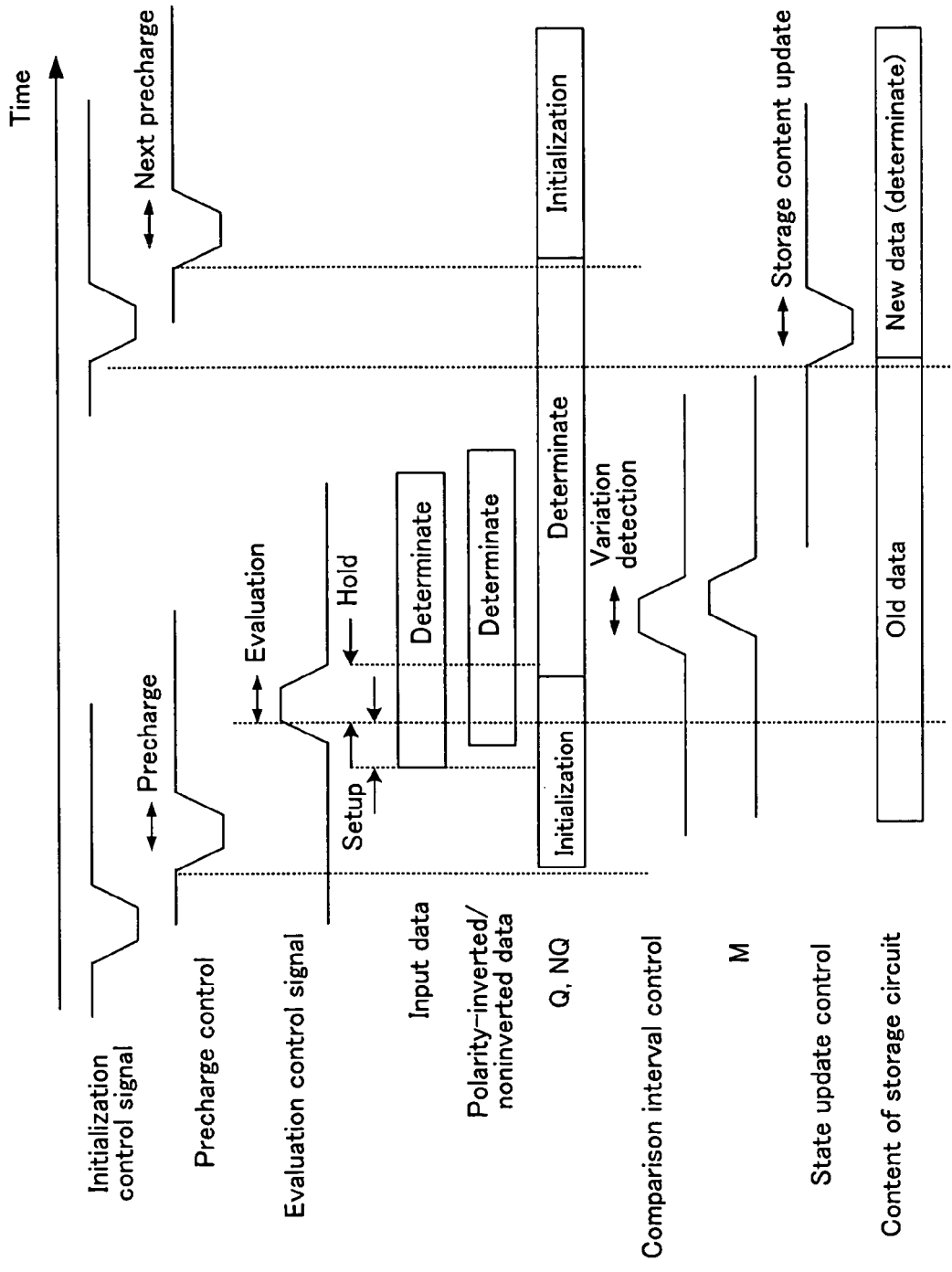
FIG. 39 is a timing chart of the evaluation element shown in FIG. 38.

FIG. 39 is a timing chart of the evaluation element of embodiment 17. The evaluation element 30D substantially functions as a register which has a logical evaluation function. Thus, the operation of the evaluation element 30D includes a setup constraint with respect to a rising edge of the clock and a hold constraint. Output Q and output NQ of the evaluation element 30D are initialized by precharge control and enter the determined state after evaluation control. Then, detection of an output variation is performed immediately after the evaluation control, and detection result M is output. Thereafter, the state update control is performed immediately before the precharge control of the next cycle, such that the stored content of the storage circuit 12 is updated to a value obtained after the evaluation.

Figure 40:
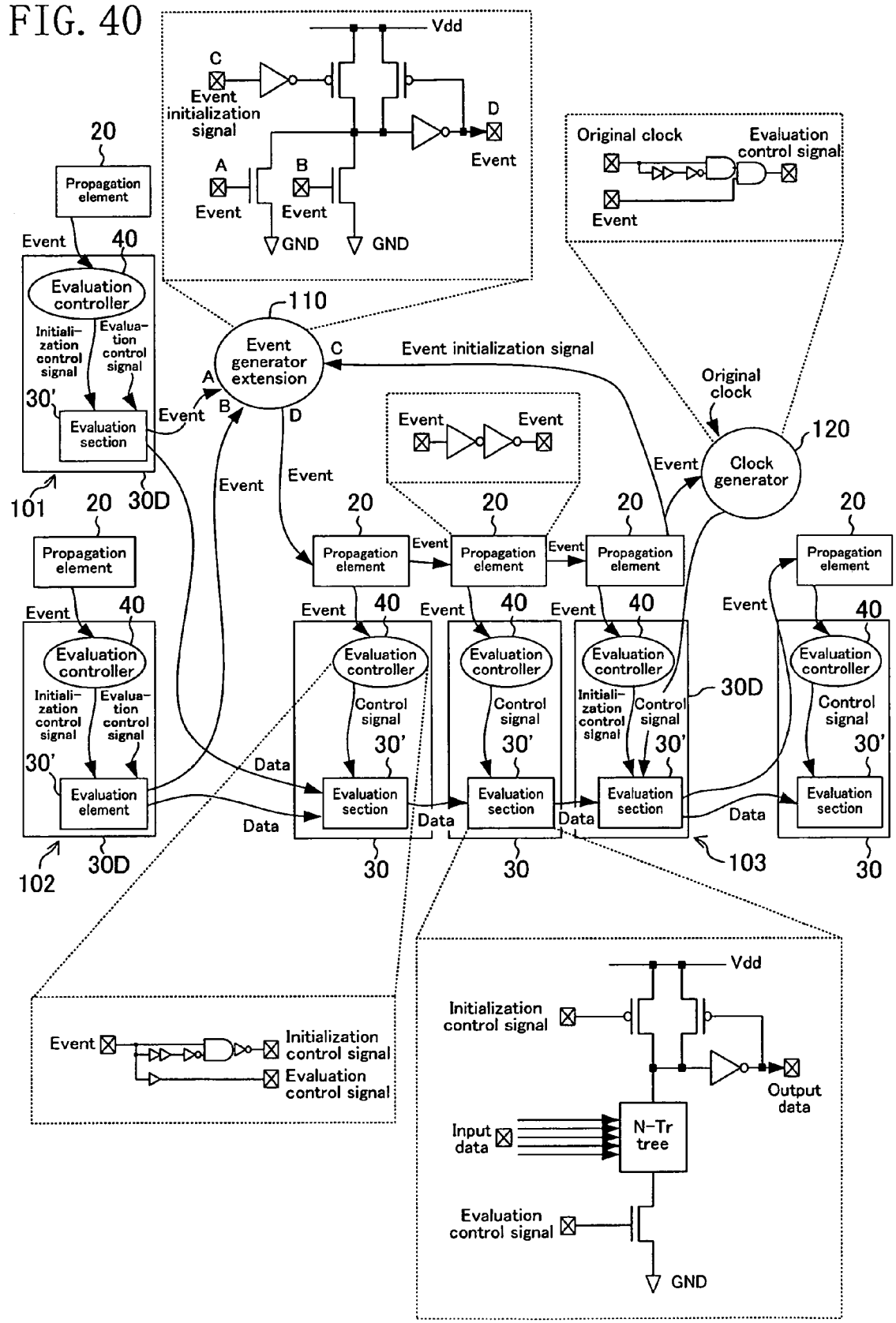
FIG. 40 shows a general structure of a logic circuit according to embodiment 17.

FIG. 40 shows a general structure of the logic circuit according to embodiment 17 of the present invention. The logic circuit of embodiment 17 includes an event generator extension 110 and a clock generator 120. The event generator extension 110 is substantially the same as a combination of the integration element described in embodiment 10 and the event initialization circuit described in embodiment 11. The event generator extension 110 of embodiment 18 integrates event A which is output from an evaluation element 30D functioning as a signal source 101 and event B which is output from an evaluation element 30D functioning as a signal source 102 into one new event D. Further, when receiving event initialization signal C, the event generator extension 110 initializes event D. In the meantime, when receiving an event from a propagation element 20, the clock generator 120 generates from an original clock an evaluation control signal having a predetermined pulse width and outputs the generated evaluation control signal to the evaluation element 30D. The evaluation element 30D also functions as a signal source 103.

Although in FIG. 40 the propagation element 20 is formed by a buffer, the propagation element 20 preferably has substantially the same circuit structure as that of the evaluation element 30 as previously described in embodiment 7. With this, the delay characteristics of the logic circuit are ameliorated.

Embodiment 18

As previously described in conjunction with embodiment 3, timing adjustment is relatively easy with the precharge method illustrated in FIG. 7. As previously described in conjunction with embodiment 13, an evaluation control device can be omitted without generating a through current with the precharge method illustrated in FIG. 27. However, there are two points to be considered as to precharge control.

First, in the case where a precharge is performed with a pulse of a predetermined time, it is necessary to secure a sufficient pulse width in order to allow a variation in operation conditions of an evaluation element and a variation in capacity of a dynamic node which stores electric charges relating to precharge. Especially, in the case where a pulse width is secured by a delay buffer, it is necessary to provide a margin of the delay amount such that the precharge can be achieved even under the worst conditions because the charge time of the dynamic node differs according to the operation conditions. Thus, the circuit overhead is likely to be large.

Secondly, as to the logic circuit of the present invention, when determining the granularity of signal detection for event generation, the following tradeoff occurs in reducing the power-increasing factors, for example, activation yield, clock load, etc.

1) Activation Yield: As the granularity is improved, the activation yield decreases.

2) Clock Load: As the granularity is deteriorated, the conditions which allow all of the inputs to a gate to be "Lo" are more likely to be satisfied, and an evaluation element from which an evaluation control device (hereinafter, referred to as "foot device") is omitted is more readily applicable.

In order to substantially overcome the above tradeoff between the above two features, it is desirable to adaptively perform precharge control and to perform control of the pulse width according to conditions and control of a precharge operation such that it is performed only under the conditions with which no through current occurs. In view of such, embodiments 18 and 19 provide evaluation elements capable of such adaptive precharge control.

Figure 41:
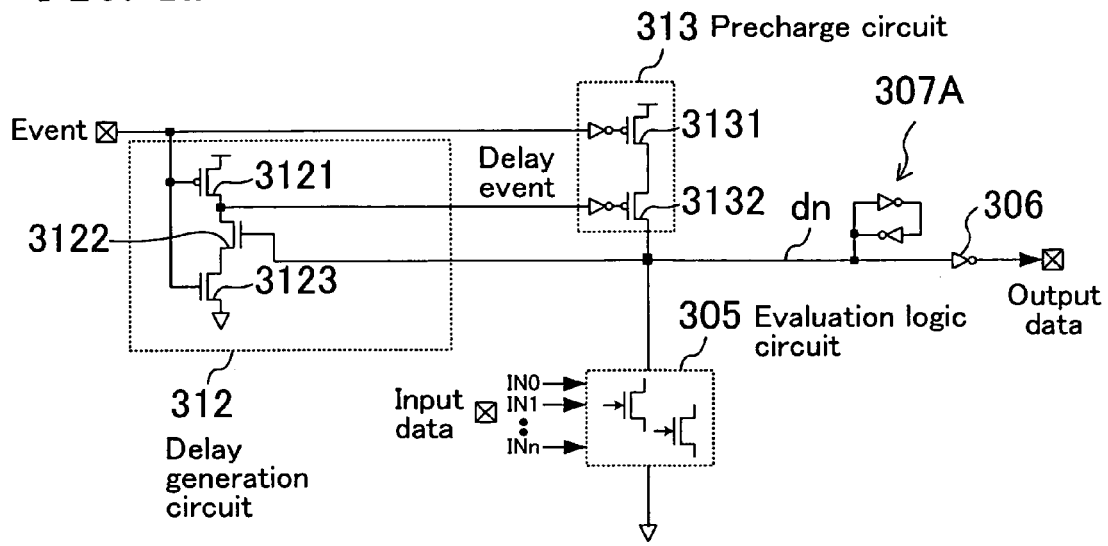
FIG. 41 shows a circuit structure of an evaluation circuit according to embodiment 18.

FIG. 41 shows a circuit structure of an evaluation element according to embodiment 18 of the present invention. The evaluation element of embodiment 18 includes a delay generation circuit 312, a precharge circuit 313, and an evaluation logic circuit 305.

The delay generation circuit 312 includes a P-type transistor 3121 and N-type transistors (first and second switch circuits) 3122 and 3123, which are connected in series. The gates of the P-type transistor 3121 and the N-type transistor 3123 are supplied with an event. The gate of the N-type transistor 3122 is connected to a dynamic node dn. A delay event, which is logically inverse to the event, is output from a connection point of the P-type transistor 3121 and the N-type transistor 3122. In this structure, the delay event is generated with a delay lasting from the time when an event is received to the time when the voltage level of the dynamic node dn reaches to the threshold level of the N-type transistor 3122 so that the N-type transistor 3122 is turned on. It should be noted that a level keeper for holding the voltage level of the delay event, a keeper pull-down control circuit for initializing the voltage level in response to reception of an event, and the like, may be provided as necessary.

The precharge circuit 313 includes P-type transistors 3131 and 3132 which are connected in series. The gate of the P-type transistor 3131 is supplied with the inverse of the event. The gate of the P-type transistor 3132 is supplied with the inverse of the delay event.

The evaluation logic circuit 305 is an N-type transistor tree which constitutes a discharge path for the dynamic node dn based on a logical operation result of input data as in the structure illustrated in FIG. 4.

As shown in FIG. 41, a static gate 306 (e.g., an inverter) for outputting data based on the positive logic and a level keeper 307A for holding the voltage level of the dynamic node dn may be provided as necessary.

Although in the above description the positive logic, i.e., "Hi" level, means generation of an event, the present invention is applicable irrespective of the logical polarity of an event. In the case where the negative logic, i.e., "Lo" level, means generation of an event, for example, the event is supplied as it is to the P-type transistor 3131 without being inverted, while the logical inverse of the event is supplied to the delay generation circuit 312.

Figure 42:
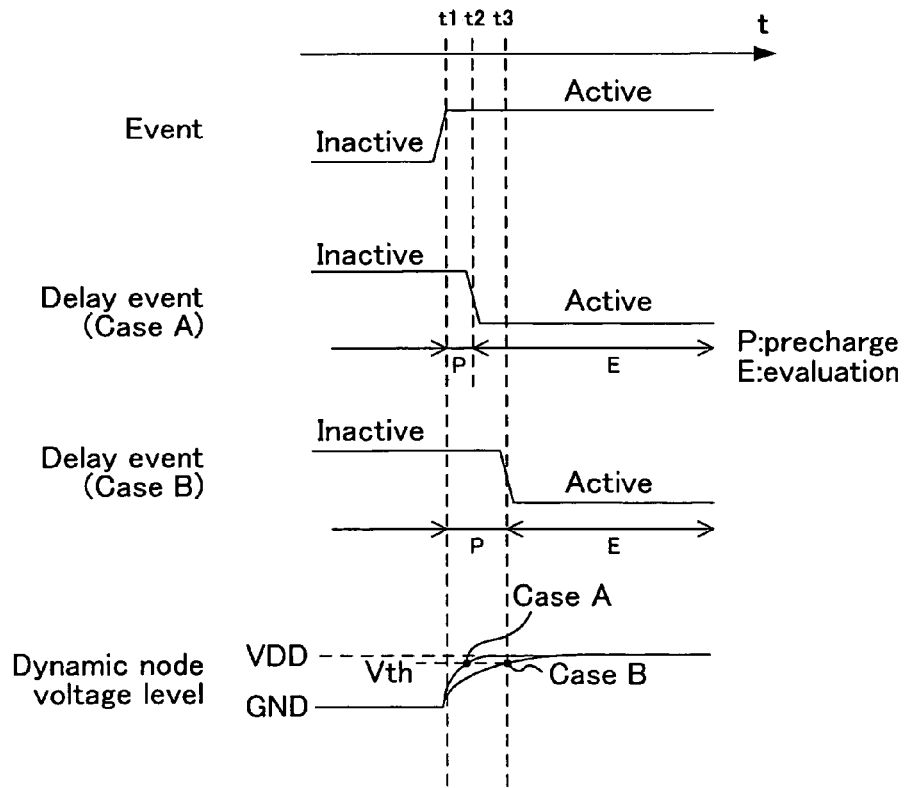
FIG. 42 is a timing chart of the evaluation element shown in FIG. 41.

Next, adaptive precharge control of the evaluation element of embodiment 19 is described with reference to the timing chart of FIG. 42. At time t1, the event is activated, and accordingly, the precharge circuit 313 starts precharging the dynamic node dn. When the precharge circuit 313 has a relatively large driving capacity or when the capacity of the dynamic node dn is relatively small (Case A), a relatively short time period is required till the voltage level of the dynamic node dn reaches threshold level Vth of the N-type transistor 3122 (time t2). When the precharge circuit 313 has a relatively small driving capacity or when the capacity of the dynamic node dn is relatively large (Case B), a relatively long time period is required till the voltage level of the dynamic node dn reaches threshold level Vth of the N-type transistor 3122 (time t3). That is, the precharge period is shorter in Case A than in Case B. This means that adaptive precharge control is performed in the structure of embodiment 18.

Embodiment 19

Figure 43:
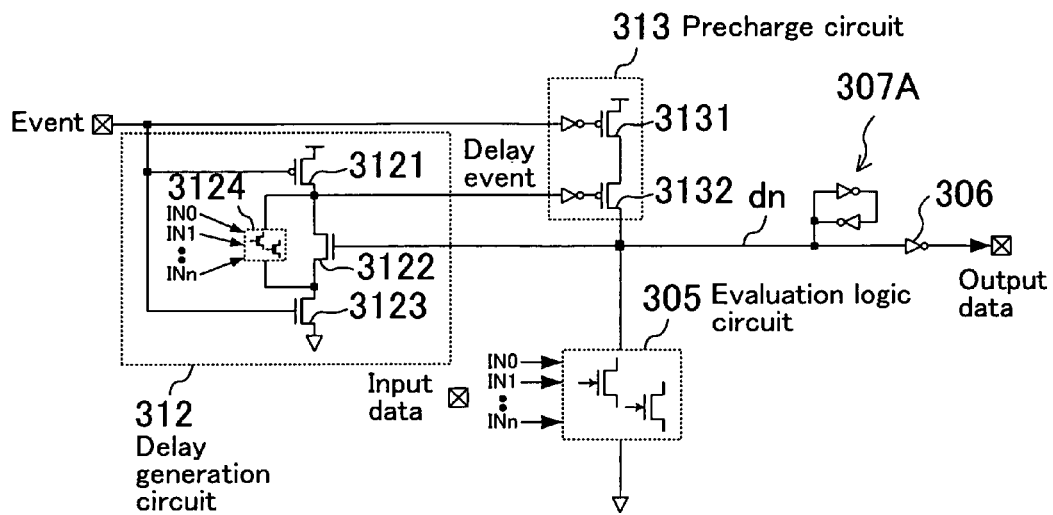
FIG. 43 shows a circuit structure of an evaluation circuit according to embodiment 19.

FIG. 43 shows a circuit structure of an evaluation element according to embodiment 19. A delay generation circuit 312A in the evaluation element of embodiment 19 includes a replica circuit 3124 in addition to the components of the delay generation circuit 312 shown in FIG. 41.

The replica circuit 3124 is connected in parallel to the N-type transistor 3122 and has the same logic structure and inputs as those of the evaluation logic circuit 305. When the evaluation logic circuit 305 constitutes a discharge path, the replica circuit 3124 is also conductive at its both ends.

Figure 44:
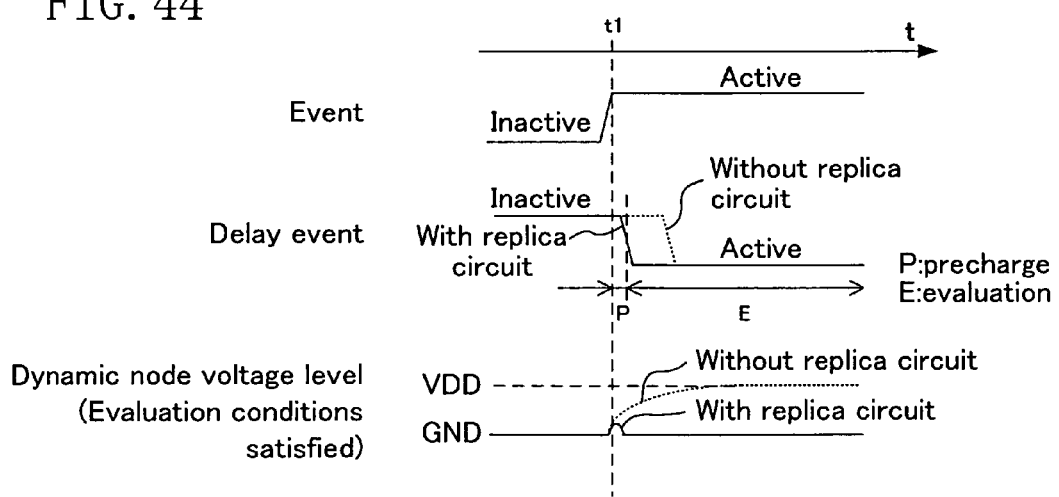
FIG. 44 is a timing chart of the evaluation element shown in FIG. 43.

Next, adaptive precharge control of the evaluation element of embodiment 19, which is performed when the evaluation conditions are satisfied such that a discharge path is formed by the evaluation logic circuit 305, is described with reference to the timing chart of FIG. 44. Although in response to activation of an event at time t1 the precharge circuit 313 is ready to start precharging the dynamic node dn, the delay event is immediately activated because the evaluation conditions are satisfied at the replica circuit 3124, whereby the precharge is prevented. As a result, generation of a through current is suppressed. In other words, in the evaluation element of embodiment 19, precharge control is performed only under conditions where no through current is generated.

In the case where the evaluation conditions are satisfied at the replica circuit 3124, the timing when the delay generation circuit 312 receives an event to generate a delay event is delayed from the timing when the event is activated to start precharging by the delay time caused at the replica circuit 3124. Thus, even when an event is input priority while the evaluation conditions are satisfied because of delayed arrival of data although the evaluation conditions are supposed to be unsatisfied, the evaluation conditions are determined to be unsatisfied because the data arrives prior to activation of an delay event, whereby precharge control is performed. That is, there is some margin on the timing constraint of an event and data. If input data is not yet determined in an evaluation cycle, a conventional dynamic circuit results in a malfunction. However, a logic circuit of the present invention has some time margin before resulting in a malfunction. In the presently existing LSIs, miniaturization has been advanced, and accordingly, a delay variation due to deterioration over time, random variations, etc., has been a significant problem. However, as described above, the present invention provides a time margin to the timing constraint of an event and data and achieves the secondary effect of adding robustness against the delay variation.

Embodiment 20

As for an event-driven logic circuit of the present invention, there are three points to be considered as to the output waveforms of data and an event.

The first point is that, in the case where the values obtained before and after data update of a signal source are compared and an event is generated according to a detected update, the number of logic stages is larger in the event propagation path than in the data propagation path. An increase in the number of logic stages in the event propagation path constitutes a factor of an operation delay of the entire logic circuit because the first stage evaluation element starts operation after receiving an event.

The second point is that, in the case where data output from two or more signal sources are input to the first stage evaluation element, an event corresponding to each signal source is input to the first stage evaluation element via the integration element (see FIG. 23). Since, as previously described, the first stage evaluation element starts operation after receiving an event, an increase in delay due to passage of an event through the integration circuit influences the operation delay of the entire logic circuit.

The third point is that, in outputting of an event from an event generator, there is a possibility that a pulse waveform vanishes due to waveform blunting caused by the wire capacitance or resistance, or the like. To prevent the pulse waveform from vanishing, it is necessary to secure a sufficient pulse width.

In order to substantially overcome the above-described three problems, at least three issues described below have to be considered:
1) Detection of a state change in a data output process;
2) Reduction in the number of logic stages in a wired-OR structure; and
3) Use of a dynamic circuit which operates according to the "Hi" and "Lo" levels of a clock to output a pulse-shape signal.

In view of such, in embodiment 20, a logic circuit having no event generation delay is provided.

Figure 45:
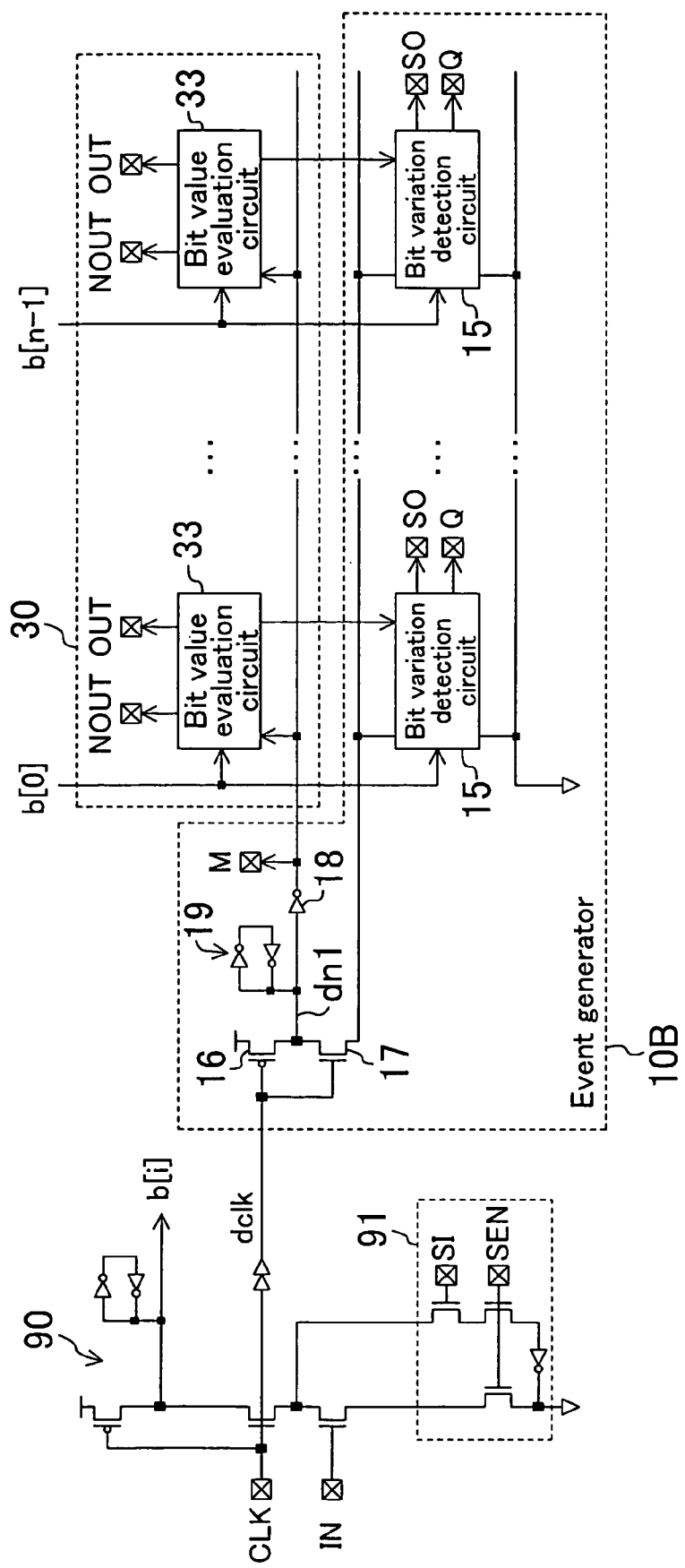
FIG. 45 shows a general structure of a logic circuit according to embodiment 20.

FIG. 45 shows a general structure of a logic circuit according to embodiment 20 of the present invention. An evaluation element 30, which is the first stage evaluation element, includes n bit value evaluation circuits 33. The n bit value evaluation circuits 33 correspond to bits b[0] to b[n−1] of n-bit data output from a signal source. An event generator 10B includes n bit variation detection circuits 15 which correspond to bits b[0] to b[n−1] of n-bit data output from an unshown signal source, a P-type transistor 16 which functions as a precharge circuit, and an N-type transistor 17 which is connected in series to the P-type transistor 16. The P-type transistor 16 and the N-type transistor 17 receive, at the gates, delay clock dclk which is generated by delaying clock CLK to perform precharge control and evaluation control. The event generator 10B may include a static gate 18 (e.g., an inverter) for outputting event M based on the positive logic and a level keeper 19 for holding the voltage level of a dynamic node dn1 as necessary.

The logic circuit of embodiment 20 further includes a dynamic circuit 90. The dynamic circuit 90 evaluates data IN received from an unshown signal source in synchronization with clock CLK to supply respective bits b[i] (0≦i≦n−1) to the bit variation detection circuits 15 of the event generator 10B and to the bit value evaluation circuits 33 of an evaluation element 30.

To enable a scan test, a data selection circuit 91 may be provided. In the data selection circuit 91, when scan data selection signal SEN is at the "Lo" level, normal data IN is input to the dynamic circuit 90. When scan data selection signal SEN is at the "Hi" level, scan data SI is input to the dynamic circuit 90.

Figure 46:
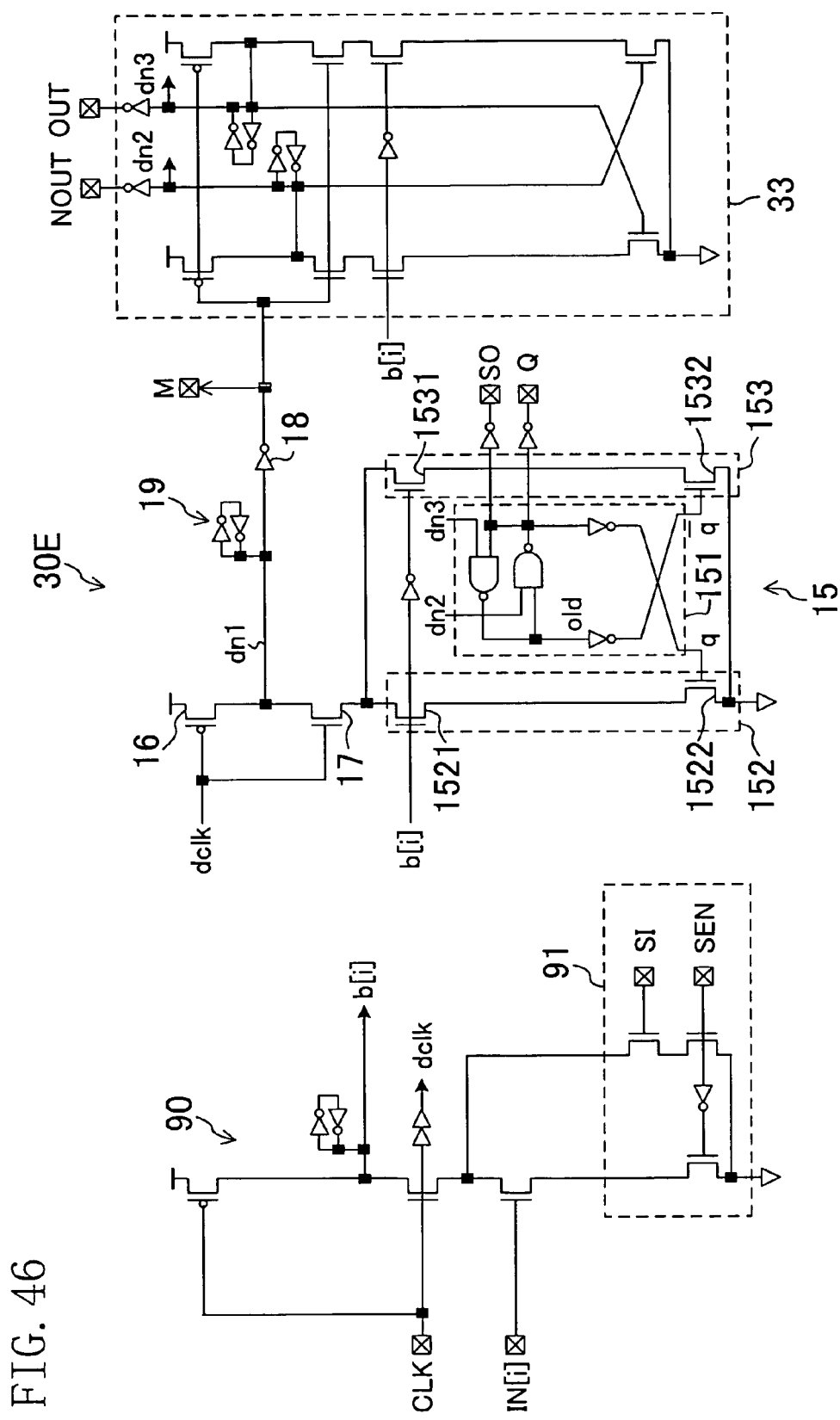
FIG. 46 shows a circuit structure of a bit variation detection circuit and a bit value evaluation circuit shown in FIG. 45.

FIG. 46 shows a circuit structure of the bit variation detection circuit 15 and the bit value evaluation circuit 33. Hereinafter, a circuit including the dynamic circuit 90, the bit variation detection circuit 15 and the bit value evaluation circuit 33 shown in FIG. 46 is referred to as an evaluation element 30E which has an event output function. When event M is inactive (in this example, "Lo" level), dynamic nodes dn2 and dn3 of the bit value evaluation circuit 33 are precharged. When event M is activated (in this example, "Hi" level), input data b[i] is evaluated, and a pulse of any one of signal OUT and signal NOUT is output. For example, when data b[i] is logical value "1" (in this example, "Lo" level), a pulse of signal OUT is output. When data b[i] is logical value "0" (in this example, "Hi" level), a pulse of signal NOUT is output. It should be noted that signals OUT and NOUT are based on the positive logic in this example but may be based on the negative logic.

The bit variation detection circuit 15 includes a storage circuit 151 and evaluation logic circuits 152 and 153. The storage circuit 151 can be realized by, for example, an RS latch circuit which includes 2-input NANDs connected in a ring shape as shown in FIG. 46. Receiving the logic levels of the dynamic nodes dn2 and dn3 of the bit value evaluation circuit 33 as a set signal and a reset signal, respectively, the storage circuit 151 stores an evaluation result of the bit value evaluation circuit 33 and outputs the stored evaluation result as signal q and its inverse/q. In order to enable a scan test, the stored content and static data of the storage circuit 151 may be output as signal SO and signal Q, respectively.

The evaluation logic circuit 152 includes N-type transistors 1521 and 1522 which are connected in series. The transistors 1521 and 1522 receive data b[i] and output q of the storage circuit 151 at the gates, respectively. For example, when data b[i] is logical value "0" (in this example, "Hi" level) and the logical value stored in the storage circuit 151 is "1", i.e., signal q is at the "Hi" level, both the transistors 1521 and 1522 are on, and the evaluation logic circuit 152 forms a discharge path of the dynamic node dn1.

The evaluation logic circuit 153 includes N-type transistors 1531 and 1532 which are connected in series. The transistors 1531 and 1532 receive the inverse of data b[i] and signal/q of the storage circuit 151 at the gates, respectively. For example, when data b[i] is logical value "1" (in this example, the inverse of data b[i] is at the "Hi" level) and the logical value stored in the storage circuit 151 is "0", i.e., signal/q is at the "Hi" level, both the transistors 1531 and 1532 are turned on, and the evaluation logic circuit 153 forms a discharge path of the dynamic node dn1.

Since the evaluation logic circuits 152 and 153 are connected in parallel, when any one of them forms a discharge path, electric charges are discharged from the precharged dynamic node dn1, and as a result, event M is generated. That is, the bit variation detection circuit 15 generates event M when stored bit data and input bit data are different, i.e., when data output from a signal source is updated.

Figure 47:
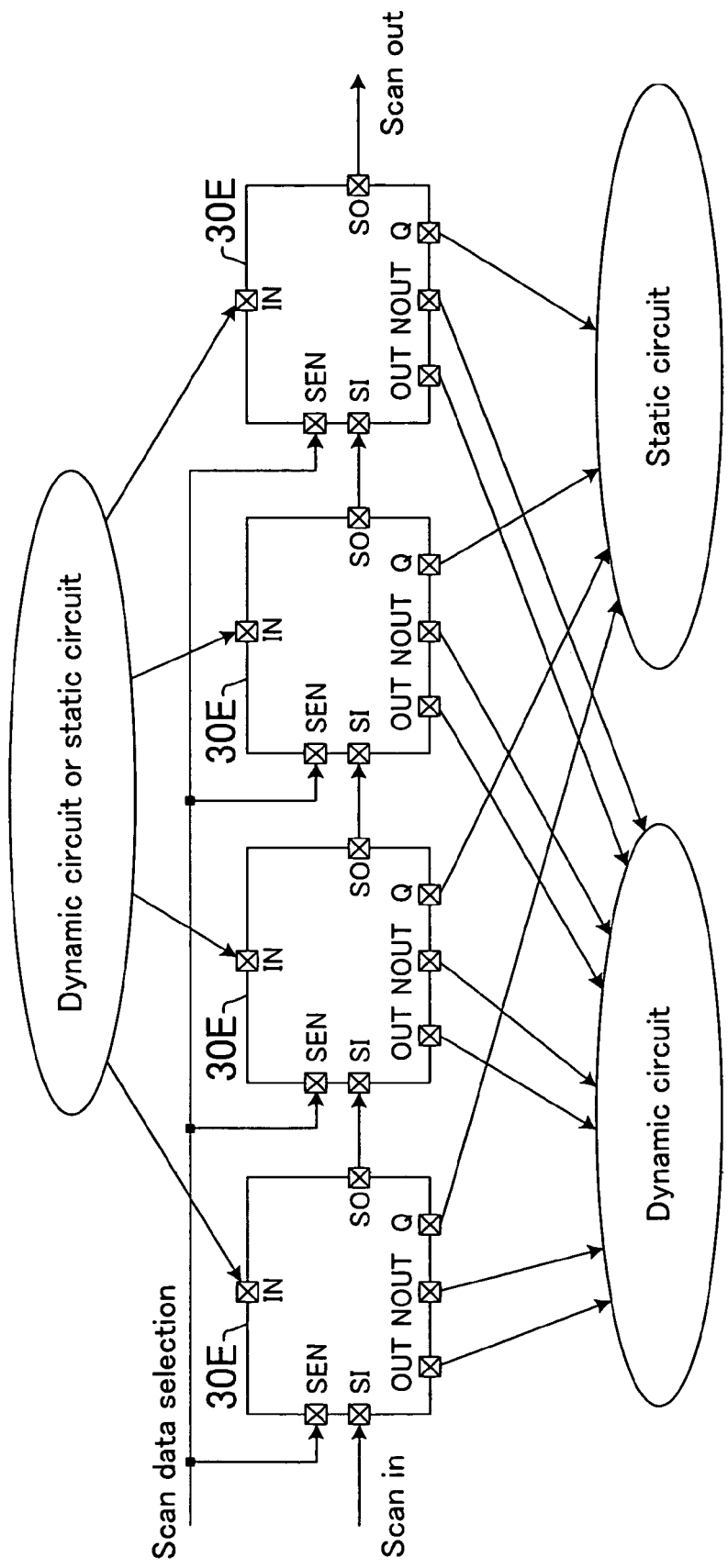
FIG. 47 shows a structure of a register formed by the logic circuit shown in FIG. 45.

By connecting circuit components such that signal SO output from the evaluation element 30E shown in FIG. 46 is input as signal SI to another evaluation element 30E, a shift register is constructed as shown in FIG. 47. Each evaluation element 30E receives signal IN from a dynamic circuit or a static circuit and outputs signals OUT and NOUT to the dynamic circuit and signal Q to the static circuit. Since in this register signal Q is usable as a signal for the static circuit, data can be transferred between the dynamic circuit and the static circuit without additionally providing an interface circuit, and a circuit design including both the dynamic circuit and the static circuit is readily achieved.

Figure 48:
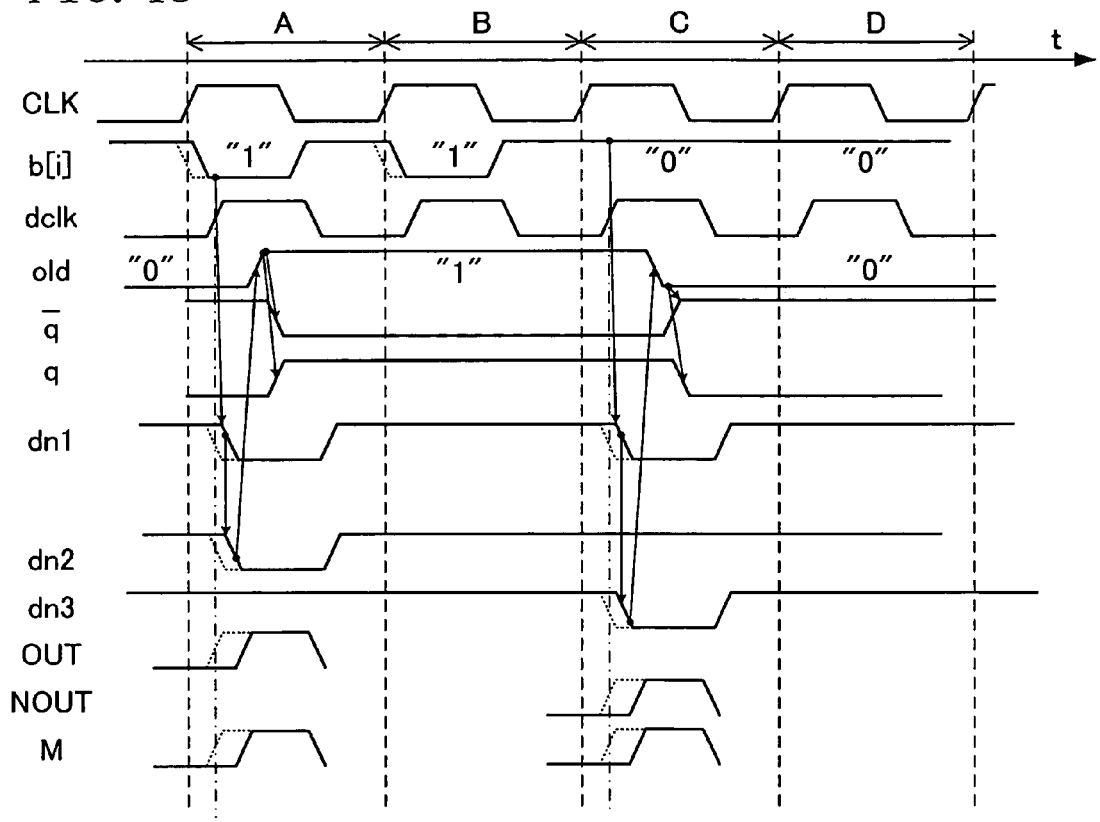
FIG. 48 is a timing chart of the logic circuit shown in FIG. 46.

Next, an operation of the logic circuit according to embodiment 20 is described with reference to the timing chart of FIG. 48. In FIG. 48, it is assumed that data b[i] transitions in the order of "1", "1", "0", and "0" over the four cycles of clock CLK (periods A to D).

In period A, the dynamic node dn1 is precharged while delay clock dclk is at the "Lo" level, whereby the dynamic nodes dn2 and dn3 are also precharged. When delay clock dclk is at the "Hi" level, the stored value of the storage circuit 151, old, is "0" (signal/q is at the "Hi" level), and data b[i] is "1" (the inverse of data b[i] is at the "Hi" level). Accordingly, a discharge path of the dynamic node dn1 is formed, and the dynamic node dn1 is discharged to fall to the "Lo" level. As a result, event M is output. In the meantime, the dynamic node dn2 is also discharged so that a pulse of signal OUT is output substantially simultaneously with the output of event M, and stored value old is updated to "1".

In period B, when delay clock dclk rises to "Hi", both stored value old and data b[i] are "1". Therefore, the voltage level of the precharged dynamic node dn1 does not change. Thus, none of event M and signals OUT and NOUT is output.

In period C, when delay clock dclk rises to "Hi" after the dynamic nodes dn1, dn2 and dn3 have been precharged, stored value old of the storage circuit 151 is "1" (signal q is at the "Hi" level) and data b[i] is "0" ("Hi" level). Accordingly, a discharge path of the dynamic node dn1 is formed, and the dynamic node dn1 is discharged to fall to the "Lo" level. As a result, event M is output. In the meantime, the dynamic node dn3 is also discharged so that a pulse of signal NOUT is output substantially simultaneously with the output of event M, and stored value old is updated to "0".

In period D, when delay clock dclk rises to "Hi", both stored value old and data b[i] are "0", the voltage level of the precharged dynamic node dn1 does not change. Thus, none of event M and signals OUT and NOUT is output.

As described above, according to the logic circuit of embodiment 20, a data variation in the signal source is detected simultaneously with the output of data from the bit value evaluation circuit, and therefore, propagation of event is not delayed from propagation of data. Since the bit variation detection circuit has a wired-OR structure, an integration element is not necessary, and the number of logic stages is decreased. Since the transition of the logic level of the event is based on a variation signal of a clock (delay clock), an event having a sufficient pulse width can be generated by reshaping the variation signal into an appropriate clock waveform.

Although the above descriptions are based on the positive logic, the same effects can be achieved even with the negative logic.

Embodiment 21

The integration element 50 shown in FIG. 23 can be readily realized by an OR logic structure of a CMOS circuit. However, if a large number of events are input to a simple OR logic structure, the number of serially-connected stages of P-type transistors increases, and accordingly, the input capacity increases. As a result, a circuit delay is caused.

In order to substantially overcome the above problem, it is necessary to realize an OR logic without forming a complementary logic by N-type and P-type transistors. In view of such, embodiment 21 provides an integration element which realizes an OR logic without using a complementary logic.

Figure 49:
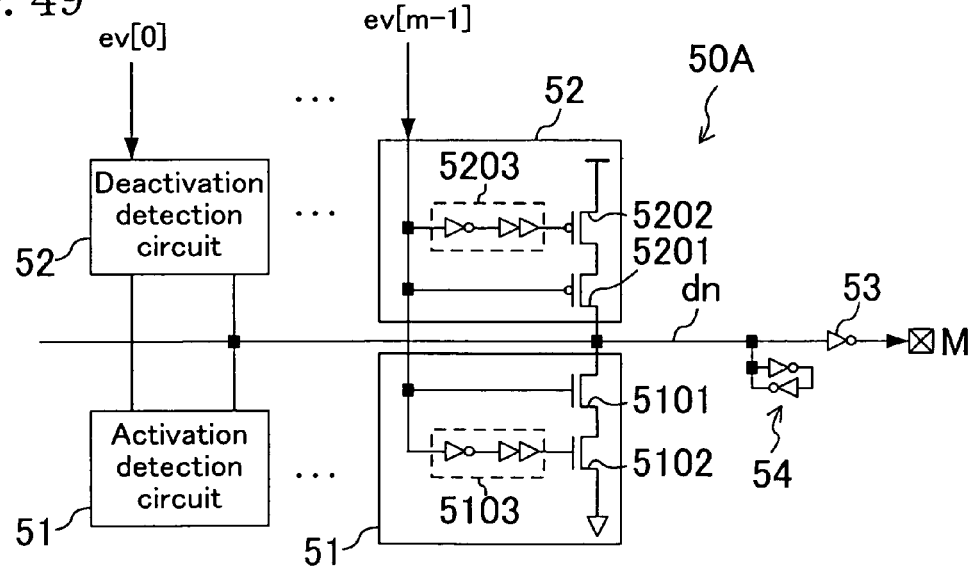
FIG. 49 shows a circuit structure of an integration element according to embodiment 21.

FIG. 49 shows a circuit structure of an integration element according to embodiment 21. The integration element 50A according to embodiment 21 includes m activation detection circuits 51 and m deactivation detection circuits 52 which correspond to m input events ev[0] to ev[m−1]. Both the activation detection circuits 51 and the deactivation detection circuits 52 are connected to a common dynamic node dn. The integration element 50A may include a static gate 53 (e.g., an inverter) for outputting event M based on the positive logic and a level keeper 54 for holding the voltage level of the dynamic node dn as necessary. Event M output from the integration element 50A is activated when the dynamic node dn falls to the "Lo" level but deactivated when the dynamic node dn rises to the "Hi" level.

The activation detection circuit 51 of embodiment 21 functions as a pull-down circuit. The activation detection circuit 51 supplies a ground voltage to the dynamic node dn for a predetermined time period after corresponding event ev[j] ($0 \leq j \leq m-1$) is activated (in this example, "Hi" level). Specifically, the activation detection circuit 51 includes N-type transistors 5101 and 5102 which are connected in series and a delay inversion circuit 5103. The gate of the N-type transistor 5101 is supplied with a corresponding event ev[j]. The delay inversion circuit 5103 inverts and delays received event ev[j] to generate a delayed inverted event. The delayed inverted event is supplied to the gate of the N-type transistor 5102. It should be noted that the N-type transistor 5102 and the delay inversion circuit 5103 may be omitted such that the activation detection circuit 51 is formed only by the N-type transistor 5101.

The deactivation detection circuit 52 of embodiment 21 functions as a precharge circuit. The deactivation detection circuit 52 supplies a supply voltage to the dynamic node dn for a predetermined time period after corresponding event ev[j] is deactivated (in this example, "Lo" level). Specifically, the deactivation detection circuit 52 includes P-type transistors 5201 and 5202 which are connected in series and a delay inversion circuit 5203. The gate of the P-type transistor 5201 is supplied with a corresponding event ev[j]. The delay inversion circuit 5203 receives event ev[j] to output a delayed inverted event. The delayed inverted event is supplied to the gate of the P-type transistor 5202. It should be noted that the P-type transistor 5202 and the delay inversion circuit 5203 may be omitted such that the deactivation detection circuit 52 is formed only by the P-type transistor 5201.

Next, an operation of the integration element of embodiment 21 is described with reference to the timing chart of FIG. 50. Before time t1, the dynamic node dn is at the "Hi" level. At time t1, event ev[j] is activated (in this example, "Hi" level), so that the activation detection circuit 51 starts discharging, and event M is generated. This discharge lasts till delayed inverted event dnev[j] is activated (in this example, "Lo" level) at time t2. At time t3, event ev[j] is deactivated (in this example, "Lo" level), so that the activation detection circuit 51 stops discharging, and the deactivation detection circuit 52 starts precharging, whereby event M is deactivated. This precharge lasts till delayed inverted event dnev[j] is deactivated (in this example, "Hi" level) at time t4. Finally, the dynamic node dn returns to "Hi" level.

Thus, according to embodiment 21, the activation detection circuit and the deactivation detection circuit for detecting activation and deactivation of an event input to the integration element have a wired-OR structure. Thus, even in the case where a plurality of events are input, the number of serially-connected stages of P-type transistors does not increase. Therefore, the responsiveness of a new integrated event output to a plurality of event inputs is improved.

Embodiment 22

Figure 50:
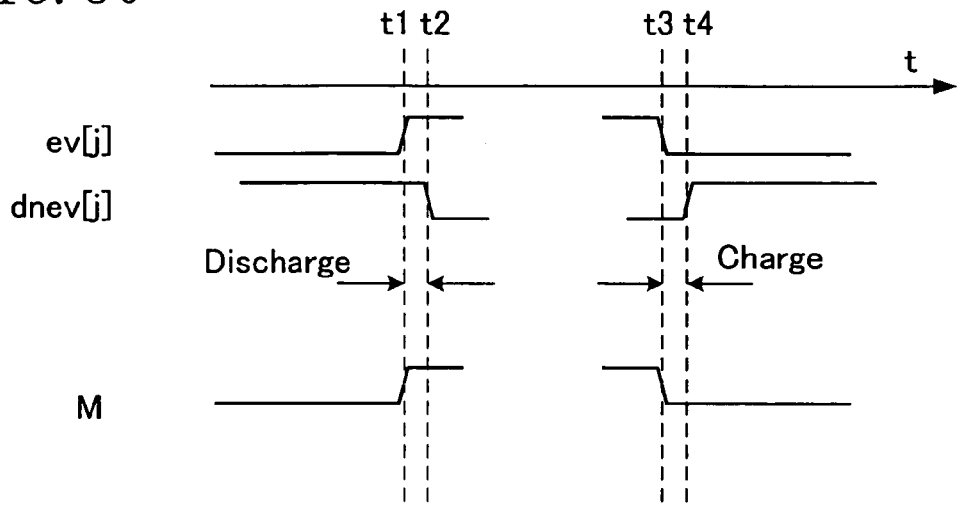
FIG. 50 is a timing chart of the integration element shown in FIG. 49.

In the integration element 50A shown in FIG. 50, if any of the activation detection circuit 51 and the deactivation detection circuit 52 is formed by one transistor, the circuit structure is simplified, and the circuit scale is decreased. However, in this structure, there is a possibility of generation of a through current at a certain generation timing of a plurality of events. For example, when a certain event is active, another event is deactivated during a pull-down operation of an activation detection circuit 51 formed by one N-type transistor, and a certain deactivation detection circuit 52 performs a precharge operation, so that a through current is generated. In view of such, embodiment 22 provides an integration element in which generation of a through current is suppressed.

Figure 51:
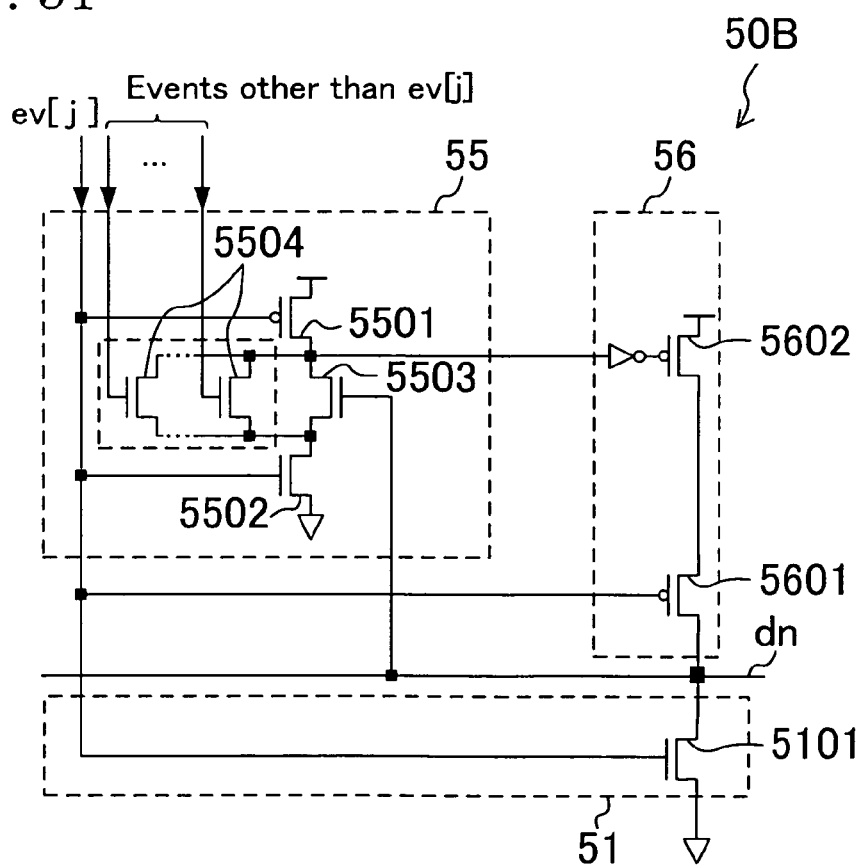
FIG. 51 shows a circuit structure of an integration element according to embodiment 22.

FIG. 51 shows a circuit structure of an integration element according to embodiment 22. The integration element 50B includes an activation detection circuit 51, a delay generation circuit 55 and a precharge circuit 56.

The delay generation circuit 55 includes a P-type transistor 5501 and N-type transistors 5502 and 5503 (first and second switch circuits), which are connected in series. In the description provided herein, it is assumed that the delay generation circuit 55 corresponds to event ev[j]. The gates of the P-type transistor 5501 and N-type transistor 5502 are supplied with event ev[j]. The gate of the N-type transistor 5503 is connected to a dynamic node dn. The delay generation circuit 55 further includes a plurality of N-type transistors (switch circuits) 5504 which are connected in parallel with the N-type transistor 5503. The gate of each N-type transistor 5504 is supplied with an event different from event ev[j]. The delay generation circuit 55 outputs a delay event, which is the logical inverse of the event, from a connection point between the P-type transistor 5501 and the N-type transistor 5503. With this structure, when an event other than event ev[j] is not generated, the delay of the delay event corresponds to the period lasting from reception of event ev[j] to the time when the voltage level of the dynamic node dn reaches the threshold level of the N-type transistor 5503 so that the N-type transistor 3122 is turned on. When any event other than event ev[j] is generated, the delay generation circuit 55 generates the delay event immediately after reception of event ev[j]. It should be noted that a level keeper for maintaining the voltage level of the delay event, a keeper pull-down control circuit for initializing the voltage level at the reception of an event, etc., may be provided as necessary.

The precharge circuit 56 includes P-type transistors 5601 and 5602 which are connected in series. The gate of the P-type transistor 5601 is supplied with event ev[j]. The gate of the P-type transistor 5602 is supplied with the inverse of the delay event.

The activation detection circuit 51 is formed by a single N-type transistor 5101 which functions as a pull-down circuit for the dynamic node dn.

Figure 52:
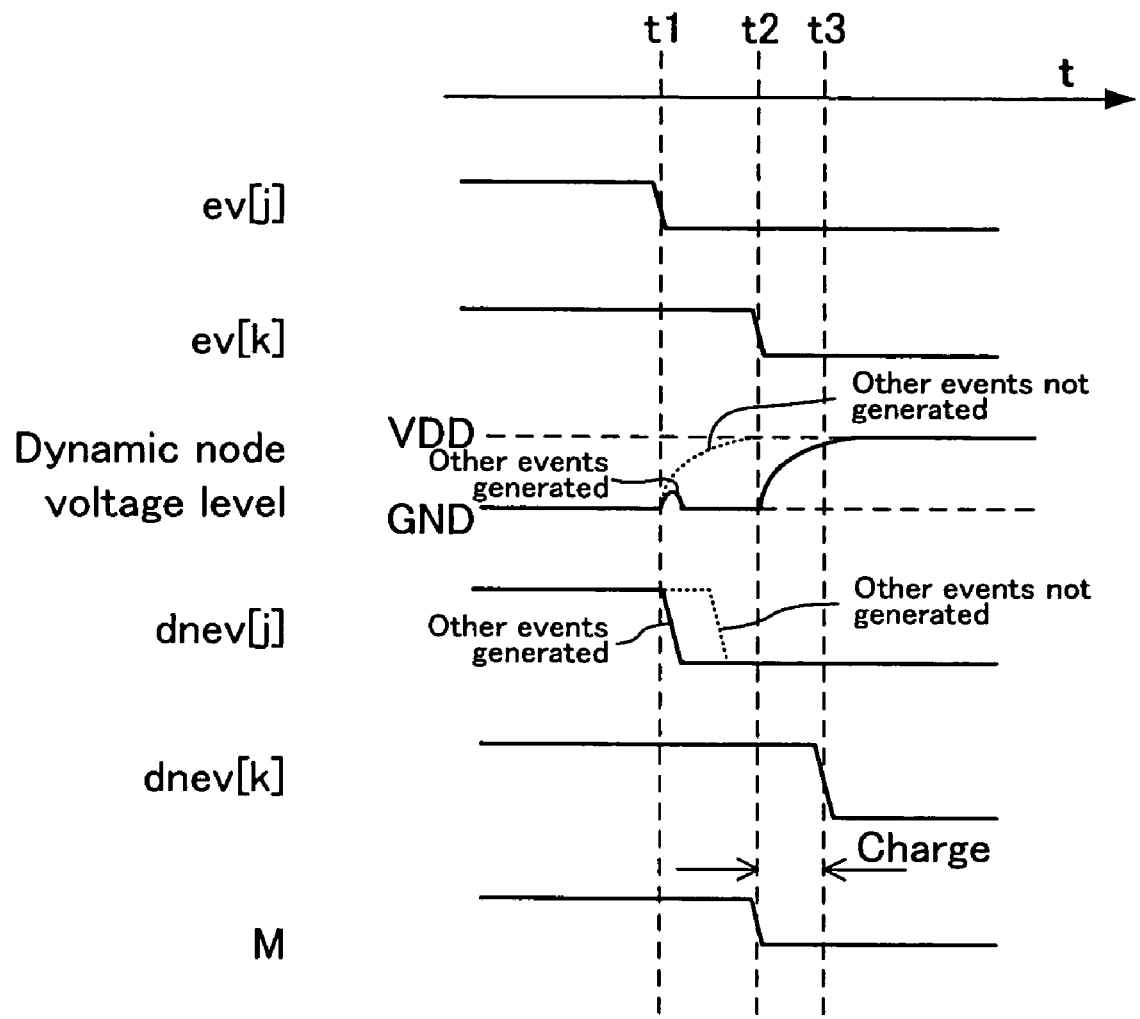
FIG. 52 is a timing chart of the integration element shown in FIG. 51.

Next, an operation of the integration element according to embodiment 22 is described with reference to the timing chart of FIG. 52. Herein, it is assumed that, before time t1, event ev[j] and event ev[k] are active. Although in response to deactivation (herein, "Lo" level) of event ev[j] at time t1 the precharge circuit 56 is ready to start precharging the dynamic node dn, the delayed inverted event dnev[j] is immediately activated (herein, "Lo" level), whereby the precharge is prevented. Then, at time t2, event ev[k] is deactivated (herein, "Lo" level) so that all the events input to the integration element are inactive, and precharge is performed until time t3 where delayed inverted event dnev[k] becomes active. As a result, the dynamic node dn returns to the "Hi" level.

Thus, according to embodiment 22, as for an integration element, a precharge operation is appropriately realized according to the operation conditions while generation of a through current is prevented.

Embodiment 23

The activation yield of the entire circuit depends on the relationship between integration elements and evaluation elements. The relationship which can decrease the activation yield depends on the circuit structure. Next, as for a parallel prefix adder, application of a logic circuit of the present invention such that the activation yield is decreased is described.

In the parallel prefix adder, addition is performed separately for Half Sum and Carry, and the Carry is separated into Generate and Propagate which are then separately calculated, and lastly, the Carry and the Half Sum are added together to obtain an addition result. Especially, an adder wherein a Carry calculation is performed on a 4-bit by 4-bit basis is referred to as a Radix-4 parallel prefix adder.

Figure 53:
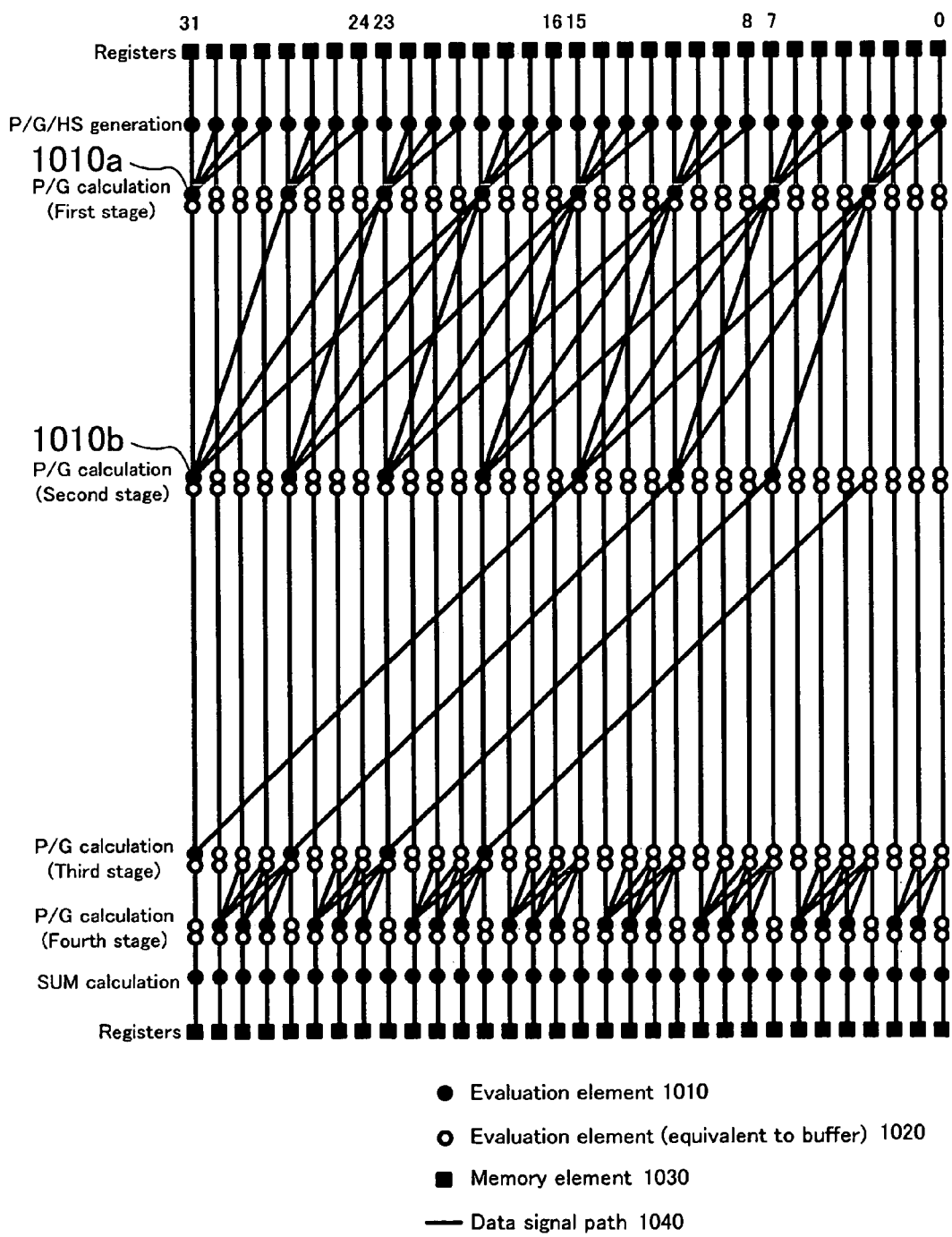
FIG. 53 shows a structure of a Radix-4 parallel prefix adder according to embodiment 23.

FIG. 53 shows a structure of a Radix-4 parallel prefix adder according to embodiment 23. The parallel prefix adder of embodiment 23 includes evaluation elements 1010 for performing generation and calculation of a carry generation signal (G), a carry propagation signal (P), a half sum signal (HS) and a sum signal (SUM), evaluation elements 1020 for simply buffering the respective signals, memory elements 1030 for storing values, and signal paths 1040 for connecting the elements. In FIG. 53, for example, an evaluation element 1010a for performing a calculation of a carry generation signal and a propagation signal (P/G calculation) at the first stage performs a P/G calculation relating to bits 31-28. An evaluation element 1010b for performing a P/G calculation at the second stage performs a P/G calculation relating to bits 31-16 based on the outputs of four evaluation elements 1010 at the first stage including the evaluation element 1010a.

Figure 54:
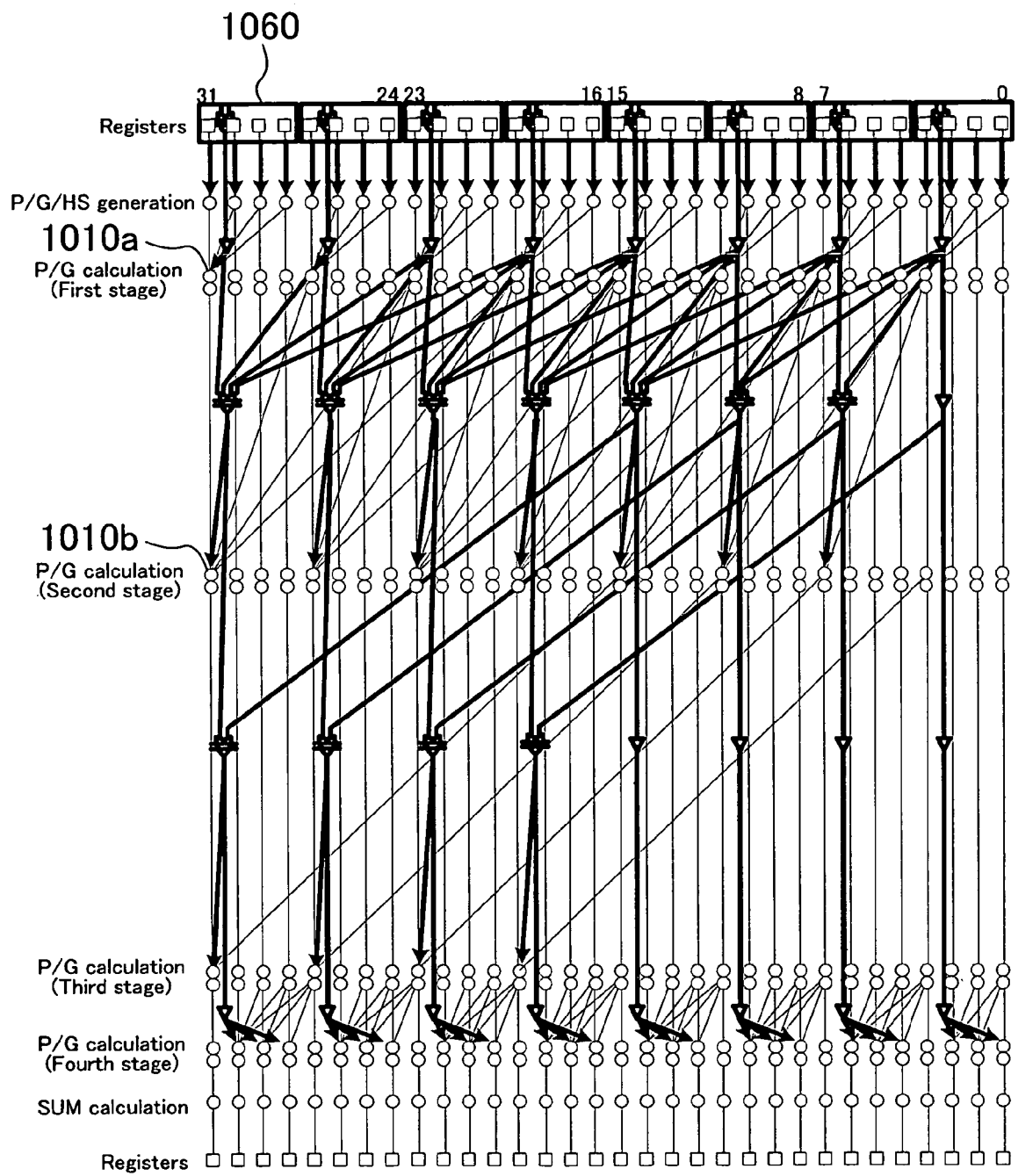
FIG. 54 shows a structure of an event network of the parallel prefix adder shown in FIG. 53.

In the parallel prefix adder of embodiment 23, a carry calculation is performed using an event-driven evaluation element. The evaluation element 1010 which performs a calculation of an sum signal is realized by a commonly-employed CMOS circuit. FIG. 54 shows a structure of an event network of the parallel prefix adder of embodiment 23. The event network of the parallel prefix adder of embodiment 23 includes propagation elements 20, integration elements 50, and event signal paths 1050 which connects the respective elements. The parallel prefix adder of embodiment 23 further includes eight 4-bit registers 1060. Each of the registers 1060 is formed by the evaluation element 30E shown in FIG. 46. Each of the bit values of each register 1060 is stored in the storage circuit 151 shown in FIG. 46. The integration element 50 of each register 1060 generates an event when the value of any of the four bits is changed. With this structure, it is possible to supply an event to the evaluation elements 1010 of the first stage before the data of the first stage evaluation elements 1010 are determined.

An integration element 50 is provided for the evaluation element 1010b which is to receive data from the four evaluation elements 1010 including the evaluation element 1010a as shown in FIG. 53, such that the data signal path and the event signal path have the same topology. Specifically, events which would be input to evaluation elements 1010 that calculate carry generation signals or carry propagation signals which would be input to evaluation elements 1010 that perform a P/G calculation are integrated by an integration element 50, and the newly-integrated event is supplied to the evaluation element 1010 that performs a P/G calculation. With this structure, the activation yield of each evaluation element 1010 is decreased.

Thus, according to a parallel prefix adder of embodiment 23, the activation yield of an evaluation element is decreased while the gate delay and the clock load are decreased. As a result, the power-increasing factors specific to a dynamic circuit are decreased.

(Layout of Logic Circuit of the Present Invention)

In an event-driven logic circuit of the present invention, an evaluation logic circuit is formed by N-type transistors, for example, as shown in FIG. 4. Thus, in a layout process of the logic circuit of the present invention, if a CMOS cell layout method which is based on the premise that the number of P-type transistors is the same as that of N-type transistors is applied as it is, the gate electrode length becomes longer, and the input capacity of a cell increases. In view of such disadvantages, it is desirable to apply an optimum layout method to an event-driven logic circuit. Hereinafter, a cell layout preferable to an event-driven logic circuit is described.

Figure 55:
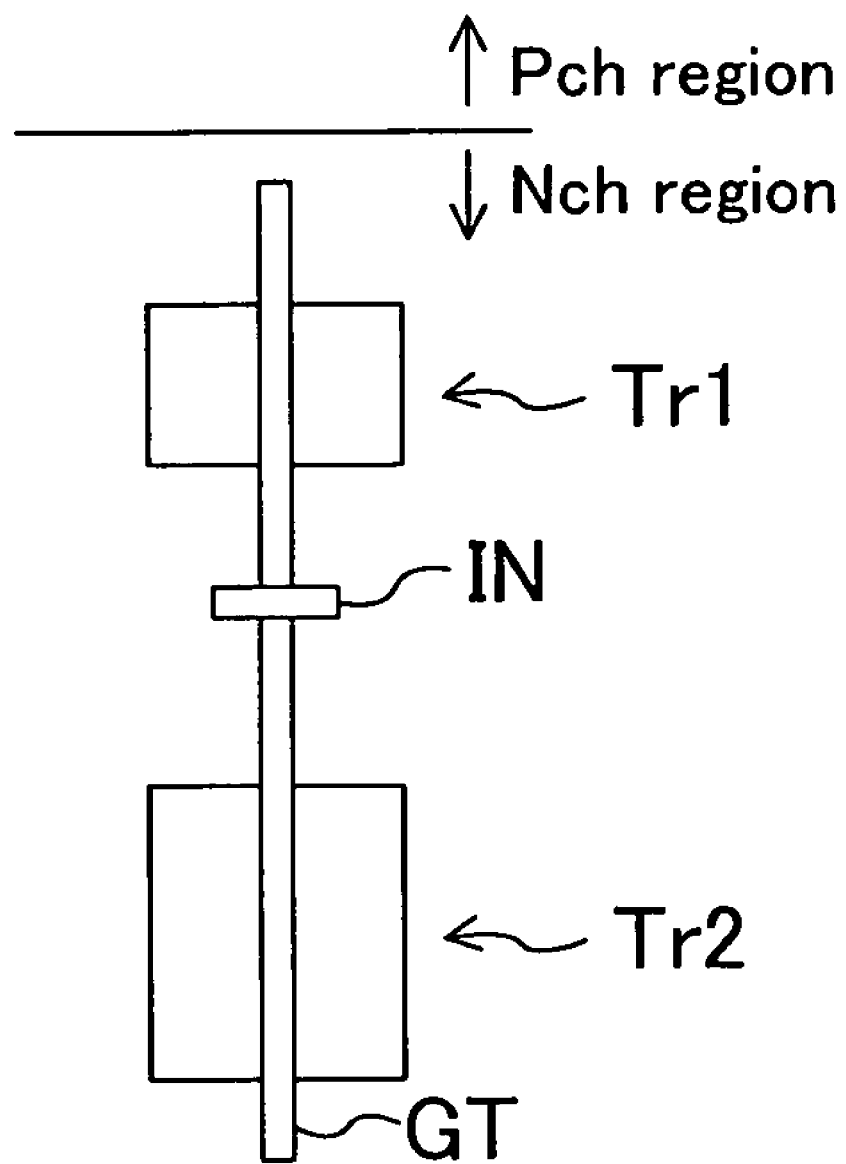
FIG. 55 shows a layout of a transistor of the evaluation element shown in FIG. 43.

FIG. 55 shows a layout of transistors which constitute the evaluation element shown in FIG. 43. An N-type transistor Tr1 which constitutes the evaluation logic circuit 305 and an N-type transistor Tr2 which constitutes a replica circuit 3124 are paired and connected to each other through one gate electrode GT. The transistor layout is such that the transistors Tr1 and Tr2 are aligned in a direction perpendicular to the boundary between Pch region and Nch region. An input terminal IN is provided on the gate electrode between the transistors Tr1 and Tr2.

With such a layout, the length of the gate electrode which connects the transistors Tr1 and Tr2 is shortest, and the gate input capacity is decreased. As a result, faster operation and lower power consumption of a logic circuit are realized. By providing the input terminal IN between the transistors Tr1 and Tr2, the gate electrode length between the input terminal IN and the transistor Tr1 and the gate electrode length between the input terminal IN and the transistor Tr2 are both minimized. With the above layout, the logic circuit operates faster because the transistor operates faster as the distance between the input terminal and the transistor decreases.

According to an event-driven logic circuit of the present invention, a predetermined node is first precharged after reception of an event, and then, data is evaluated. If an evaluation logic is established, discharge is performed. Thus, it is preferable that an event which triggers a precharge arrives at an evaluation element prior to data. As previously described, in the case where evaluation of data is performed prior to an event, a through current occurs during precharge. In view of such, it is preferable that, in an event-driven logic circuit, a propagation element is closer to the input side of data, i.e., closer to a signal source, than an evaluation element is, such that the length of a line used for event input is shortened as much as possible.

Figure 56:
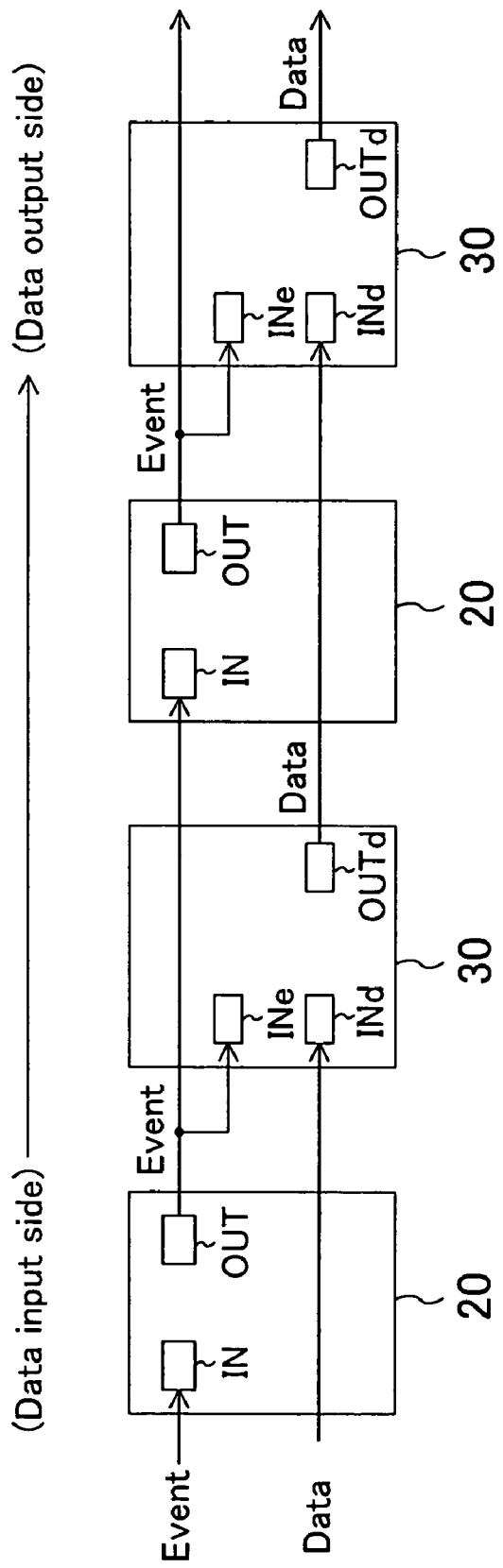
FIG. 56 shows a layout of an event-driven logic circuit.

FIG. 56 shows a layout of an event-driven logic circuit according to the present invention. A propagation element 20 receives an event at an input terminal IN from a propagation element 20 of the previous stage or an unshown event generator and outputs an event from an output terminal OUT to a propagation element 20 of the next stage. An evaluation element 30 receives an event at an input terminal INe from a propagation element 20 of the previous stage or an unshown event generator, receives data at an input terminal INd from an evaluation element 30 at the previous stage or an unshown signal source, and outputs data from an output terminal OUTd to an evaluation element 30 of the next stage. Thus, by placing the propagation element 20 to be closer to the signal source than the evaluation element 30 which receives the event from the propagation element 20, the signal path used for inputting an event to the evaluation element 30 is shortened, and as a result, an event is input to the evaluation element 30 at an earlier timing. Therefore, generation of a through current is suppressed, and the power consumption of the entire logic circuit is decreased.

(Application of the Present Invention)

Figure 57:
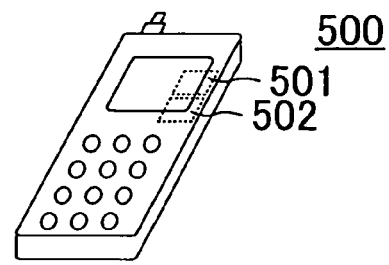
FIG. 57 generally shows a communication device incorporating a logic circuit according to the present invention.

Hereinafter, some exemplary applications of a logic circuit of the present invention are described. FIG. 57 shows a general structure of a communication device incorporating a logic circuit of the present invention. A mobile phone 500 includes a base band LSI 501 and an application LSI 502. The base band LSI 501 and the application LSI 502 are semiconductor integrated circuits which have a logic circuit of the present invention. Since the logic circuit of the present invention operates with smaller power consumption as compared with a conventional logic circuit, the base band LSI 501, the application LSI 502, and the mobile phone 500 including these LSIs also operate with lower power consumption. Further, as for a semiconductor integrated circuit incorporated in the mobile phone 500 which is different from the base band LSI 501 and the application LSI 502, a logic circuit incorporated in the semiconductor integrated circuit may be formed by a logic circuit of the present invention. Also in this case, the above effects can be achieved.

The communication device incorporating a logic circuit of the present invention is not limited to a mobile phone. Examples of the communication device include devices used in a communication system, such as a transmitter, a receiver, a modem device for data transmission, etc. That is, the present invention achieves the power consumption decreasing effect in every kind of communication devices irrespective of whether they are wired or wireless, optical communication or electrical communication, digital or analog.

Figure 58:
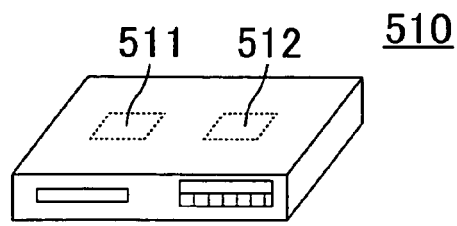
FIG. 58 generally shows an information reproduction device incorporating a logic circuit according to the present invention.

FIG. 58 shows a general structure of an information reproduction device incorporating a logic circuit of the present invention. An optical disc device 510 includes a media signal processing LSI 511 for processing a signal read from an optical disc and an error correction/servo processing LSI 512 for performing error correction of the signal and servo control of an optical pickup. The media signal processing LSI 511 and the error correction/servo processing LSI 512 are semiconductor integrated circuits which have a logic circuit of the present invention. Since a sequential circuit of the present invention operates with smaller power consumption as compared with a conventional sequential circuit, the media signal processing LSI 511, the error correction/servo processing LSI 512, and the optical disc device 510 including these LSIs also operate with lower power consumption. Further, as for a semiconductor integrated circuit incorporated in the optical disc device 510 which is different from the media signal processing LSI 511 and the error correction/servo processing LSI 512, a logic circuit incorporated in the semiconductor integrated circuit may be formed by a logic circuit of the present invention. Also in this case, the above effects can be achieved.

The information reproduction device incorporating a logic circuit of the present invention is not limited to an optical disc device. Examples of the information reproduction device include an image recording/reproducing device which incorporates a magnetic disk, an information recording/reproducing device which uses a semiconductor memory as a recording medium, etc. That is, the present invention achieves the power consumption decreasing effect in every kind of information reproduction devices (which may have an information recording function) no matter what kind of information recording medium is used.

Figure 59:
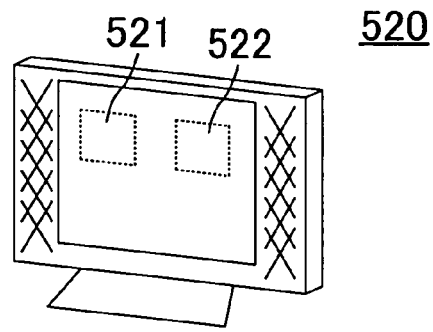
FIG. 59 generally shows an image display device incorporating a logic circuit according to the present invention.

FIG. 59 shows a general structure of an image display device incorporating a logic circuit of the present invention. A television receiver 520 includes an image/sound processing LSI 521 for processing an image signal and a sound signal and a display/sound source controller LSI 522 for controlling a display device, a loudspeaker unit, and the like. The image/sound processing LSI 521 and the display/sound source controller LSI 522 are semiconductor integrated circuits which have a logic circuit of the present invention. Since a logic circuit of the present invention operates with smaller power consumption as compared with a conventional logic circuit, the image/sound processing LSI 521, the display/sound source controller LSI 522, and the television receiver 520 including these LSIs also operate with lower power consumption. Further, as for a semiconductor integrated circuit incorporated in the television receiver 520 which is different from the image/sound processing LSI 521 and the display/sound source controller LSI 522, a logic circuit incorporated in the semiconductor integrated circuit may be formed by a logic circuit of the present invention. Also in this case, the above effects can be achieved.

The image display device incorporating a logic circuit of the present invention is not limited to a television receiver. Examples of the image display device include a device which reproduces streaming data distributed through an electric communication line. That is, the present invention achieves the power consumption decreasing effect in every kind of image display devices no matter what kind of information transmission method is used.

Figure 60:
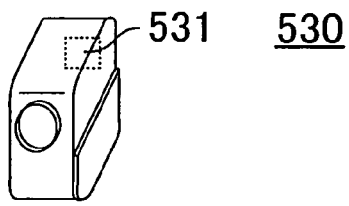
FIG. 60 generally shows an electronic device incorporating a logic circuit according to the present invention.

FIG. 60 shows a general structure of an electronic device incorporating a logic circuit of the present invention. A digital camera 530 includes a signal processing LSI 531 which is a semiconductor integrated circuit incorporating a logic circuit of the present invention. Since a logic circuit of the present invention operates with smaller power consumption as compared with a conventional logic circuit, the signal processing LSI 531 and the digital camera 530 including this LSI also operate with lower power consumption. Further, as for a semiconductor integrated circuit incorporated in the digital camera 530 which is different from the signal processing LSI 531, a logic circuit incorporated in the semiconductor integrated circuit may be formed by a logic circuit of the present invention. Also in this case, the above effects can be achieved.

The electronic device incorporating a logic circuit of the present invention is not limited to a digital camera. Examples of the electronic device include general devices incorporating a semiconductor integrated circuit, such as various kinds of sensors, electronic computers, etc. The present invention achieves the power consumption decreasing effect in every kind of electronic devices.

Figure 61:
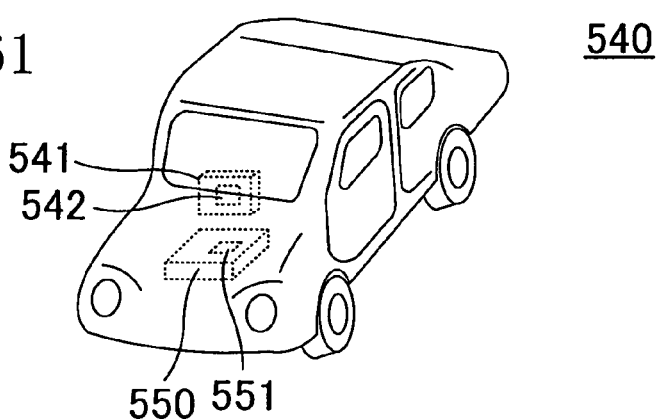
FIG. 61 generally shows an electronic controller incorporating a logic circuit of the present invention and a movable structure in which the electronic controller is installed.
Figure 62:
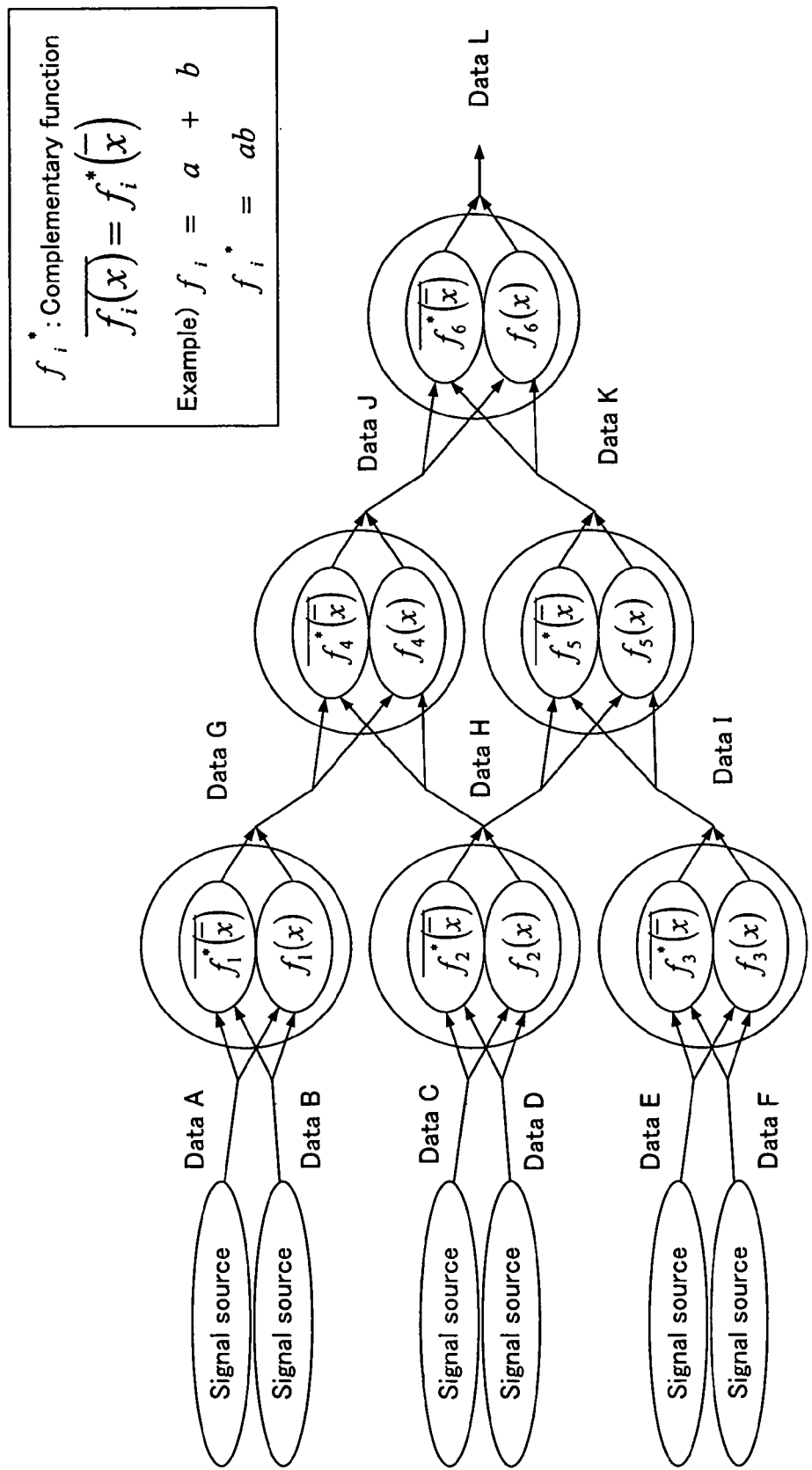
FIG. 62 is a conceptual diagram of a CMOS circuit.
Figure 63:
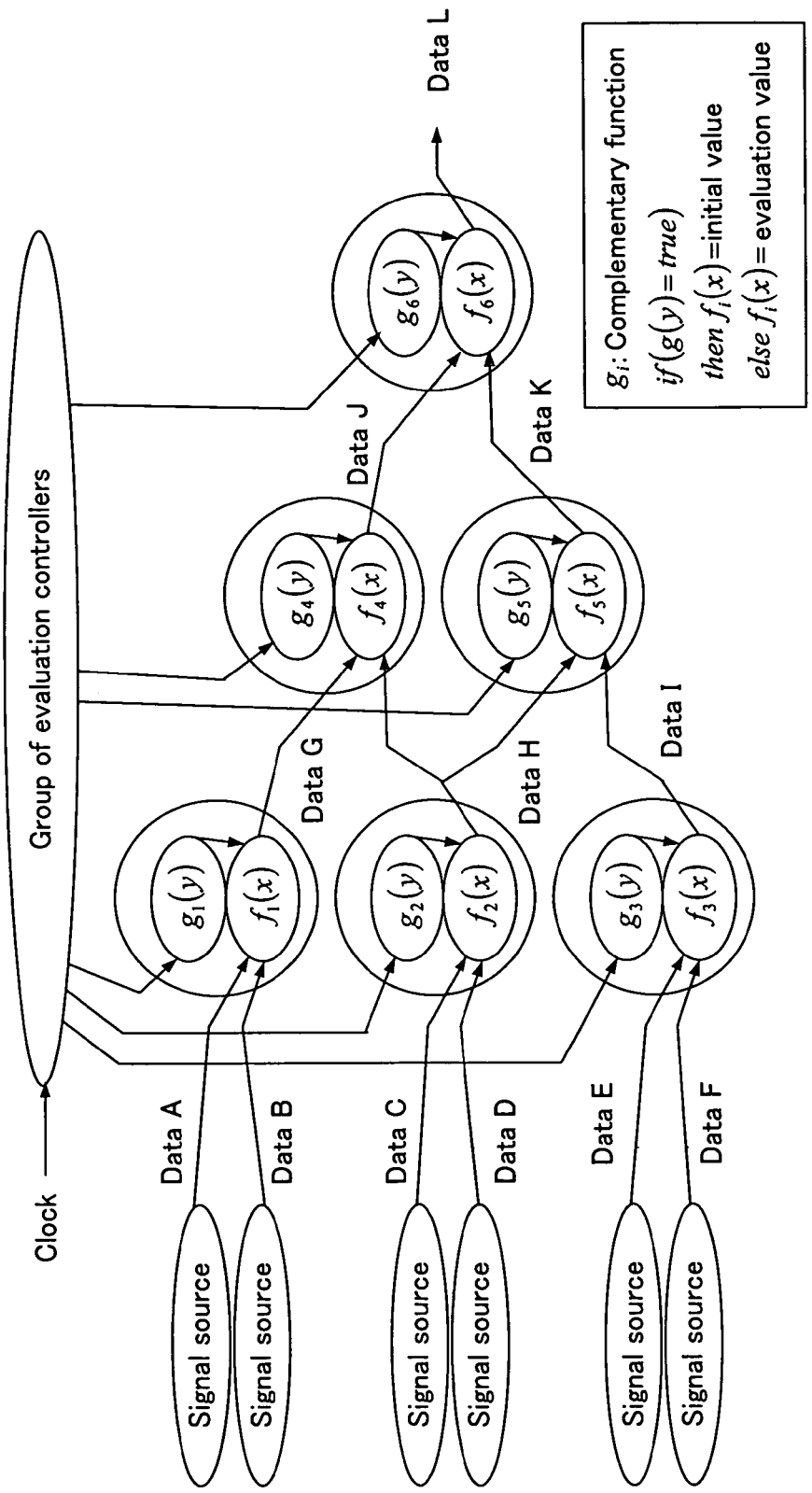
FIG. 63 is a conceptual diagram of a dynamic circuit.

FIG. 61 shows a general structure of an electronic control device incorporating a logic circuit of the present invention and a movable structure incorporating the electronic control device. An automobile 540 includes an electronic control device 550. The electronic control device 550 is a semiconductor integrated circuit incorporating a logic circuit of the present invention, which includes an engine/transmission controller LSI 551 for controlling an engine, a transmission, etc., of the automobile 540. The automobile 540 further includes a navigation device 541. The navigation device 541 includes a navigation LSI 542 which is a semiconductor integrated circuit incorporating a logic circuit of the present invention as is the electronic control device 550.

Since a sequential circuit of the present invention operates with smaller power consumption as compared with a conventional sequential circuit, the engine/transmission controller LSI 551 and the electronic control device 550 including this LSI also operate with lower power consumption. As well, the navigation LSI 542 and the navigation device 541 including this LSI also operate with lower power consumption. Further, as for a semiconductor integrated circuit incorporated in the electronic control device 550 which is different from the engine/transmission controller LSI 551, a logic circuit incorporated in the semiconductor integrated circuit may be formed by a logic circuit of the present invention. Also in this case, the above effects can be achieved. The same can be said for the navigation device 541. As the power consumption of the electronic control device 550 decreases, the power consumption of the automobile 540 also decreases.

The electronic control device incorporating a logic circuit of the present invention is not limited to the above-described device for controlling an engine or a transmission. Examples of the electronic control device include general power source controllers incorporating a semiconductor integrated circuit, such as a motor control device, and the like. The present invention achieves the power consumption decreasing effect in such electronic control devices.

The movable structure incorporating a logic circuit of the present invention is not limited to the automobile. Examples of the movable structure include general movable structures incorporating an electronic controller for controlling the power sources (for example, an engine, a motor, etc.), such as a train, an airplane, etc. The present invention achieves the power consumption decreasing effect in such movable structures.

A logic circuit of the present invention has low input load and low activation yield and is therefore applicable to uses which require a high-speed operation with low power consumption.

What is claimed is:

1. A logic circuit, comprising:
   an event generator for detecting a variation in data output from a signal source to generate an event which indicates the variation of the data;
   a plurality of propagation elements for propagating the event in a chained fashion; and a plurality of evaluation elements for evaluating the data received at a first stage from the signal source to propagate a result of the evaluation in a chained fashion, wherein each of the plurality of evaluation elements is configured to receive the event and then evaluate the data input to the evaluation element based on the event.

2. The logic circuit of claim 1, wherein at least one of the plurality of evaluation elements is a memory element which stores data input as the evaluation result.

3. The logic circuit of claim 1, wherein at least one of the plurality of evaluation elements includes:
   a capacitor;
   an evaluation logic circuit for performing a logical operation on input data to open/close a discharge path of the capacitor based on a result of the logical operation; and
   a charge/discharge controller for controlling charging of the capacitor and discharging of the capacitor through the discharge path based on the event.

4. The logic circuit of claim 1, wherein at least one of the plurality of evaluation elements includes:
   an evaluation section for evaluating input data; and
   an evaluation controller for supplying a relatively-forward substrate bias to the evaluation section for a predetermined period after reception of the event.

5. The logic circuit of claim 1, wherein at least one of the plurality of evaluation elements includes:
   an evaluation controller for generating a control signal indicative of whether or not passage of data supplied at an input terminal is allowed for a predetermined period after reception of the event;
   a gate circuit for switching passage and holding of the data supplied at the input terminal based on the control signal; and
   an evaluation logic circuit for performing a logical operation on data which has passed through the gate circuit.

6. The logic circuit of claim 1, wherein:
   a circuit topology of the plurality of evaluation elements is the same as that of the plurality of propagation elements; and
   after receiving an event from a topologically-corresponding one of the plurality of propagation elements, each of the plurality of evaluation elements evaluates input data.

7. The logic circuit of claim 1, wherein:
   the plurality of propagation elements are cascaded at a circuit topology of the plurality of evaluation elements with correspondence to a longest path extending from the signal source; and
   when receiving an event from one of the plurality of propagation elements at a 1th stage as counted down from a final stage (1 is a natural number), one of the plurality of evaluation elements at the 1th stage as counted down from the final stage evaluates input data.

8. The logic circuit of claim 7, wherein an internal circuit structure of the propagation elements is substantially the same as that of the evaluation elements.

9. The logic circuit of claim 1, wherein:
   each of the plurality of evaluation elements has an evaluation section for evaluating input data when a control signal is supplied; and
   the logic circuit includes an evaluation controller for generating the control signal when receiving an event, the evaluation controller being shared by two or more of the plurality of evaluation elements.

10. The logic circuit of claim 1, wherein at least one of the plurality of evaluation elements includes:
    an evaluation logic circuit for performing a logical operation on input data when a control signal is supplied; and
    an evaluation controller for outputting the control signal when receiving the event.

11. The logic circuit of claim 1, further comprising an integration element for integrating at least two lines of events into one new event.

12. The logic circuit of claim 1, wherein:
    when receiving the event, any one of the plurality of propagation elements outputs an event initialization signal; and
    the logic circuit includes an event initialization circuit which, when receiving the event initialization signal, initializes an event input to a first stage propagation element of the plurality of propagation elements.

13. The logic circuit of claim 1, further comprising a test controller for outputting a test signal,
    wherein when receiving the test signal, the event generator generates the event.

14. The logic circuit of claim 1, wherein:
    each of the plurality of evaluation elements includes
       an evaluation section for evaluating input data, and
       an evaluation controller which, when receiving the event, outputs an initialization control signal for initializing the evaluation section; and
    the evaluation controller of an evaluation element at which arrival of data is prior to arrival of the initialization control signal further outputs an evaluation control signal to the evaluation section for performing evaluation of input data.

15. The logic circuit of claim 1, wherein: a data line provided between the signal source and a first stage evaluation element and a data line provided between any two of the plurality of evaluation elements are each a single line;
    data output from the signal source to the first stage evaluation element is based on a non-monotonic transition logic; and
    data propagating through the evaluation elements subsequent to the first stage evaluation element is based on a monotonic transition logic.

16. The logic circuit of claim 1, further comprising an evaluation storage element which includes:
    an evaluation section for performing a logical operation on data output from a final stage of the plurality of evaluation elements, the logical operation including a logical inversion; and
    a storage section for storing an evaluation result of the evaluation section.

17. The logic circuit of claim 16, wherein:
    the evaluation storage element has an initialization controller which, when receiving an event output from the final stage of the plurality of propagation elements, outputs an initialization control signal for initializing the evaluation section; and
    the evaluation section performs the logical operation based on a given evaluation control signal.

18. The logic circuit of claim 1, wherein:
    at least one of the plurality of evaluation elements includes
       a delay generation circuit which receives the event to generate a delay event by delaying the received event, a precharge circuit which operates such that
  when receiving the event, the precharge circuit starts precharging a predetermined node of the evaluation element, and
  when receiving the delay event, the precharge circuit stops the precharge operation, and
an evaluation logic circuit which performs a logical operation on input data and constitutes a discharge path of the predetermined node based on a result of the logical operation; and
when the predetermine node is precharged by the precharge circuit, the delay generation circuit generates the delay event.

19. The logic circuit of claim 18, wherein:
the delay generation circuit includes
  a first switch circuit which is turned on when the event is received, and
  a second switch circuit which is turned on when the voltage of the predetermined node reaches a predetermined level; and
when both the first and second switch circuits are turned on, the delay generation circuit generates the delay event.

20. The logic circuit of claim 19, wherein the delay generation circuit includes a replica circuit which is connected in parallel with the second switch circuit and has the same logical structure and inputs as those of the evaluation logic circuit.

21. The logic circuit of claim 20, wherein:
transistors which constitute the evaluation logic circuit and transistors which constitute the replica circuit are paired on a one-to-one basis; and
each of the transistor pairs has a data input terminal therebetween, the data input terminal being shared by the evaluation logic circuit and the replica circuit.

22. The logic circuit of claim 1, wherein:
a first stage evaluation element includes a plurality of bit value evaluation circuits which correspond to bits of data output form the signal source, each of the plurality of bit value evaluation circuits evaluating a value of corresponding one of the bits in response to reception of the event to output an evaluation result; and
the event generator includes:
  a precharge circuit for precharging a predetermined node of the event generator, and
  a plurality of bit variation detection circuits which correspond to bits of data output from the signal source and are connected in parallel with one another, each of the plurality of bit variation detection circuits constituting a discharge path of the predetermined node when a variation in the value of corresponding one of the bits is detected;
the event generator generates the event when the predetermined node is discharged; and
each of the plurality of bit variation detection circuits includes
  a storage circuit which receives an evaluation result from a corresponding one of the plurality of bit value evaluation circuits and stores the evaluation result,
  a first evaluation logic circuit which constitutes a discharge path of the predetermined node when the value of the corresponding bit is a first logical value and the stored value of the storage circuit is a second logical value, and
  a second evaluation logic circuit connected in parallel with the first evaluation logic circuit, which constitutes a discharge path of the predetermined node when the value of the corresponding bit is the second logical value and the stored value of the storage circuit is the first logical value.

23. The logic circuit of claim 22, wherein each of the plurality of bit value evaluation circuits includes:
a first output terminal for, when the evaluation result is true, outputting a signal which is in synchronization with the event received from the event generator; and
a second output terminal for, when the evaluation result is false, outputting a signal which is in synchronization with the event received from the event generator.

24. The logic circuit of claim 22, wherein each of the plurality of bit variation detection circuits includes an output terminal for outputting a value stored in the storage circuit of the bit variation detection circuit.

25. The logic circuit of claim 11, wherein:
the integration element includes
  a plurality of activation detection circuits which correspond to the at least two lines of events, each of the plurality of activation detection circuits supplying a first voltage to a predetermined node of the integration element when a corresponding event is activated, and
  a plurality of deactivation detection circuits which correspond to the at least two lines of events, each of the deactivation detection circuits supplying a second voltage to the predetermined node when the corresponding event is deactivated; and
the integration element operates such that
  when a voltage of the predetermined node is the first voltage, the integration element activates one new event, and
  when the voltage of the predetermined node is the second voltage, the integration element deactivates the one new event.

26. The logic circuit of claim 25, wherein at least one of the plurality of activation detection circuits supplies the first voltage to the predetermined node for a predetermined period after activation of the corresponding event.

27. The logic circuit of claim 25, wherein at least one of the plurality of deactivation detection circuits supplies the second voltage to the predetermined node for a predetermined period after deactivation of the corresponding event.

28. The logic circuit of claim 25, wherein:
at least one of the plurality of deactivation detection circuits includes
  a delay generation circuit for generating a delay event by delaying an input event, and
  a precharge circuit which operates such that
    when receiving the event, the precharge circuit starts precharging the predetermined node, and
    when receiving the delay event, the precharge circuit stops precharging the predetermined node, and
the delay generation circuit includes
  a first switch circuit which is turned on when the event is received,
  a second switch circuit which is turned on when the voltage of the predetermined node reaches a predetermined level,
  a plurality of switch circuits which correspond to events input to the integration element except for the event input to the first switch circuit and are connected in parallel with the second switch circuit, each of the switch circuits being turned on when receiving the corresponding event, when the first switch circuit is turned on and any of the second switch circuit and the plurality of switch circuits is turned on, the delay generation circuit generates the delay event.

29. The logic circuit of claim 1, wherein each of the plurality of propagation elements is closer to the signal source than one of the plurality of evaluation elements which receives an event from the propagation element.

30. A parallel prefix adder comprising the logic circuit of claim 22, wherein:
the first stage evaluation element is a register which is a subject of an operation;
the event generator generates the event when the value of the register is changed; and
when receiving the event, each of the plurality of evaluation elements generates a carry generation signal or a carry propagation signal as the evaluation result.

31. A communication device comprising a semiconductor integrated circuit, wherein the semiconductor integrated circuit includes the logic circuit of claim 1.

32. An information reproduction device comprising a semiconductor integrated circuit, wherein the semiconductor integrated circuit includes the logic circuit of claim 1.

33. An image display device comprising a semiconductor integrated circuit, wherein the semiconductor integrated circuit includes the logic circuit of claim 1.

34. An electronic device comprising a semiconductor integrated circuit, wherein the semiconductor integrated circuit includes the logic circuit of claim 1.

35. An electronic control device comprising a semiconductor integrated circuit, wherein the semiconductor integrated circuit includes the logic circuit of claim 1.

36. A movable structure comprising the electronic control device of claim 35.

* * * * *